(12) United States Patent
Pagani et al.

(10) Patent No.: US 9,419,071 B2
(45) Date of Patent: Aug. 16, 2016

(54) INTEGRATED CIRCUIT COMPRISING AT LEAST AN INTEGRATED ANTENNA

(71) Applicant: STMicroelectronics S.r.l., Agrate Brianza (IT)

(72) Inventors: Alberto Pagani, Nova Milanese (IT); Alessandro Finocchiaro, Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 14/926,269

(22) Filed: Oct. 29, 2015

(65) Prior Publication Data

US 2016/0049459 A1    Feb. 18, 2016

Related U.S. Application Data

(63) Continuation of application No. 13/560,632, filed on Jul. 27, 2012, now Pat. No. 9,188,635.

(30) Foreign Application Priority Data

Jul. 28, 2011    (IT) .............................. MI2011A1416

(51) Int. Cl.
| | | |
|---|---|---|
| *H01L 49/02* | (2006.01) | |
| *H01L 23/66* | (2006.01) | |
| *G01R 31/28* | (2006.01) | |
| *G01R 31/302* | (2006.01) | |
| *H01L 21/66* | (2006.01) | |
| *H01L 23/528* | (2006.01) | |

(Continued)

(52) U.S. Cl.
CPC ............ *H01L 28/10* (2013.01); *G01R 31/2889* (2013.01); *G01R 31/3025* (2013.01); *H01L 22/32* (2013.01); *H01L 22/34* (2013.01); *H01L 23/528* (2013.01); *H01L 23/564* (2013.01); *H01L 23/585* (2013.01); *H01L 23/66* (2013.01); *H01L 24/05* (2013.01); *H01L 29/0642* (2013.01); *H01L 2223/6677* (2013.01); *H01L 2224/02166* (2013.01); *H01L 2224/0401* (2013.01); *H01L 2224/05553* (2013.01); *H01L 2224/16225* (2013.01); *H01L 2224/48091* (2013.01); *H01L 2224/48465* (2013.01); *H01L 2924/15311* (2013.01); *H01L 2924/30107* (2013.01)

(58) Field of Classification Search
None
See application file for complete search history.

(56) References Cited

U.S. PATENT DOCUMENTS

| | | |
|---|---|---|
| 6,300,223 B1 | 10/2001 | Chang et al. |
| 6,353,189 B1 | 3/2002 | Shimada et al. |

(Continued)

FOREIGN PATENT DOCUMENTS

| | | |
|---|---|---|
| JP | 2005311331 | 11/2005 |
| JP | 2006172354 A | 6/2006 |

OTHER PUBLICATIONS

Italian Search Report and Written Opinion dated dated Mar. 19, 2012 from corresponding Italian Application No. MI2011A001416.

*Primary Examiner* — Angel Roman
(74) *Attorney, Agent, or Firm* — Gardere Wynne Sewell LLP

(57) ABSTRACT

An integrated circuit on a substrate including at least one peripheral portion that surrounds an active area and is realized close to at least one scribe line providing separation with other integrated circuits realized on a same wafer. The integrated circuit includes at least one conductive structure that extends in its peripheral portion on different planes starting from the substrate and realizes an integrated antenna for the circuit.

30 Claims, 43 Drawing Sheets

(51) Int. Cl.
*H01L 23/00* (2006.01)
*H01L 23/58* (2006.01)
*H01L 29/06* (2006.01)

(56) References Cited

U.S. PATENT DOCUMENTS

| | | |
|---|---|---|
| 6,492,716 B1 | 12/2002 | Bothra et al. |
| 6,818,985 B1 | 11/2004 | Coccioli et al. |
| 7,312,622 B2 | 12/2007 | Hyde et al. |
| 7,466,284 B2 | 12/2008 | Barry |
| 7,605,448 B2 | 10/2009 | Furusawa et al. |
| 7,760,144 B2 | 7/2010 | Chang et al. |
| 2004/0195692 A1 | 10/2004 | Adan |
| 2005/0138499 A1 | 6/2005 | Pileggi et al. |
| 2005/0174131 A1 | 8/2005 | Miller |
| 2006/0052075 A1 | 3/2006 | Galivanche et al. |
| 2006/0125508 A1 | 6/2006 | Glidden et al. |
| 2006/0202831 A1 | 9/2006 | Horch |
| 2006/0226864 A1 | 10/2006 | Kramer |
| 2007/0293303 A1 | 12/2007 | Shayesteh |
| 2009/0061796 A1 | 3/2009 | Arkko et al. |
| 2010/0026601 A1 | 2/2010 | Chang et al. |
| 2010/0219514 A1 | 9/2010 | Ohguro |
| 2010/0230783 A1 | 9/2010 | Nakashiba |
| 2011/0248380 A1 | 10/2011 | Yoshihara et al. |
| 2012/0256192 A1* | 10/2012 | Zhang ............... H01L 29/0619 257/77 |
| 2015/0228808 A1* | 8/2015 | Liao ............... H01L 29/872 257/484 |

* cited by examiner

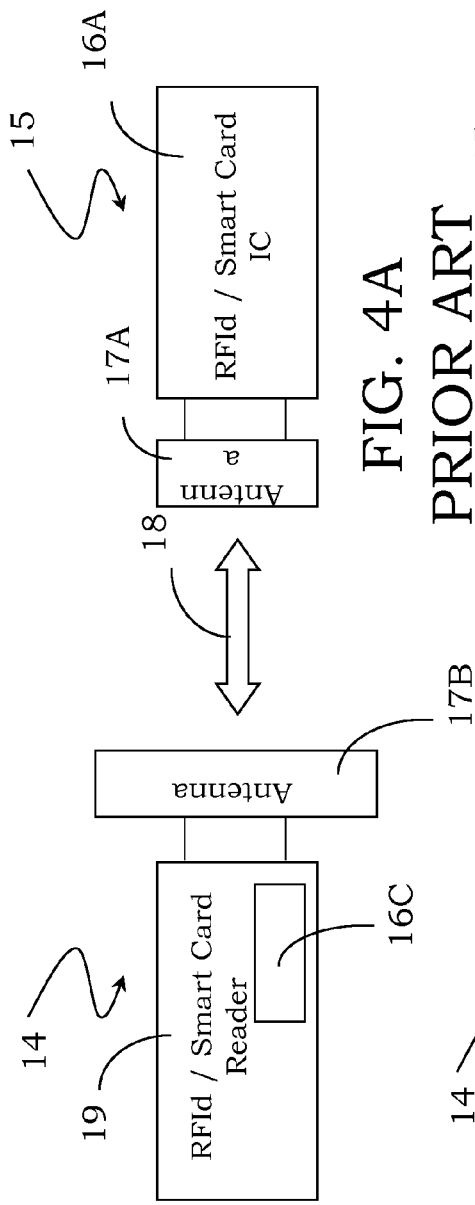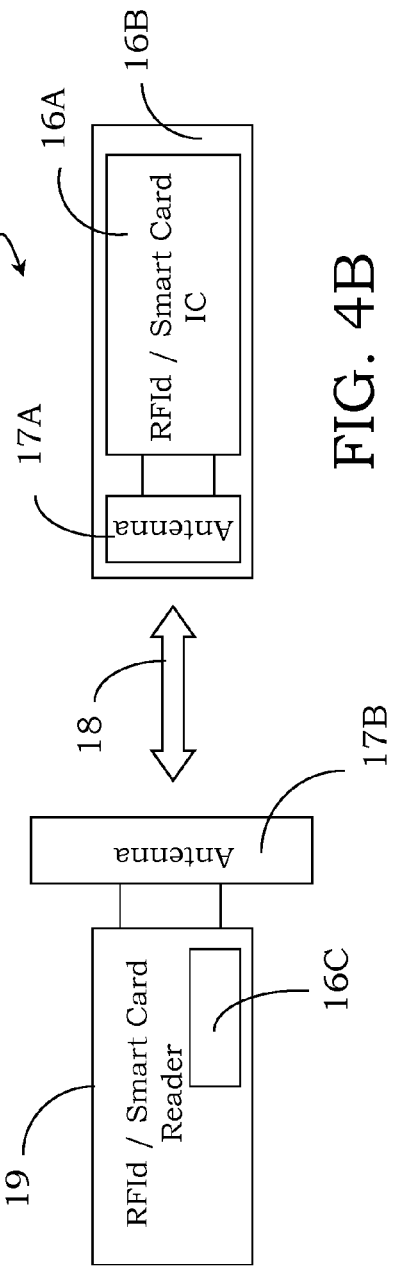
FIG. 4A
PRIOR ART
FIG. 4B
PRIOR ART

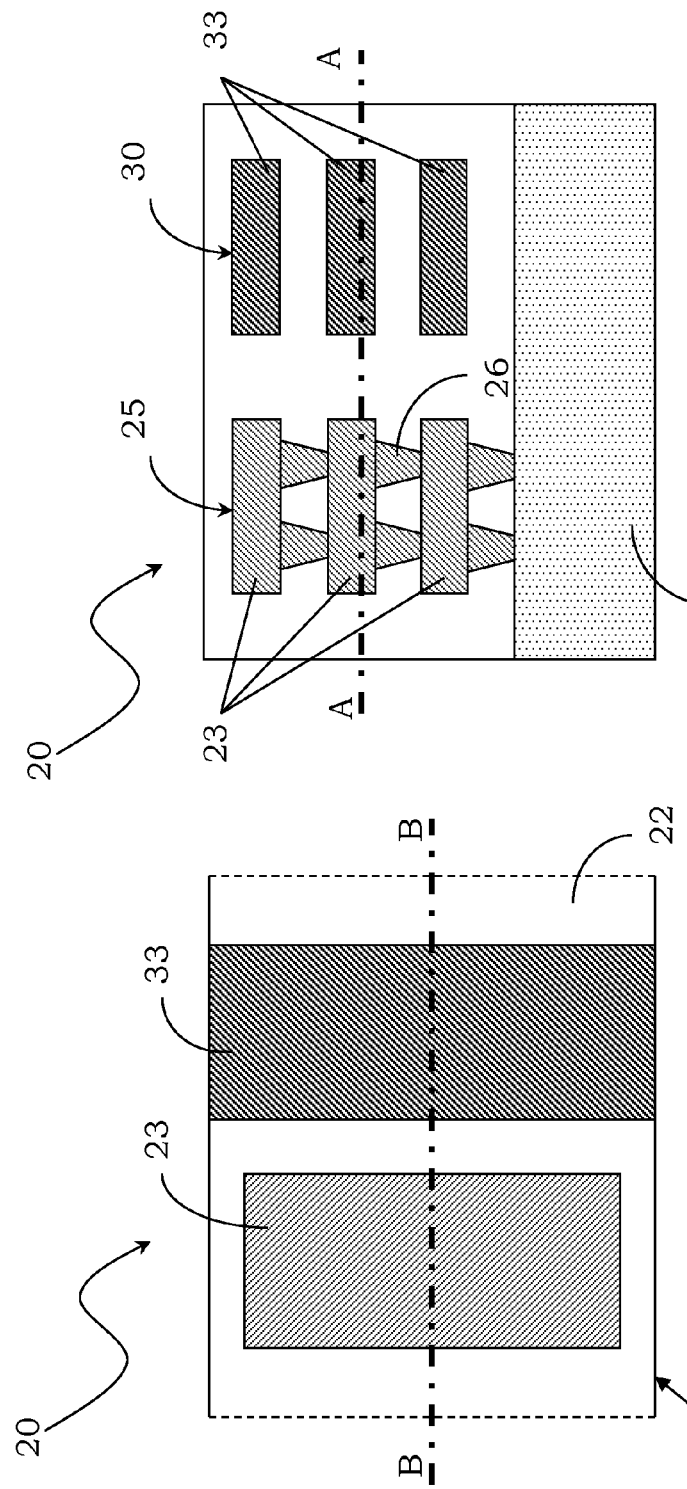

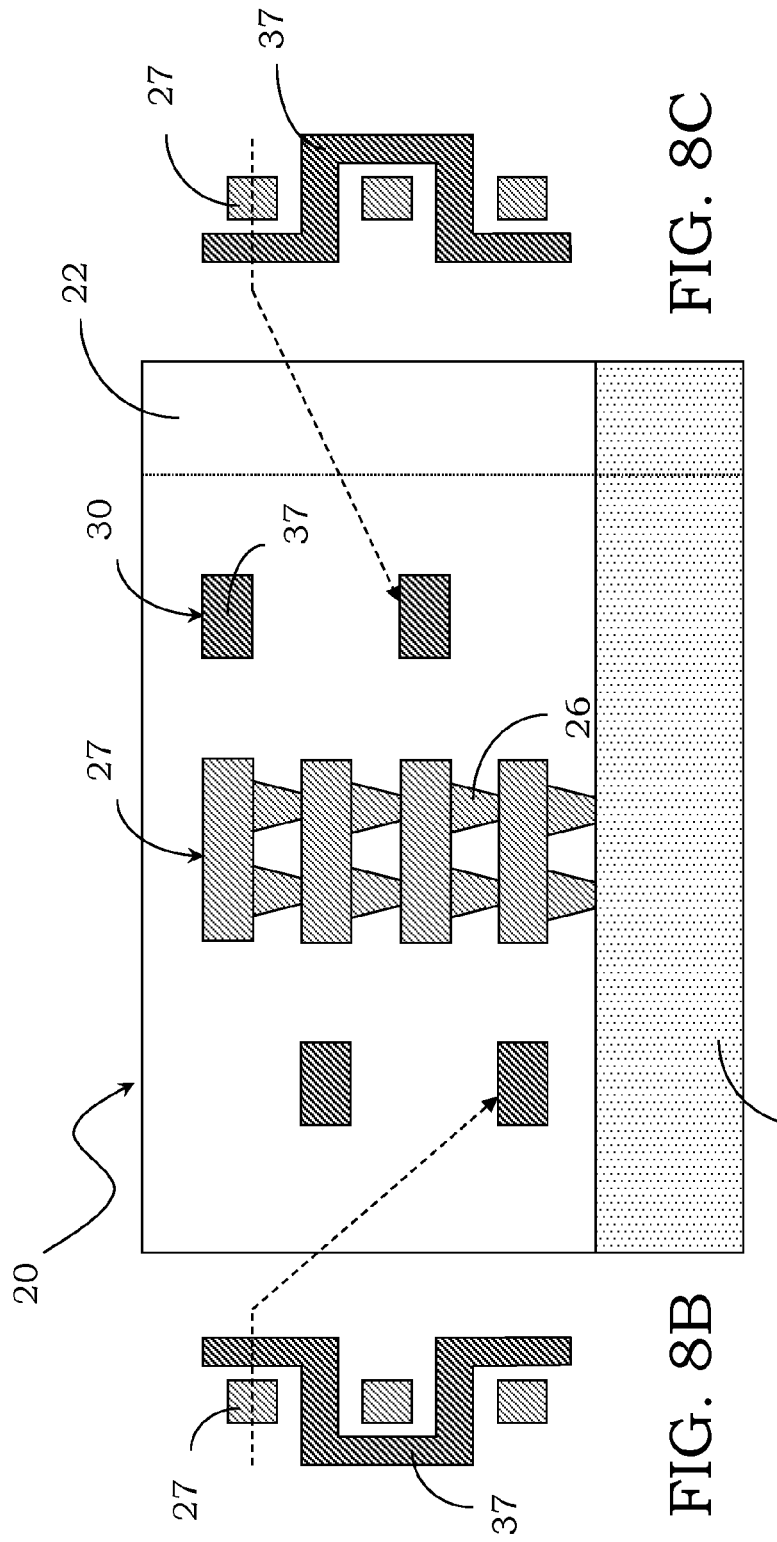

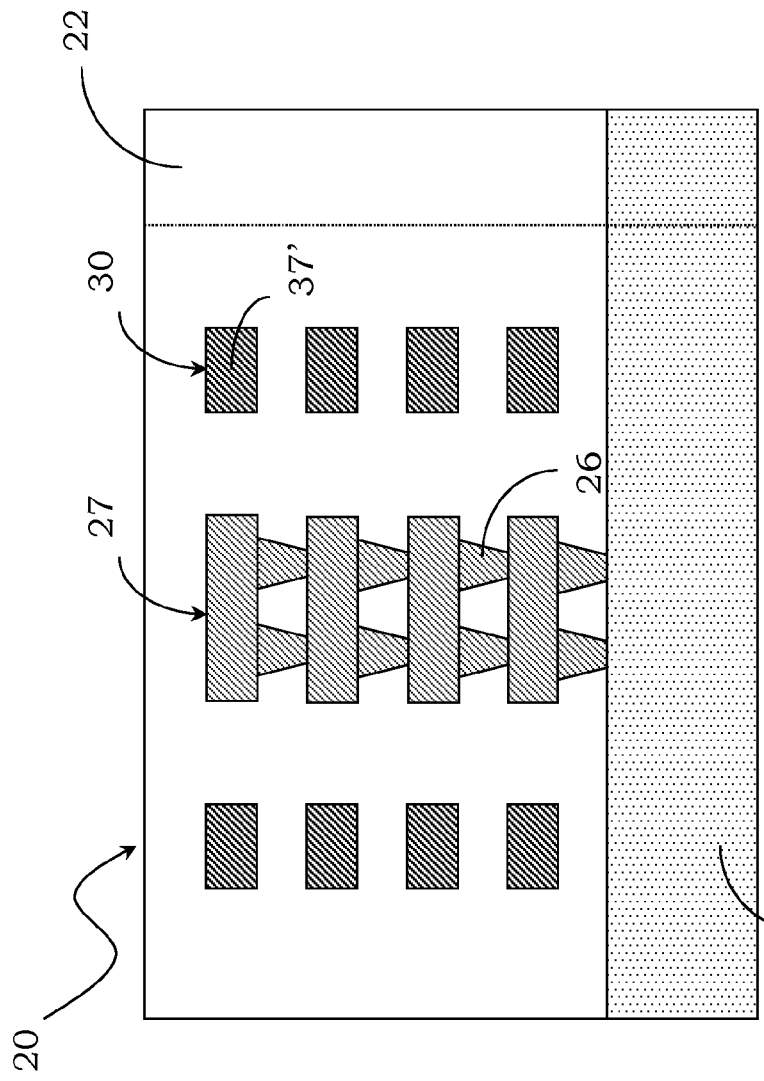
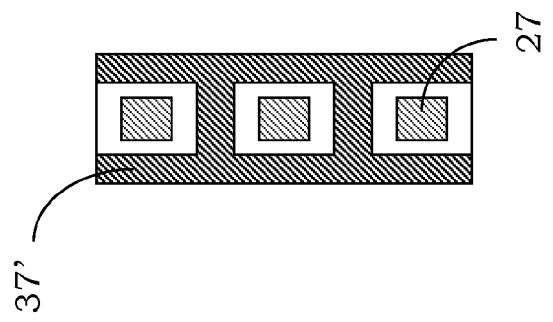
FIG. 9A
FIG. 9B

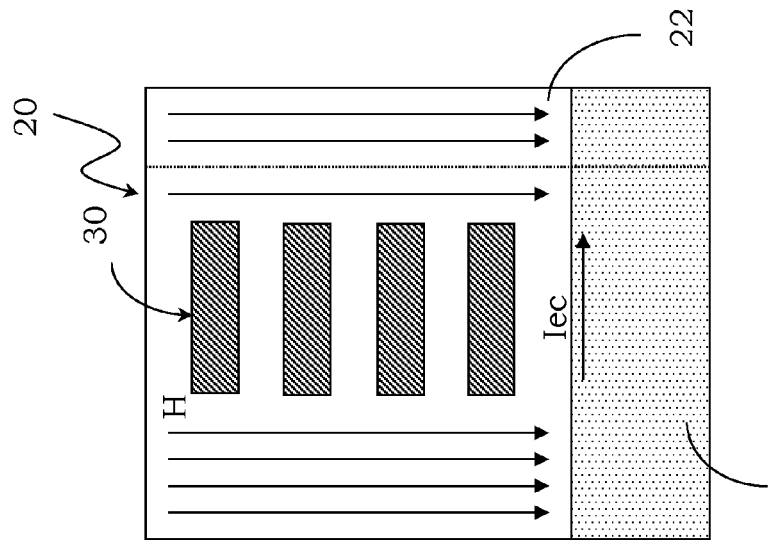
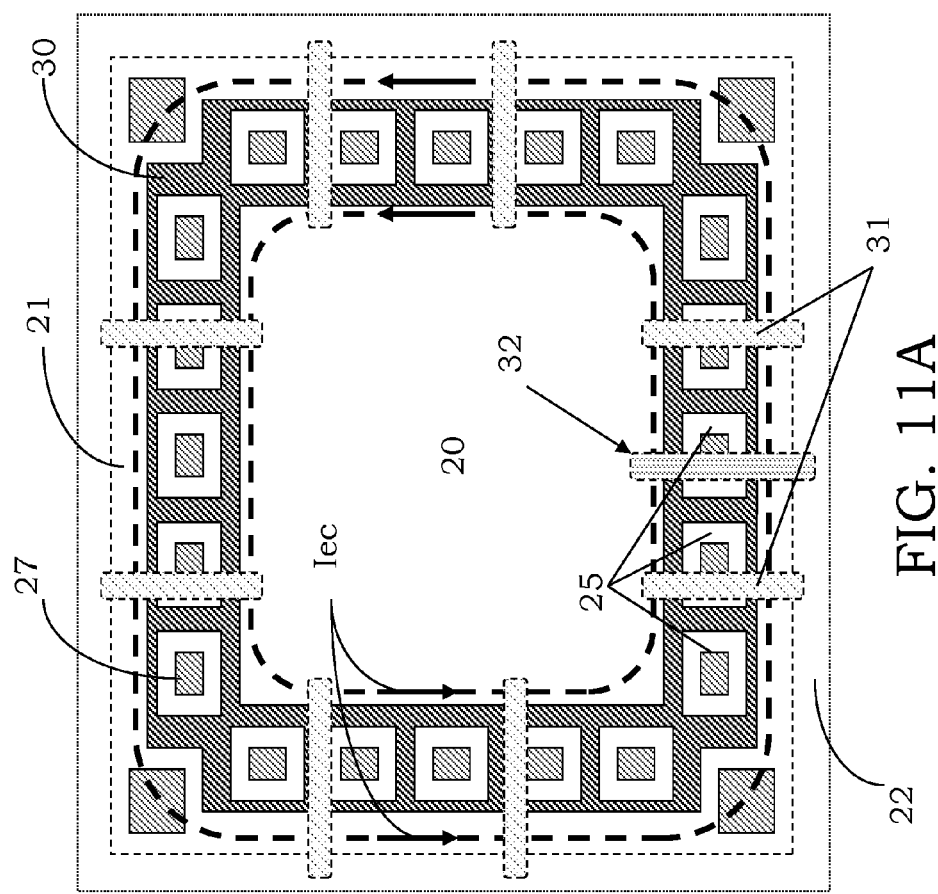
FIG. 11B
FIG. 11A

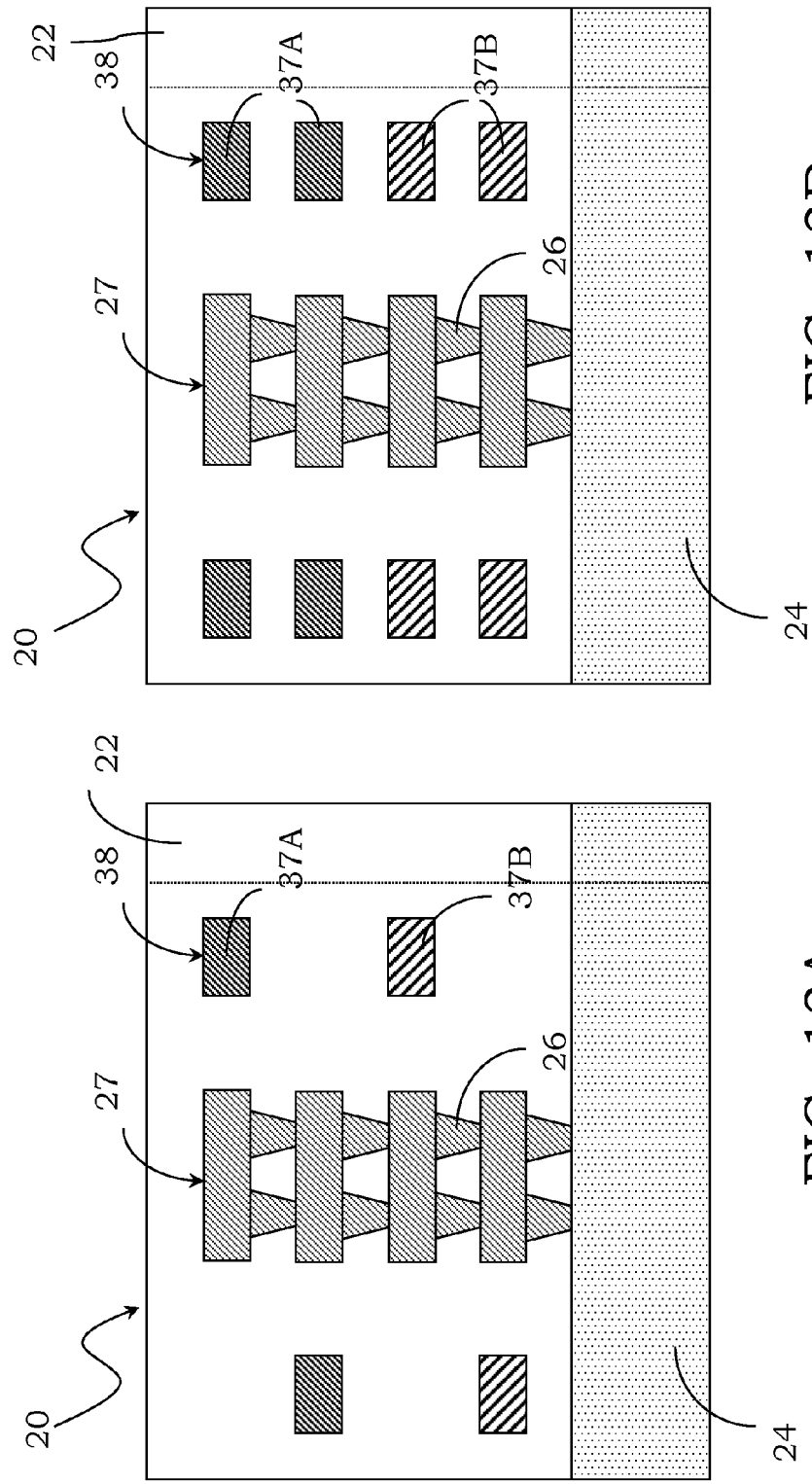

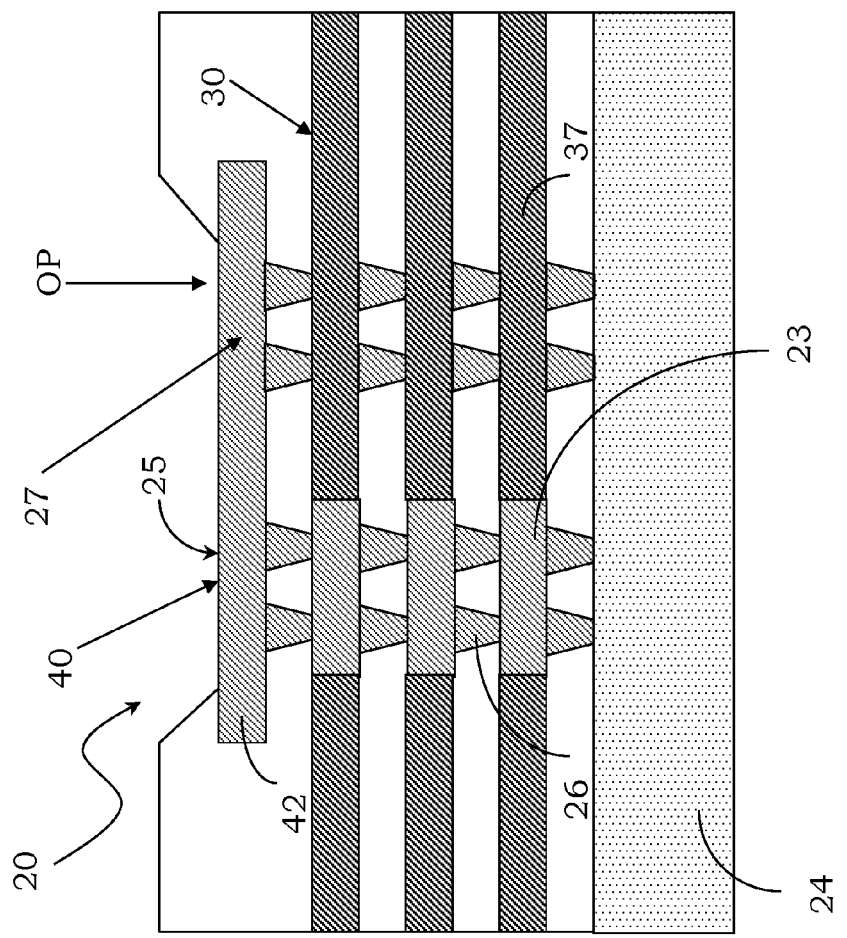
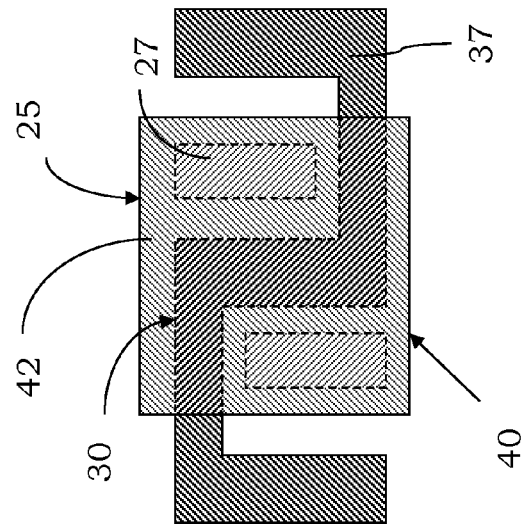
FIG. 15A
FIG. 15B

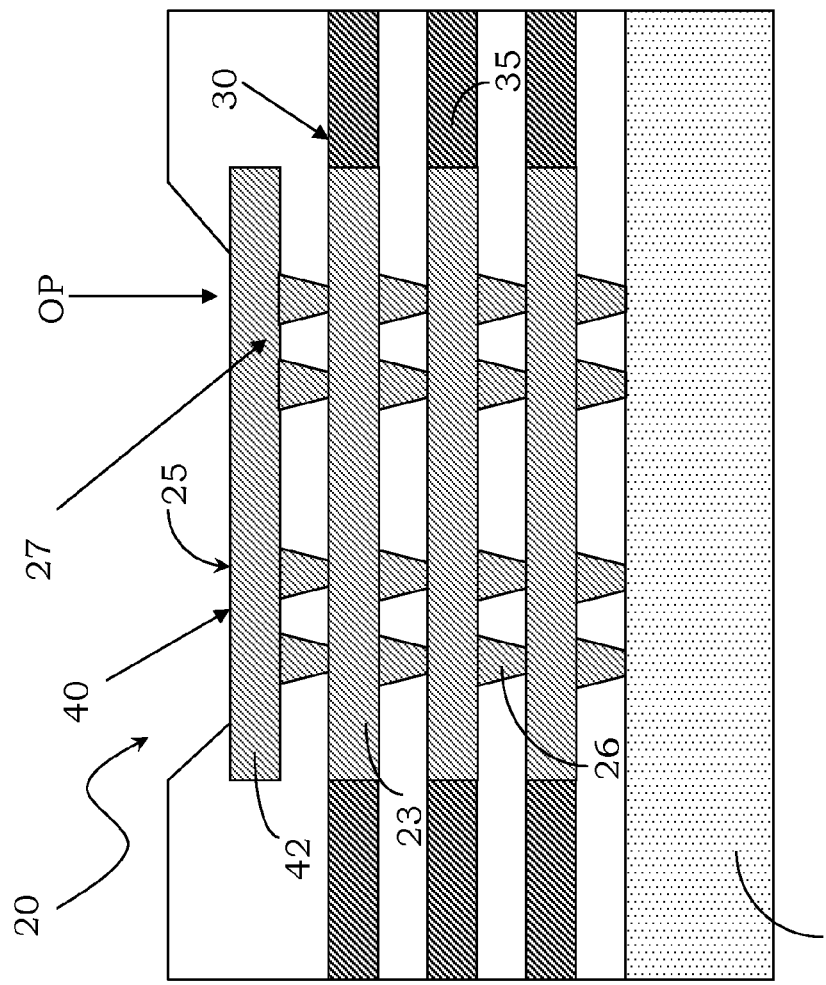
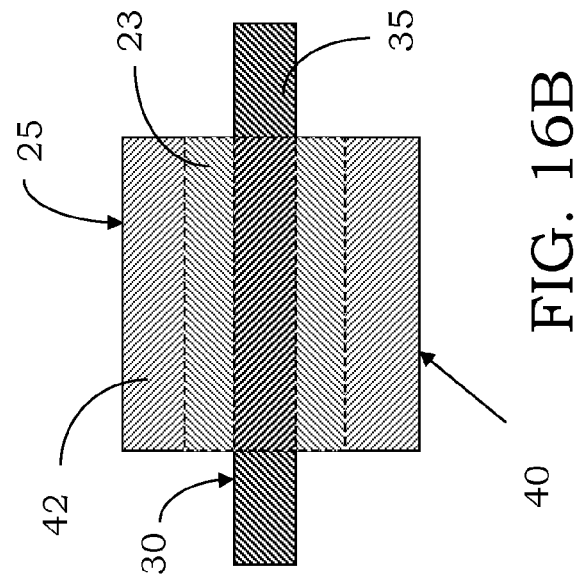
FIG. 16A
FIG. 16B

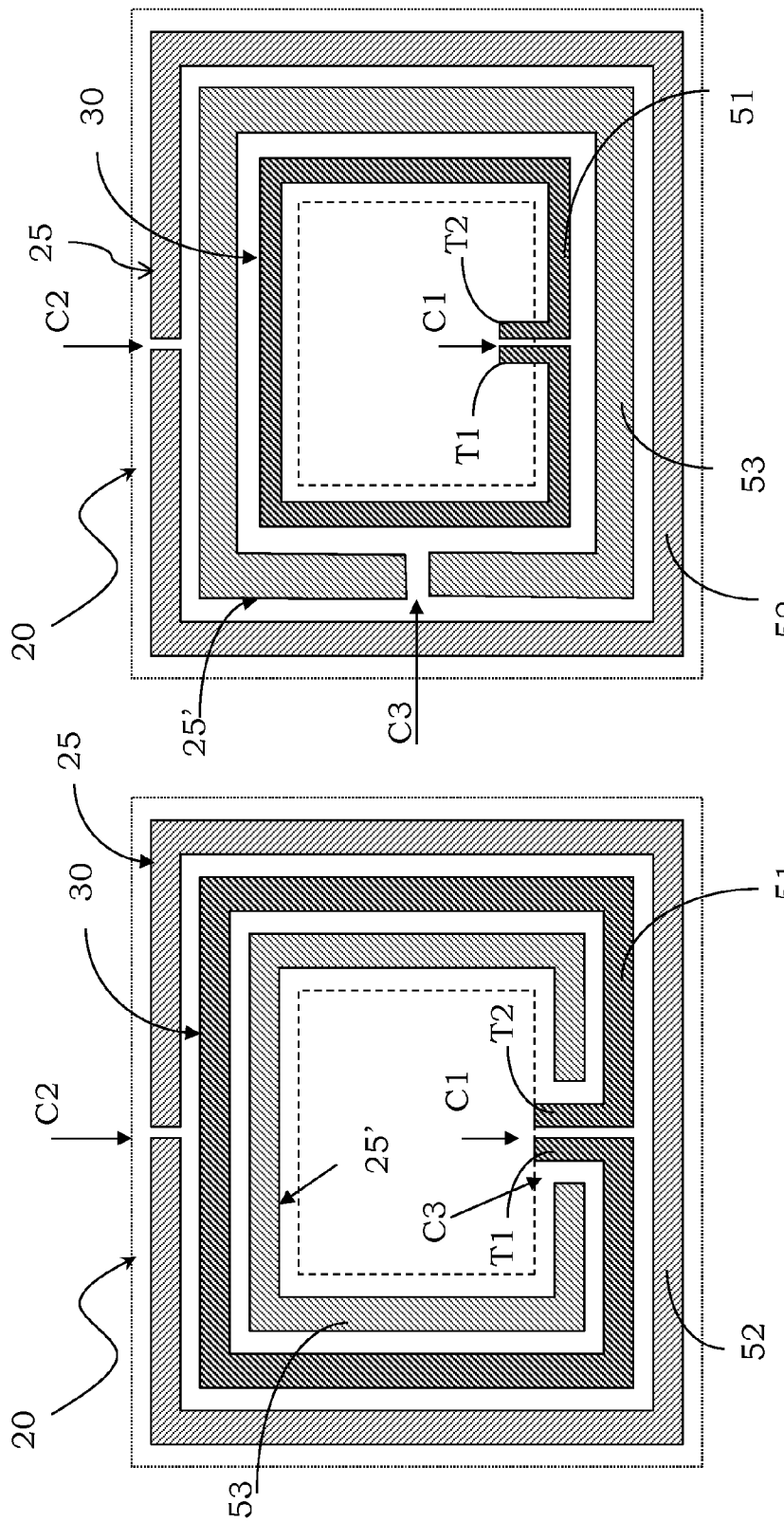

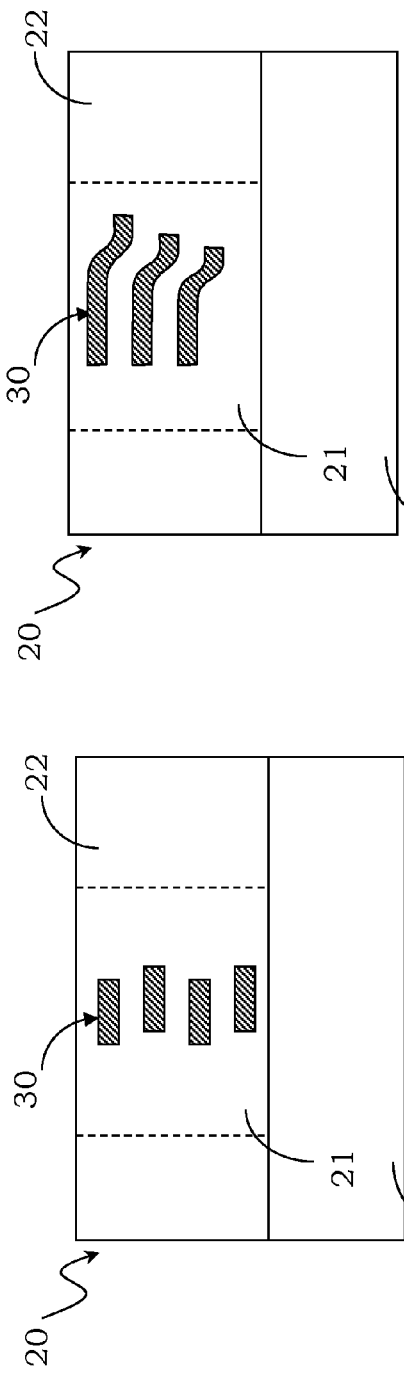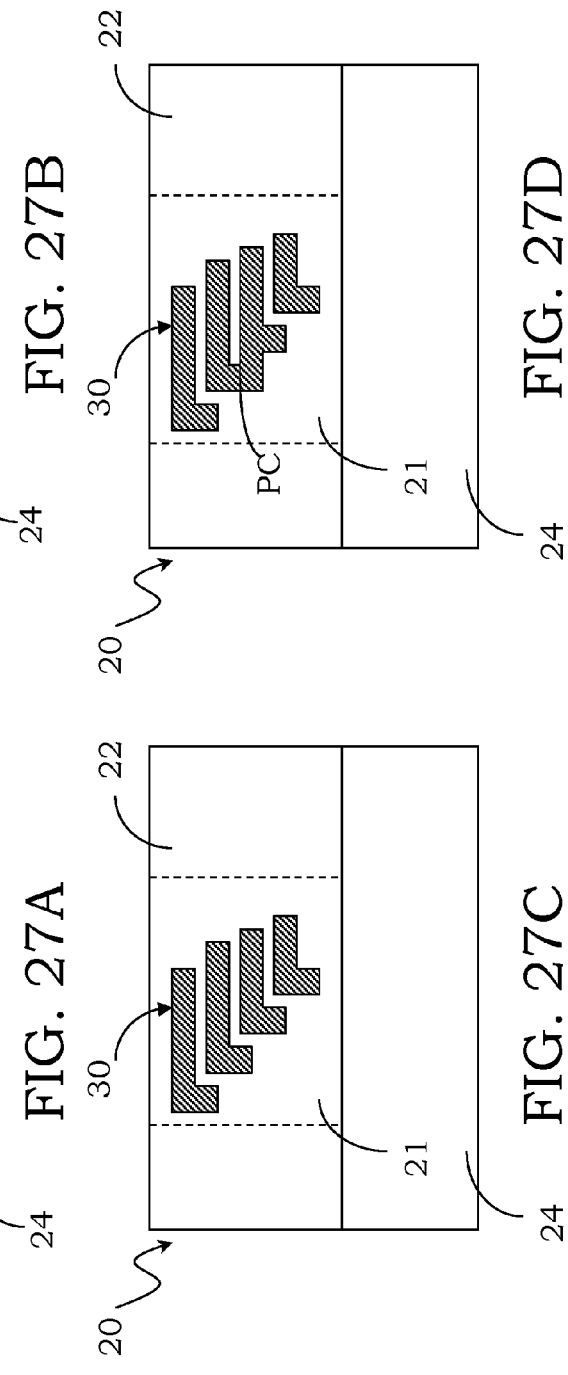
FIG. 27A  FIG. 27B  FIG. 27C  FIG. 27D

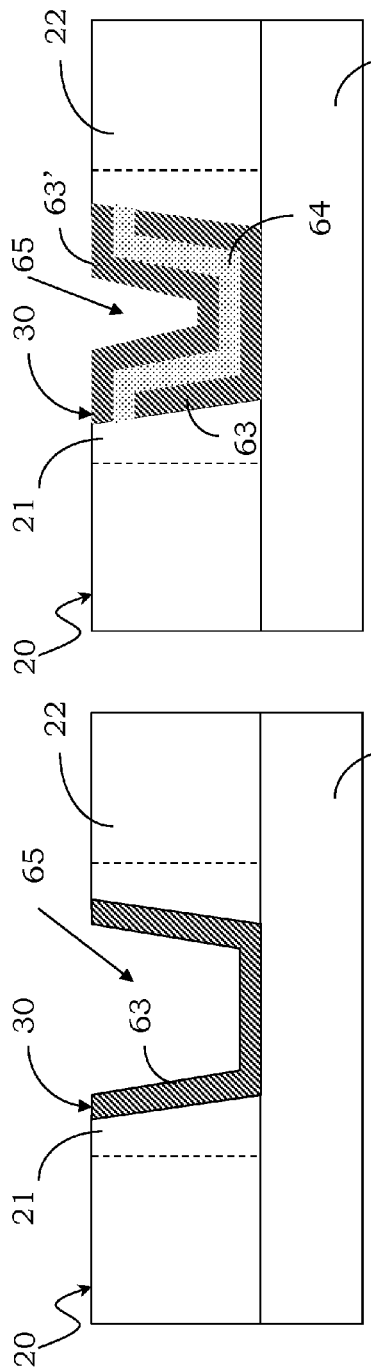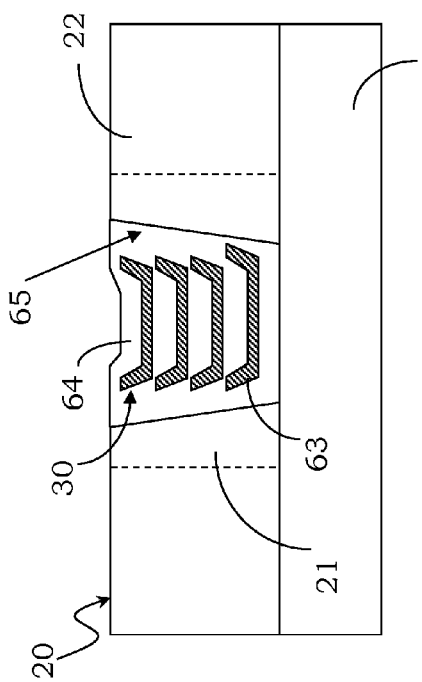
FIG. 29A
FIG. 29B
FIG. 29C

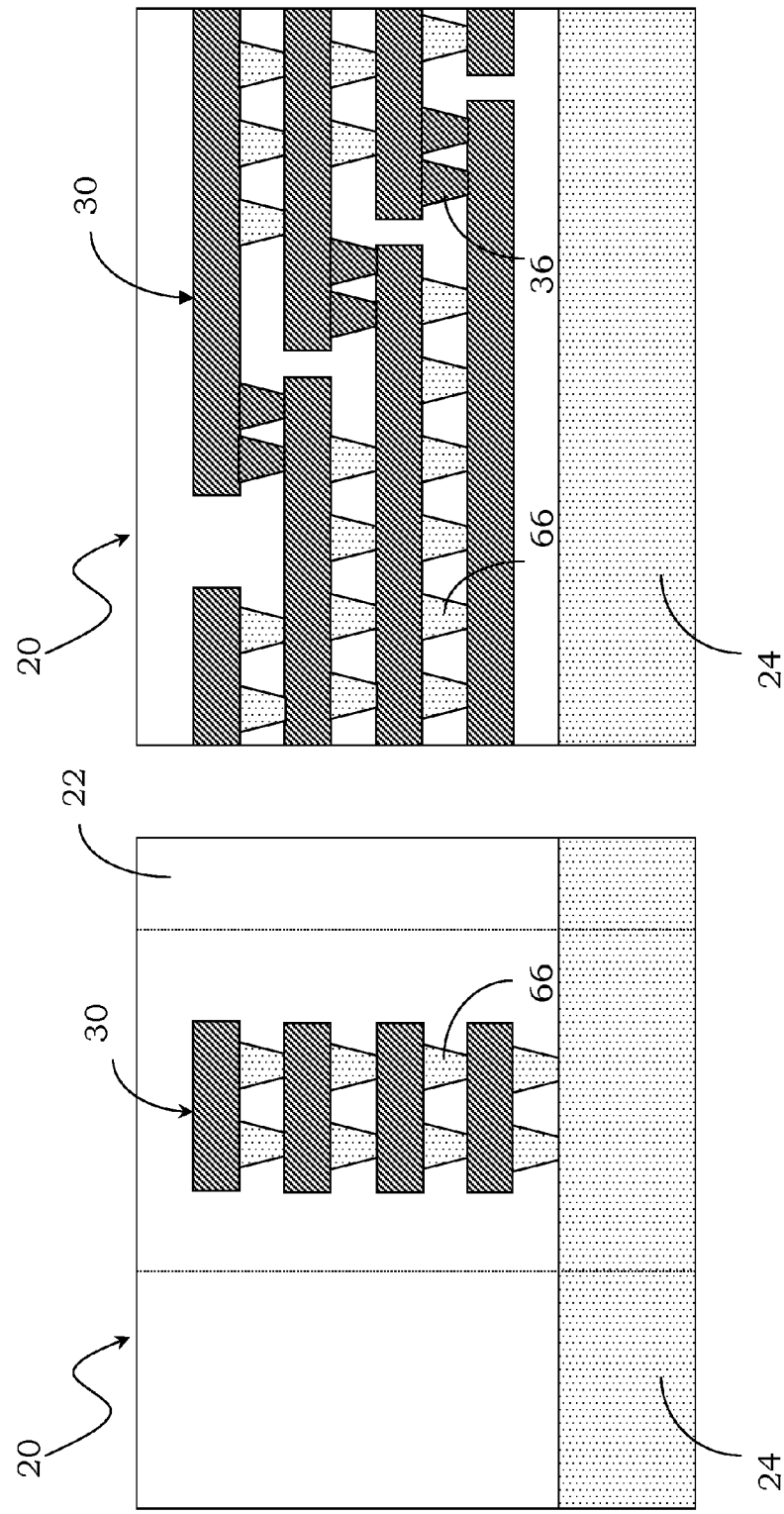

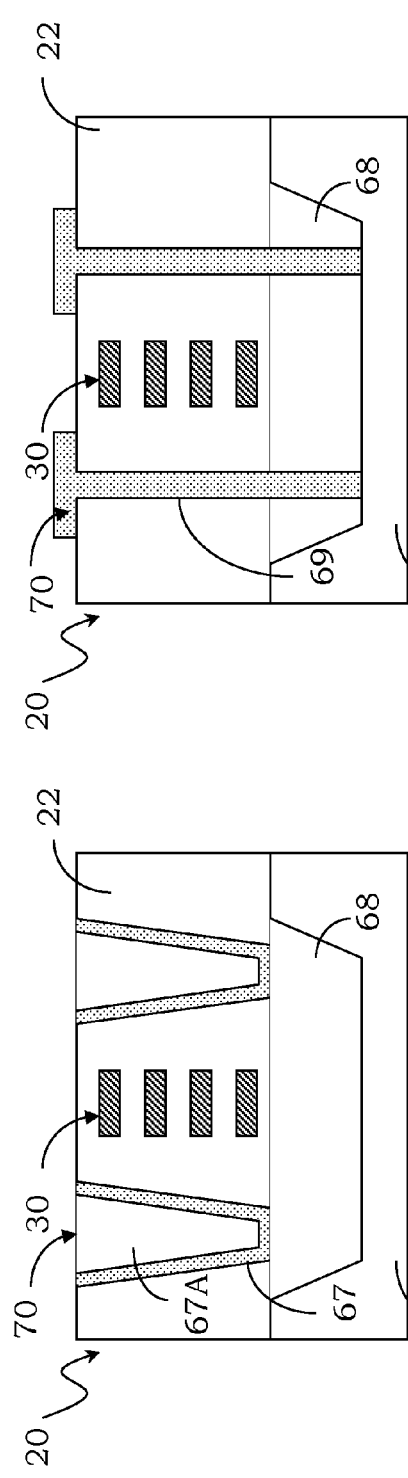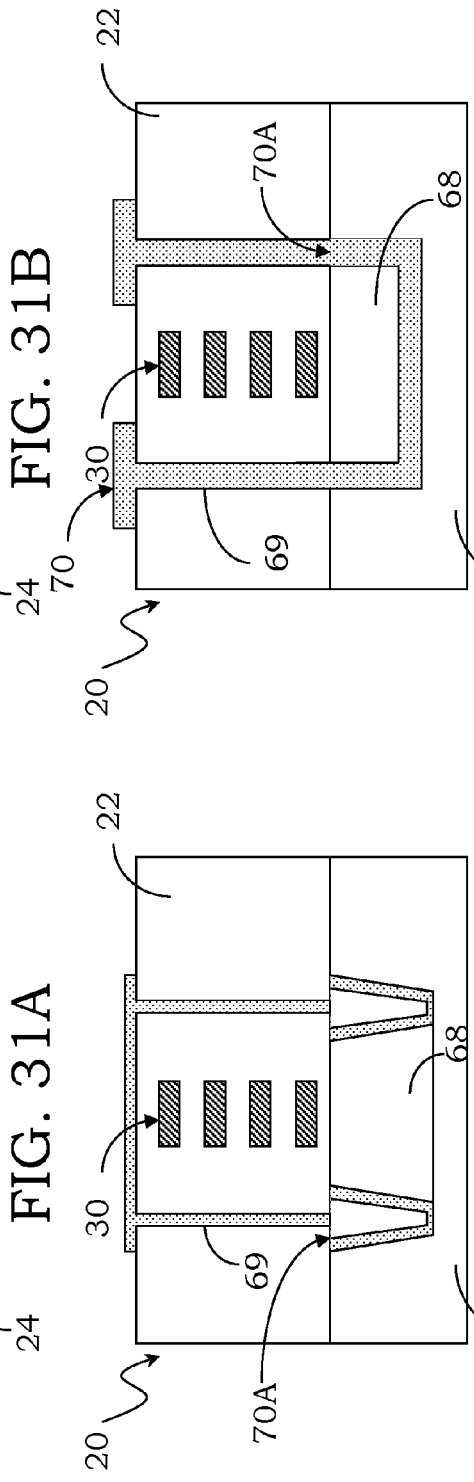

INTEGRATED CIRCUIT COMPRISING AT LEAST AN INTEGRATED ANTENNA

CROSS REFERENCE TO RELATED APPLICATIONS

This application is a continuation of U.S. patent application Ser. No. 13/560,632 filed Jul. 27, 2012, (to be issued as U.S. Pat. No. 9,188,635 on Nov. 17, 2015), which claims the priority benefit of Italian patent application number MI2011A001416, filed on Jul. 28, 2011, entitled PERIPHERAL ANTENNA, the disclosures of which are hereby incorporated by reference to the maximum extent allowable by law.

BACKGROUND

1. Technical Field

Embodiments relate to an integrated circuit provided with at least one integrated antenna. Embodiments particularly, but not exclusively, relate to an wafer integrated circuit and the following description is made with reference to this field of application by way of illustration only.

2. Discussion of the Related Art

As it is well known, for the electric selection of devices executed on wafer, i.e. the so called testing EWS (acronym from "Electrical-Wafer-Sorting"), it is necessary to electrically connect a tester or ATE (acronym from "Automated Test Equipment") that executes measures on a wafer whereon there are electronic components to be tested or selected or probed, in particular integrated circuits or chips. A terminal portion of the test system is schematically shown in FIG. 1A, globally indicated with 1.

The interface between the real tester ATE 1A and a wafer 6 comprising a plurality of devices to be tested or selected, in particular chips 7 (also indicated as integrated circuits or IC, acronym from "Integrated Circuit") is a so called probe card 2, which is essentially a board made of a PCB (acronym of "Printed Circuit Board") and of a probe head 3 that comprises hundreds (many times thousands) of different probes 4 that electrically connect the tester ATE 1A to almost all the contact pads 8 of a chip 7 to be tested, as shown in greater detail but always schematically in FIG. 1B. In particular, each end portion or tip 9 of the probes 4 enters in contact with a contact pad 8 of the chip 7.

In general, the wafer 6 groups a plurality of chips 7 to be tested, and during the testing steps it is placed on a support called chuck 5, shown in the portion of the test system 1, and belonging to an apparatus called also prober (not shown in the figure), this support being thus indicated also as prober chuck.

The number of contact pads 8 being needed for a determined testing may be smaller or identical to the total number of contact pads 8 present on the chip 7 to be tested.

The procedure goes on in a similar way even if on the chips 7 there are contact bumps instead of contact pads 8, as it is well known to technicians in the field.

For positioning the probes 4 on the contact pads 8, the prober uses optical recognition operated by video cameras which focus on some details on one side of the wafer and on the other the probes or special bidimensional markers called Fiducials (not shown) which are placed on the probe card 2 outside the array of probes 4. However, the recognition of these bidimensional Fiducials requires additional algorithms and necessitates ties on the construction of the probe card 2, and in particular on the realization of the array of probes 4.

Before each chip 7 is encapsulated into a respective package, it is known that it is necessary to execute the testing of the chip 7 itself still on the wafer 6, by using the probes 4 that are directly connected to the contact pads 8, and that thus execute the so called probing of the contact pad 8 they enter in contact with.

After the testing, the wafer 6 is cut and the chips 7 that have been tested and proved to be working are assembled in their package, ready for further process steps, also comprising final testing steps of the chip 7 themselves in the package wherein they have been assembled.

To this purpose, on the wafer 6, between a chip 7 and another, an area is created called scribe line SL within which a saw or a laser will pass during the cutting or singulation operation, necessary for separating the various devices present on the wafer for executing the various assembling and encapsulating or packaging steps of the same devices, as schematically shown in FIG. 2. In particular, in the schematic enlargement indicated by way of illustration in FIG. 2, a group of four chips 7, indicated as IC A, IC B, IC C and IC D, is separated by a first scribe line SL1, in particular horizontal according to the local reference of the figure, and a second scribe line SL2, in particular vertical, in the local reference of the figure.

Moreover, as shown in this figure, in the scribe lines (in particular in the first scribe line SL1) elementary structures are introduced, usually indicated as structures TEG (acronym of "Test Element Group"), these structures being used, for example, for the testing of some process parameters, which are measured in general before the electric test on wafer EWS.

Further, each chip 7 is surrounded, in a known way to those skilled in the art, by a protection structure, the so called seal ring 7A.

More in particular, the seal ring 7A has the aim of sealing the respective chip 7 and strengthening it mechanically for ensuring its reliability also further to the mechanical effort exerted by the saw during the cut or singulation of the chip 7 from the wafer 6.

The seal ring 7A is usually placed between an area where the contact pads of the chip itself, normally indicated as pad ring, and the scribe line SL confining with the chip itself are placed.

It is known that the seal ring 7A comprises a plurality of metal layers and of vias that connect them so as to realize a structure able to also block ions and polluting substances (such as, for example, humidity) which could jeopardize the proper operation of the chip 7 after the singulation.

Different implementations are known for the realization of a seal ring of an integrated electronic device or chip. For example, in U.S. Pat. No. 6,300,223 by Chang et al., there is described a structure of a seal ring where dielectric layers and metallic layers are alternated, the structure being also provided with a trench for reducing the mechanical stresses at the singulation of the chips from the wafer. Other structures suitable for realizing a seal ring are also known from U.S. Pat. No. 7,605,448 by Furusawa et al. and U.S. Pat. No. 6,492,716 by Bothra et al.

For avoiding problems of radiofrequency interferences that could jeopardize the operation of the chip, it is also known to suitably cut the seal ring in those points where substrate disturbances could be injected, these disturbances coming from internal circuits of the chip itself (such as power amplifiers, clock signal generators, input/output digital signal processing circuits, etc).

This technique for cutting the seal ring is also diffusely adopted for problems tied to the coupling with integrated inducers used at radiofrequency and microwaves for the following circuits: LNA, mixer, VCO, filters, etc. This measure is adopted in this case with the aim of eliminating the currents induced in the seal ring further to the passage of current in the inducers themselves, in particular the so called "eddy currents" or Foucault currents. In substance, the seal ring is cut so as to have an open ring structure, instead of a closed ring one, so as to avoid that it comprises coils through which the eddy currents could flow.

This technique for cutting the seal ring is also adopted for problems tied to the coupling with typically inductive integrated antennas used at radiofrequency and microwaves for the transmission of wireless signals. This measure is also, in this case, adopted so as to eliminate the currents induced in the seal ring further to the passage of current in the antennas themselves. Like in the previous case, the seal ring is cut so as to have an open ring structure, instead of closed ring, so as to avoid that circular paths are formed through which the eddy currents could flow.

It is to be specified that the eddy currents are such as to oppose against the currents generated in the antennas and/or in the inducers as provided by the law of Faraday-Lenz. The drawback of these currents is thus that they produce a magnetic flow that opposes against the variation of magnetic flow produced by the antenna and/or by the inducer present in the chip with a consequent reduction of its efficiency, in particular the negative mutual coupling of the currents reduces the value of the effective inductance, while the energy dissipated by the eddy currents reduces the quality factor Q, as it is evident from the following relation (referred to an inducer under optimal conditions):

$$Q \cong \frac{\omega \cdot Ls}{Rs}$$

being:

ω is the pulse of the current sinusoid that flows through the antenna and/or the inducer;

Ls the inductance value of the antenna and/or of the inducer; and

Rs the resistance value of the antenna and/or of the inducer.

It is also well known that a generic electronic device or chip is connected to the surrounding world through connections such as wired channels (for example, cables, optical fibers, . . . ) or wireless channels (for example of the electromagnetic type). These connections allow for the exchange of information signals and/or to supply the chips themselves.

In case signals are to be exchanged through transmission of the magnetic or electromagnetic type between a chip and at least another external system, the chip should have inside at least one receiver/transmitter, also indicated as transceiver/transponder, connected to at least one antenna that may be incorporated in the chip itself, as schematically shown in FIG. 3.

In particular, the chip 10 comprises a plurality of circuit portions 11, indicated also as Core 1 . . . Core 4, at least one of which, in particular Core 1, connected to an antenna 12 through a device transmitter/receiver or transceiver/transponder 13.

Examples of chips provided with an antenna are the circuits RFId (acronym of "Radio Frequency Identification") or the Smart Cards, that are low power integrated circuits (low power IC), that may be supplied and exchange information through the wireless channels (and thus without contact or contactless) that use transmission of the magnetic and/or electromagnetic type obtained by means of at least two antennas, of the type shown schematically in FIGS. 4A and 4B.

The RFId circuit, globally indicated in these figures with 15, comprises an antenna 17A, that may be, for example, a magnetic dipole or a hertzian dipole, which is connected to a chip 16A (in particular a RFId/Smart Card IC) in general by using bumps or wire bonds. The antenna 17A and the chip 16A are, in general, both contained in a single package. The antenna 17A is connected to the chip 16A, and this antenna 17A may be outside the chip 16A, as indicated in FIG. 4A, or it may be embedded, and thus be part of an overall integrated circuit 16B a portion of which is the chip 16A, as indicated in FIG. 4B.

The RFId circuit 15 communicates, by means of the exchange of electromagnetic waves 18, with an external system, for example a reader 14 that comprises in turn an antenna 17B and a reading system (RFId/Smart Card Reader) 19, including at least one chip 16C with characteristics functionally compatible with respect to the chip 16A.

The antenna 17A of FIG. 4B of the RFId circuit 15 may be of the magnetic type, in particular of the near field inductive type, and may be positioned around the chip 16A, with an increase of the area of the overall integrated circuit 16B itself and a consequent reduction of the total number of RFId circuits that may be placed on a wafer.

Antennas that work by using the electromagnetic field are described, for example, in published US patent application No. US 2010/0026601 in the name of Chang et al. In particular, these antennas are used for cell phones and operate far field thanks exactly to the electromagnetic field, comprising structures similar to hertzian dipoles or monopoles, suitably provided with reflectors. The structures proposed should not have metallic parts positioned above the antenna, which might screen the electromagnetic field. Also in this case, the antennas occupy a large area, with consequent increase in the area of the integrated circuit that comprises them.

Alternatively, the antenna may be also integrated above the chip to avoid such an area increase obtaining an On-Chip Antenna (OCA).

In this case, the performance of the antenna of the embedded type is however to be optimized, for maximizing the transfer of power, the electromagnetic energy exchanged being used also for supplying the chip that comprises the embedded antenna.

In particular, a known process for creating an antenna of the integrated or embedded type is a traditional diffusion process, which requires, however, additional masks and additional steps with respect to the wafer manufacturing process. Post processing methodologies are also known to create lower cost embedded antennas.

In each case, the antennas of the embedded type, now very used for RFId or Smart Cards, have a limited operational range due to their sizes.

Antennas of the capacitive type are also known, that use the generic pad of a chip as an armature of a capacitor.

In substance, the known solutions for realizing antennas integrated in a chip should use suitable structures, having reduced sizes when they are dedicated to the sole exchange of signals.

When instead also the power is to be transferred through the antenna, it is necessary to integrate with it structures of greater sizes. These structures, however, may have the following drawbacks and/or constraints:

if placed on the chip, they may require the use of integration processes that involve at least one further metallization level with respect to the realization of the chip itself, and if placed around the chip, they may increase its area.

These drawbacks and/or constraints linked to the integration of antennas in a chip may require, in each case, an increase of the relative manufacturing cost.

Moreover, the presence of structures such as, for example, the seal ring is however suitable for avoiding damages also of the integrated antennas during the cutting step of the wafer, i.e. of singulation of the chips realized therein.

SUMMARY

An embodiment provides the integrated antenna in the circuit, in correspondence with a peripheral portion of the same close to the separation scribe line with the other circuits on the same wafer, the antenna developing on different planes with respect to a substrate wherein the circuit is realized.

An embodiment provides an integrated circuit on a substrate of the type comprising at least one peripheral portion that surrounds an active area and is realized close to at least one scribe line providing separation with other integrated circuits realized on the same wafer, at least one conductive structure that extends in said peripheral portion on different planes starting from said substrate and realizes an integrated antenna for said circuit.

According to an embodiment, the antenna may be realized by using metallization levels arranged on different planes suitably connected for ensuring the correct operation of the antenna thus obtained.

According to an embodiment, the conductive structure of the antenna may comprise a first plurality of conductive lines realized on different planes and suitably connected.

According to another embodiment, the circuit may also comprise a second plurality of conductive lines, side by side with the first plurality and connected so as to form a seal ring of the integrated circuit.

Furthermore, the integrated circuit may comprise conductive connections that develop perpendicularly to these planes and connect conductive lines of the first plurality arranged on different but adjacent planes, as well as conductive connections that develop perpendicularly to the planes and connect conductive lines of the second plurality arranged on different but adjacent planes to form pillar structures of the seal ring.

According to another embodiment, the seal ring may comprise a plurality of pillar structures distributed in the peripheral portion.

Moreover, the conductive lines that form the antenna may be serpentine-like shaped and surround at least partially the pillar structures of the seal ring or chain-like shaped and completely surround these pillar structures, or may cross these pillar structures through cavities present in the pillar structures themselves.

According to another embodiment, the integrated circuit may further comprise reinforced pillar structures realized by portions of the second plurality of conductive lines and having greater sizes than corresponding sizes of the pillar structures of the seal ring, the reinforced pillar structures being positioned in correspondence with mechanically stressed points of the integrated circuit. In particular, these reinforced pillar structures may be positioned in correspondence with the angles of the integrated circuit.

The integrated circuit may further comprise a junction suitably biased and realized in the substrate below the antenna.

According to another embodiment, this junction may be realized by means of a well being complementary doped with respect to the substrate.

Moreover, the integrated circuit may comprise suitably doped areas realized in the substrate so as to extend substantially across the peripheral portion where the antenna is realized.

According to another embodiment, the integrated circuit may comprise at least one trench realized in the substrate so as to extend substantially across the peripheral portion where the antenna is realized and filled in with an insulating material.

Moreover, the integrated circuit may comprise an opening for uncovering an upper portion of at least one of the pillar structures, which comprises a conductive line that extends up to the scribe line and/or at least one conductive line that extends up to the active area of the integrated circuit and realizes a pad for the integrated circuit and/or for structures TEG realized in the scribe line.

According to this another embodiment, the integrated circuit may comprise at least one conductive via of connection to a metallization line of a structure TEG with the conductive line that extends up to the scribe line, this conductive via realizing a fragility point when a successive step of singulation of the integrated circuit from the wafer wherein it is realized takes place.

Moreover, the seal ring may comprise at least one pair of pillar structures connected by means of an intermediate reinforcing conductive line.

The seal ring may also comprise at least one pillar structure provided with a conductive line realized above it and having greater size with respect to the remaining conductive lines of the second plurality that realize the pillar structure.

The integrated circuit may further comprise at least one linear element that passes between the pillar structures of the seal ring and forms the antenna.

According to another embodiment, the first plurality of conductive lines may surround the active area and form at least one coil of the antenna, interrupted in correspondence with a cutting area for realizing at least one pair of terminals of this antenna.

In particular, the conductive lines that form the antenna may be shaped so as to overhang at least in part a second plurality of conductive lines that form a seal ring and/or a further plurality of conductive lines that form a further seal ring, arranged inside and/or outside the antenna.

According to another embodiment, the integrated circuit may comprise a second plurality of conductive lines that surround the active area and are connected to each other to form a seal ring of the integrated circuit.

The conductive lines of the second plurality may be interrupted in correspondence with a second cutting area, this second cutting area having the possibility to be in an opposite position with respect to the first cutting area of the first plurality of conductive lines.

Moreover, the second plurality of conductive lines of the seal ring may be arranged outside the first plurality of conductive lines of the antenna towards the scribe line.

According to another embodiment, the integrated circuit may comprise a further plurality of conductive lines connected so as to form a further seal ring in the peripheral portion of the integrated circuit.

In particular, the conductive lines of this further plurality may be interrupted in correspondence with a further cutting area.

The further plurality of conductive lines of the further seal ring may be positioned inside the first plurality of conductive lines of the antenna towards the active area of the integrated circuit, the further cutting area being positioned in correspondence with the first cutting area for allowing the passage of the terminals of the antenna.

Alternatively, the further plurality of conductive lines of the further seal ring may be positioned between the first plurality of conductive lines of the antenna and the second plurality of conductive lines of the seal ring, the further cutting area being positioned so as not to be aligned with the second cutting area of the second plurality of conductive lines.

The conductive lines of the first plurality that form the antenna may be shaped so as to overhang at least in part the second plurality of conductive lines that form the seal ring and/or the further plurality of conductive lines that form the further seal ring.

According to another embodiment, the circuit may further comprise a trench structure realized in a central portion of the scribe line, so as to penetrate into the scribe line up to at least the substrate level or possibly at least partially also therein.

This trench structure may be covered by a protective layer and the antenna may act also as seal ring of the integrated circuit.

Alternatively, the conductive structure of the antenna may comprise at least one trench structure suitably coated by at least one layer of a conductive material to form a coil of this antenna.

Furthermore, the antenna and/or the seal ring may comprise at least one material having magnetic features.

In particular, the trench structure may be filled in at least partially with a nonconductive filling material and may comprise above this nonconductive filling material at least one further conductive material to form a further coil of the antenna.

Moreover, the antenna is formed inside the trench structure by means of a plurality of layers of a conductive material arranged at different levels with respect to the substrate and separated by a nonconductive material.

According to another embodiment, the antenna may comprise support structures arranged between its conductive paths.

These support structures may be realized by means of pillars of a nonconductive material, vias of a nonconductive material, or by means of vias comprising an external layer of a nonconductive material and filled in at least in part with a conductive material.

Moreover, this nonconductive material of the support structures may comprise a material with magnetic features.

According to another embodiment, the antenna and/or the seal ring may comprise at least one material having magnetic features.

Moreover, the integrated circuit may comprise, at least below the antenna, at least one TSV filled in with an insulating material.

Further, the integrated circuit may comprise, adjacent to the antenna, at least one trench comprising in turn at least one material having magnetic features for realizing a magnetic trench.

This magnetic trench may comprise a lateral coating portion realized in a magnetic material and filled in with a filling material.

According to another embodiment, the integrated circuit may comprise at least one pair of magnetic trenches realized on the opposite part with respect to the antenna and possibly a further insulating trench realized in the substrate below the antenna and below the magnetic trenches, these magnetic trenches having the possibility to be realized with a magnetic material that extends also in the further insulating trench.

The integrated circuit may comprise further insulating and/or magnetic trenches, inside or around the further insulating trenches.

According to another embodiment, there is provided a system for testing at least one integrated circuit provided with an antenna and realized as above indicated, the testing system comprising at least one probe card provided with a probe head wherein the probe card comprises at least one test antenna being in wireless connection with the antenna of the at least one integrated circuit.

According another embodiment, this testing system may comprise in this probe card at least one printed circuit whereto the probe head is connected and in turn connected to a tester ATE, the probe card having the possibility in this case of comprising at least one substrate of a flexible material provided with at least one first arm, and possibly a second arm, positioned between and connecting the probe head and the printed circuit and the test antenna having the possibility to be realized in this flexible substrate substantially positioned in correspondence with the antenna of the integrated circuit, so as to realize the wireless connection.

In particular, this testing system may further comprise at least one probe that extends from the probe head crossing the flexible substrate for coming into contact on a corresponding pad of the integrated circuit creating a wired communication channel between the probe card and the integrated circuit.

According to another embodiment, this at least one probe may have magnetic features.

The testing system may further comprise an integrated test circuit housed in a suitable seat realized in the probe head and connected to the flexible substrate and comprising circuits for the transmission and reception and possibly coding and decoding of the signals exchanged between the probe card and the integrated circuit.

The problem is solved also by a testing system of at least one integrated circuit provided with an antenna and realized as above indicated, the testing system comprising an antenna card directly associated with a tester ATE of the testing system and in turn comprising a substrate wherein at least one test antenna in wireless connection with the antenna of the at least one integrated circuit is realized.

According to another embodiment, the antenna card may also comprise three-dimensional elements projecting from the substrate in the direction of the integrated circuit as three-dimensional Fiducials able to be recognised by positioning video cameras of the testing system.

In particular, these three-dimensional elements may be bumps. Further, these three-dimensional elements may be positioned outside the test antenna.

According to another embodiment, there is provided a stacked structure comprising at least one first and one second integrated circuit realized as above indicated and wherein these first and second integrated circuits are overlapped onto one another so as to place respective antennas in substantial alignment with each other along a development direction of the same so as to create a wireless communication channel in the stacked structure.

These first and second integrated circuits may be separated from one another by a layer and possibly be overlapped onto each other so that the respective sublayers are in connection with this layer. Alternatively, these first and second integrated circuits may be separated from one another by a gap.

According to another embodiment, there is also provided a package suitable for housing at least one integrated circuit provided with an antenna and realized as above indicated, this package comprising at least an encapsulating material and a package substrate, as well as external connection elements, and an antenna suitable for realizing a wireless connection with the antenna of the integrated circuit.

According to another embodiment, the antenna may be a discrete antenna housed on the package substrate.

Furthermore, the antenna may be realized in the package substrate.

According to another embodiment, there is provided a testing system of at least one integrated circuit provided with an antenna realized as above indicated and housed in a package of the above described type, comprising an interface connected to a tester ATE of the testing system and provided with suitable contact terminals for the package, as well as with a test antenna suitable for communicating in a wireless way with the antenna of the integrated circuit.

According to another embodiment, the test antenna may be comprised in the interface.

BRIEF DESCRIPTION OF THE DRAWINGS

The characteristics and the advantages of the circuit, of the stacked structure, of the package and of the testing system according to the invention will be apparent from the following description of its embodiments given by way of indicative and non-limiting example with reference to the annexed drawings.

In these drawings:

FIGS. 4A and 4B schematically show a system RFId or Smart Card realized according to the prior art;

FIGS. 5A and 5B show schematic portions of a first embodiment of an integrated circuit comprising an integrated antenna;

FIGS. 7, 8A, 8B, 8C, 9A, 9B, 10, 11A, 11B, 12A, 12B, 13A, 13B, 14A, 14B, 15A, 15B, 16A, 16B, 16C, 17, 18 schematically show further implementations of the first embodiment;

FIGS. 20 and 21 schematically show the second embodiment of the circuit;

FIGS. 26A, 26B, 26C, 26D, 27A, 27B, 27C, and 27D schematically show further implementations of the third embodiment of the circuit;

FIGS. 29A, 29B, 29C, 30A, 30B, 31A, 31B, 31C and 31D schematically show further implementations of the fourth embodiment of the circuit;

DETAILED DESCRIPTION

Figure 1:
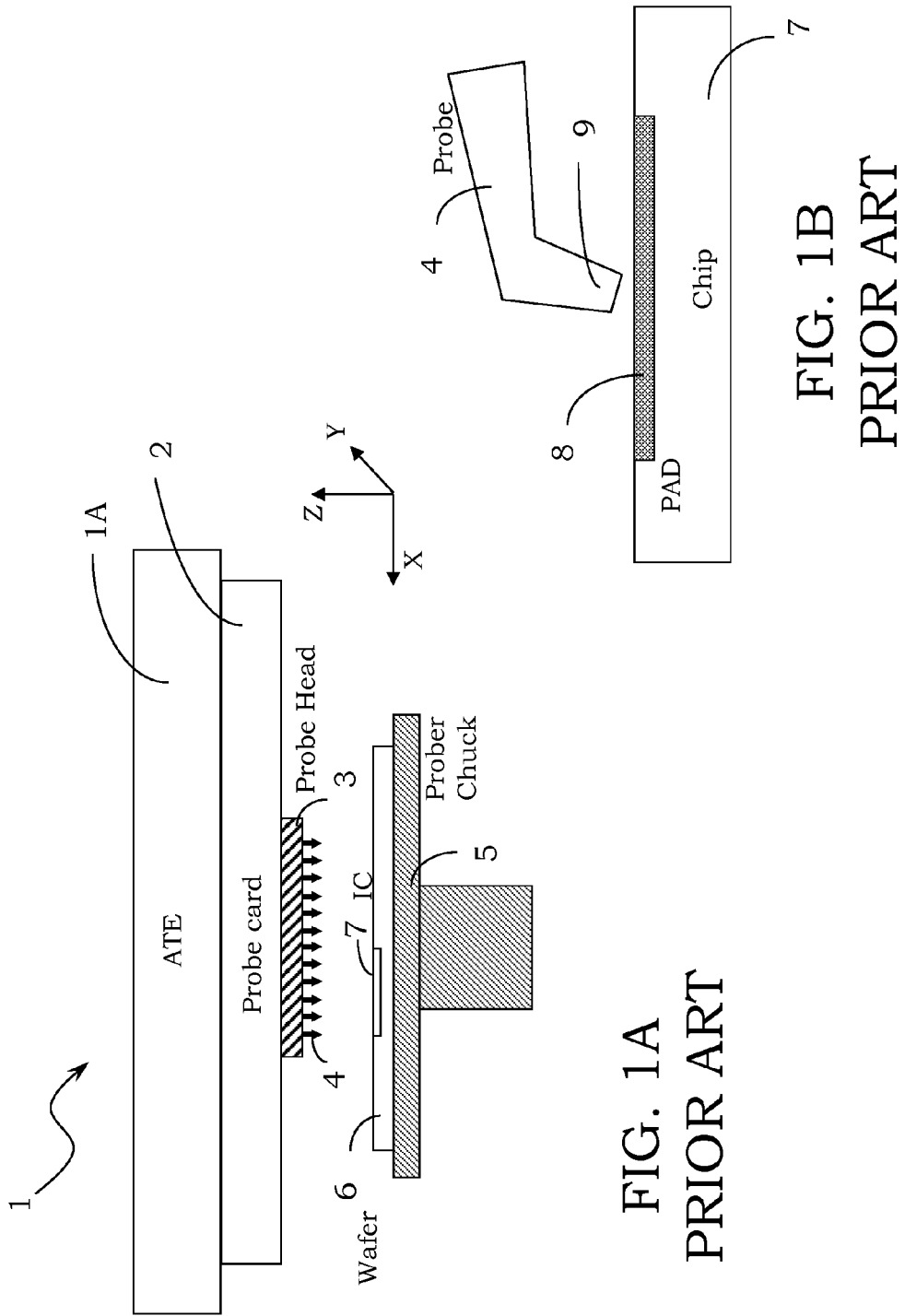
FIGS. 1A and 1B show, schematically and in greater detail, a testing apparatus of wafer integrated circuits according to the prior art.
Figure 2:
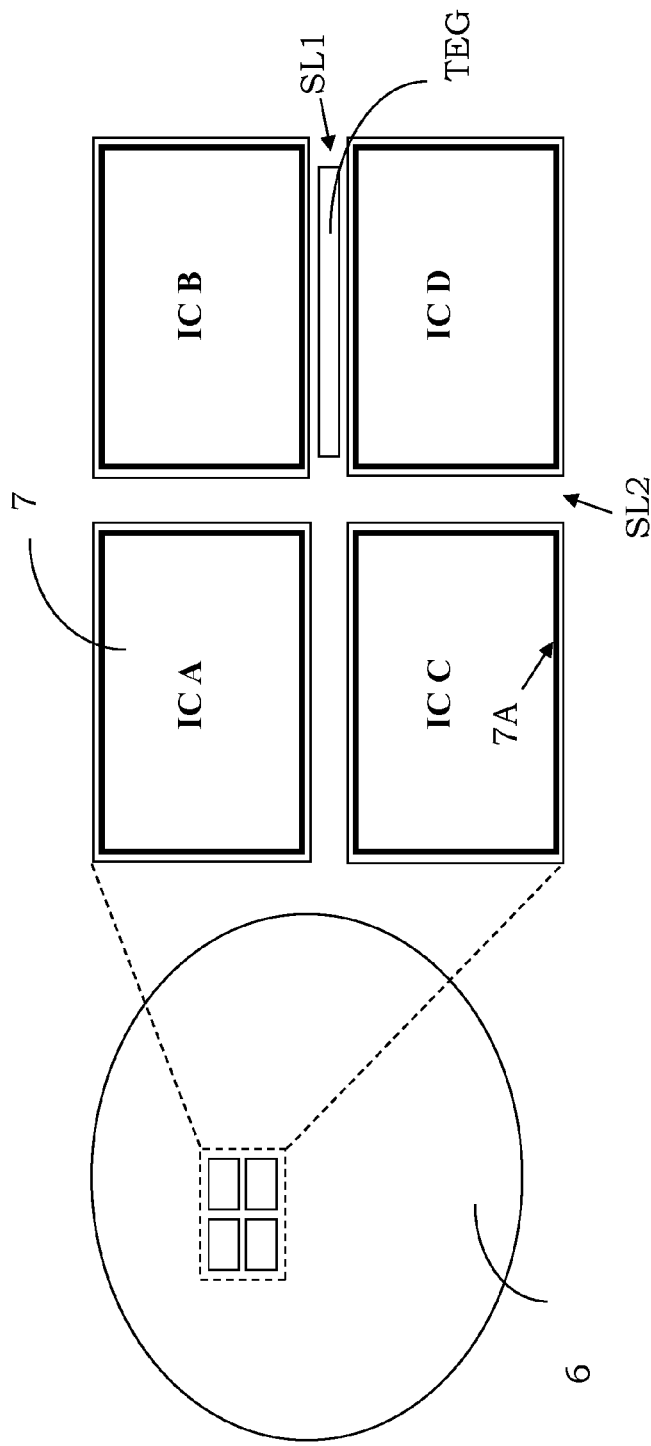
FIG. 2 schematically shows a wafer comprising a plurality of integrated circuits (chips) separated by scribe lines, according to the prior art.
Figure 3:
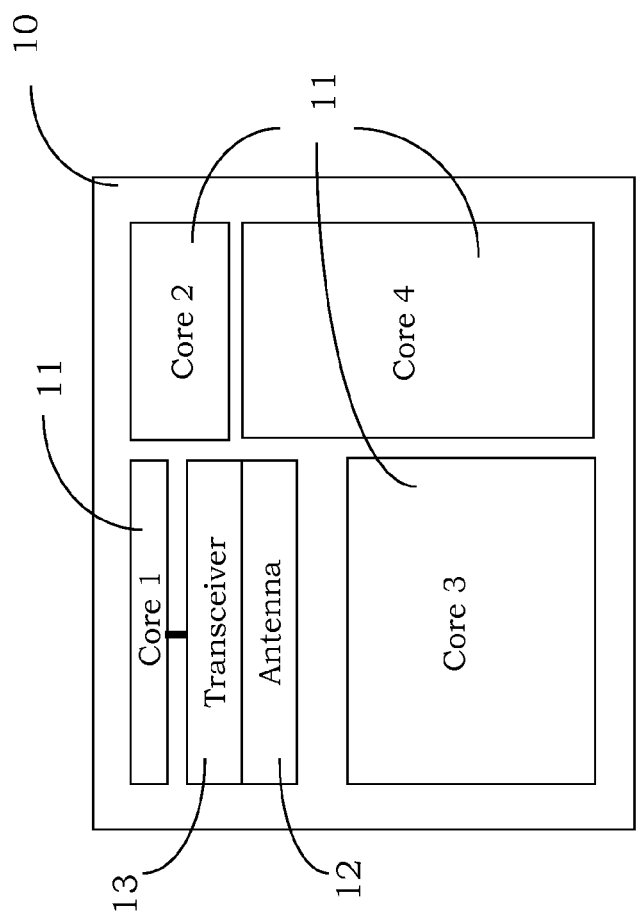
FIG. 3 schematically shows a chip comprising at least one antenna according to the prior art.

With reference to these figures, and in particular to FIGS. 5A and 5B, a wafer of semiconductor material is globally and schematically shown, in particular a portion thereof comprising at least one integrated circuit 20.

It is to be noted that figures are not drawn to scale, but are instead drawn so as to underline the important characteristics of the embodiments. Moreover, in the figures, the different pieces are shown in a schematic way, and their shape may vary according to the desired application.

Furthermore, elements or measures described by way of illustration with reference to an embodiment are not to be intended as limited thereto, the different features, structures and/or elements having the possibility to be indifferently used in combination among the different embodiments described.

The integrated circuit 20 comprises in particular at least one peripheral portion 21 close to a scribe line 22 providing separation between the integrated circuits on the wafer. In its most general form, the integrated circuit 20 comprises at least one conductive structure that extends in its peripheral portion 21 on different planes starting from a substrate 24 of the wafer and realizes an integrated antenna 30 for the circuit.

In particular, in this peripheral portion 21, a plurality of first conductive lines 33 are realized, in particular metallization lines, arranged on different planes starting from the substrate 24 to form the antenna 30 that surrounds the integrated circuit 20 itself.

According to an aspect, the plurality of first conductive lines 33 is flanked by a plurality of second conductive lines 23, so that pairs of first and second conductive lines, 33 and 23, belonging to a same plane, are separated from each other, the planes being substantially parallel to the substrate 24 and developing perpendicularly starting therefrom in a vertical direction, considering the local reference of the figure. In particular, for simplicity of illustration, the terms "horizontal" and "vertical" will be used hereafter in the description for indicating development directions being parallel to the substrate and perpendicular thereto, respectively, these terms not having to be intended in any way as limiting of the invention.

More in particular, second conductive lines 23 belonging to different planes are suitably connected to each other by means of conductive connections 26, for example conductive vias, that develop perpendicularly to these planes, to form a seal ring 25. A portion of the seal ring 25 is schematically shown in FIG. 5A and has a substantially pillar structure, starting from the substrate 24.

In particular, in a first embodiment shown in FIG. 5B, the first conductive lines 33 belonging to each plane form a coil of the integrated antenna 30. A coil is connected to another one by means of conductive connections, for example metallic vias, arranged perpendicularly to the coil itself for connecting conductive lines 33 belonging to different planes.

According to this aspect, the antenna 30 develops then in the vertical direction, starting from the substrate 24 and inside the peripheral portion 21 of the integrated circuit 20 close to the scribe line 22.

It is to be noted that the antenna 30, positioned in correspondence with the peripheral portion 21 of the integrated circuit 20, where the seal ring 25 is already usually realized, does not introduce problems regarding the routing of the internal signals of the integrated circuit 20 itself, a suitable routing configuration being already provided given the presence of the seal ring itself.

Moreover, thanks to its vertical development inside this peripheral portion 21, the antenna 30 has a reduced area, thus overcoming the problems met with different known solutions.

Alternatively, the first and second conductive lines, 33 and 23, may be partitions of a same plurality of conductive lines realized in the peripheral portion 21 of the integrated circuit 20.

It is to be understood that FIG. 5B simply is the section along line BB of FIG. 5A, which is in turn the section along line AA of FIG. 5B.

Figure 6B:
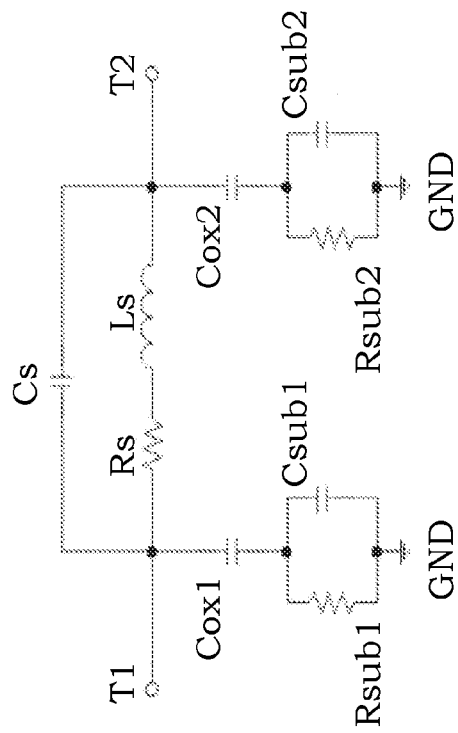
FIGS. 6A and 6B schematically show the first embodiment of the circuit and its electric equivalent, respectively.
Figure 6A:
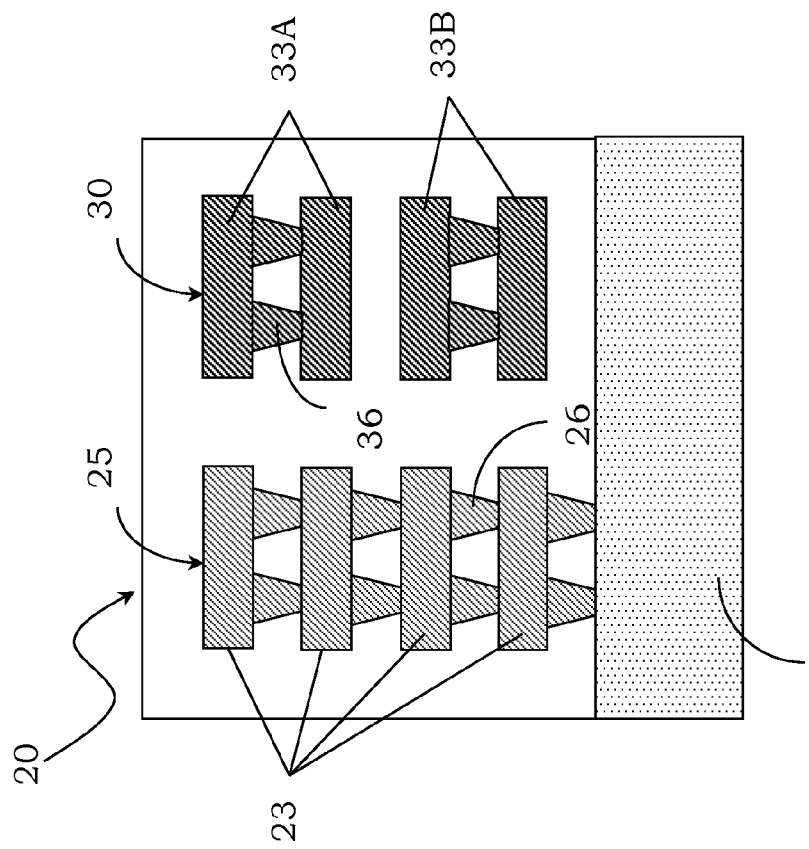

According to another aspect, as shown in FIG. 6A, at least one pair of first conductive lines 33, belonging to different but adjacent planes, considering a development direction perpendicular to the substrate, for example a first pair of lines indicated with 33A in FIG. 6A, are connected to each other by means of conductive connections 36, for example metallic vias. Similarly, other pairs of first conductive lines belonging to different but adjacent planes in the vertical direction, such as a second pair of lines indicated with 33B in FIG. 6A, may be connected to each other in a similar way with respect to the first pair of lines 33A by means of similar conductive connections 36. According to this embodiment, the connection of pairs of lines belonging to different but adjacent planes, i.e. pairs of conductive paths of the antenna 30, reduces their series resistance Rs, as it is clear from the circuit equivalent model of the antenna 30 shown in FIG. 6B, being well known to the skilled in the art. It is to be noted that, by creating an antenna 30 that develops in the vertical direction, the parasite effects of the antenna 30 itself with the substrate 24 are reduced.

The first conductive lines 33 of the antenna 30 are formed by known conductive materials such as for example metal and/or polysilicon or other.

According to an aspect, the seal ring 25 comprises conductive lines realized in a traditional way by means of layers or metallic layers interconnected by vias. In this case it is possible, without using additional layers, to realize also the antenna 30 thanks to the metallic layers of the realization process of the seal ring 25, these metallic layers forming both the first and the second conductive lines, 33 and 23.

According to an aspect of the invention, the seal ring 25 comprises at least part of the conductive lines 23 realized by materials having magnetic features, such as, for example, nickel and cobalt or corresponding alloys.

In an alternative embodiment, shown with reference to FIGS. 7, 8A, 8B and 8C, the seal ring 25 comprises a plurality of single pillar structures 27, for example uniformly distributed in the peripheral portion 21 of the integrated circuit 20, each one being formed by second conductive lines 23 connected by means of vertical conductive connections 26.

According to an aspect, the first conductive lines 33 that form the antenna 30 are suitably sized so as to form serpentines 37 that alternatively surround on the right and left the single pillar structures 27 comprised in the seal ring 25, as shown in the section views of FIGS. 8A, 8B and 8C.

Figure 7:
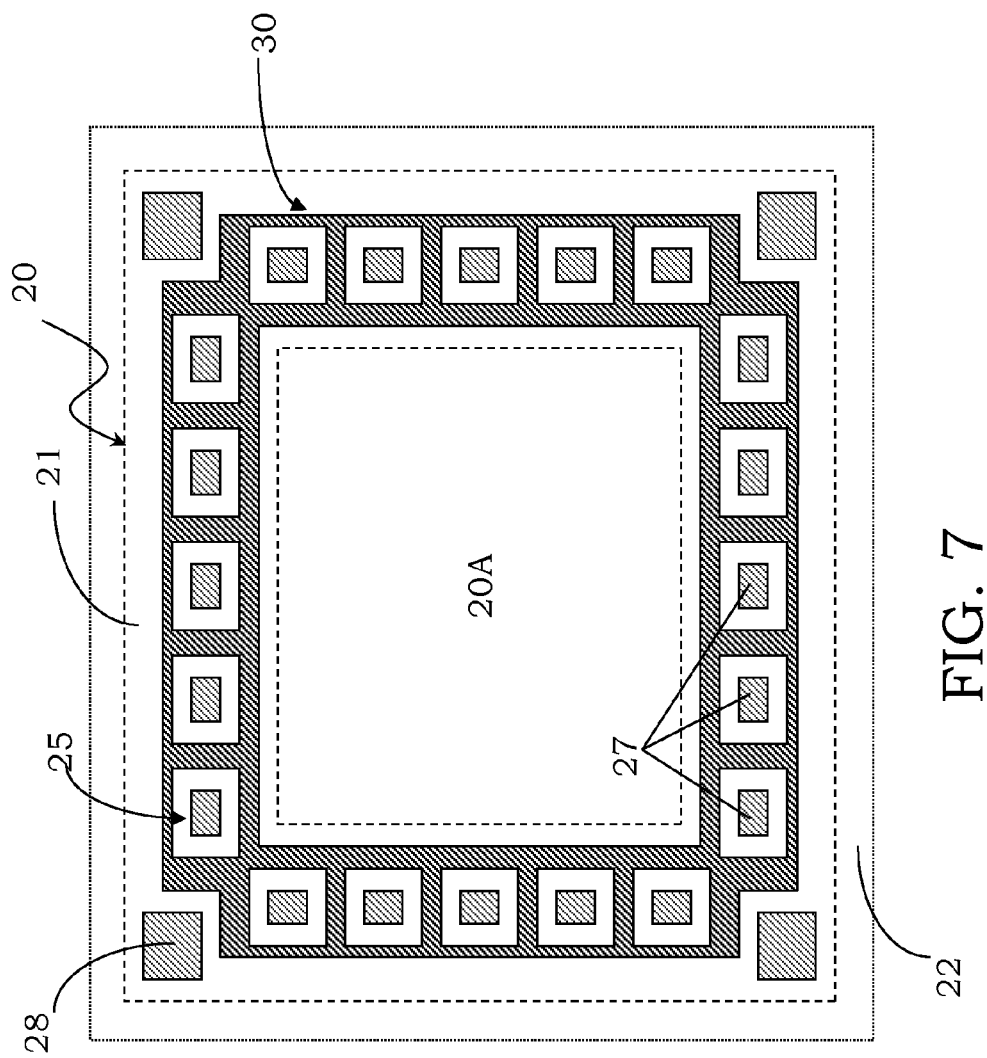

In this way, the first and second conductive lines, 33 and 23, belonging to a same plane, create structures that are similar to the texture and to the warp of fabrics, as schematically shown in the plan view of FIG. 7. In particular, as it may be appreciated in this figure, in the peripheral portion 21 of the integrated circuit 20 that surrounds an active area 20A thereof a kind of ring is realized that comprises the antenna 30 formed by the serpentines 37 that surround the pillar structure 27 of the seal ring 25.

Suitably, reinforced pillar structures 28 of the seal ring 25 are arranged in correspondence with the angles of the peripheral portion 21 of the integrated circuit 20. In particular, these reinforced pillar structures 28 are realized by means of portions of second conductive lines 23 and vertical conductive connections 26 of greater sizes with respect to the corresponding elements being used for realizing the pillar structure 27 of the seal ring 25 arranged inside the serpentines 37 that form the antenna 30.

It is in fact well known that the area in correspondence with the angles of the peripheral portion 21 of the integrated circuit 20 is subjected to the greater mechanical efforts during the cut or singulation of the circuit itself from the wafer it is integrated in.

According to another aspect, each pillar structure 37 may be suitably biased, for example with a connection to a ground reference or to a positive or negative voltage, according to the needs.

It is to be noted how, according to this embodiment just described, the serpentines 37 that form the antenna 30 and that, in an alternated way, pass on the right and then on the left of the pillar structure 27 that forms the seal ring 25 in turn mechanically reinforce the structure of the whole integrated circuit 20.

Moreover, with respect to the case in which the antenna 30 is realized next to the seal ring 25, according to this alternative embodiment, an antenna 30 is obtained that occupies a further reduced area, which has a low impact on the overall size of the integrated circuit 20.

According to a further alternative embodiment, the antenna 30 is formed by first conductive lines 33 shaped in a substantially alveolar form, or chains-like 37'. In particular, as schematically shown in the section views of FIGS. 9A and 9B, the chains 37' that form the antenna 30 surround the pillar structure 27 that forms the seal ring 25. It is clear that this further embodiment, besides occupying a reduced area, further strengthens from the mechanical viewpoint the structure of the whole integrated circuit 20 also with respect to the embodiments previously described.

Figure 10:
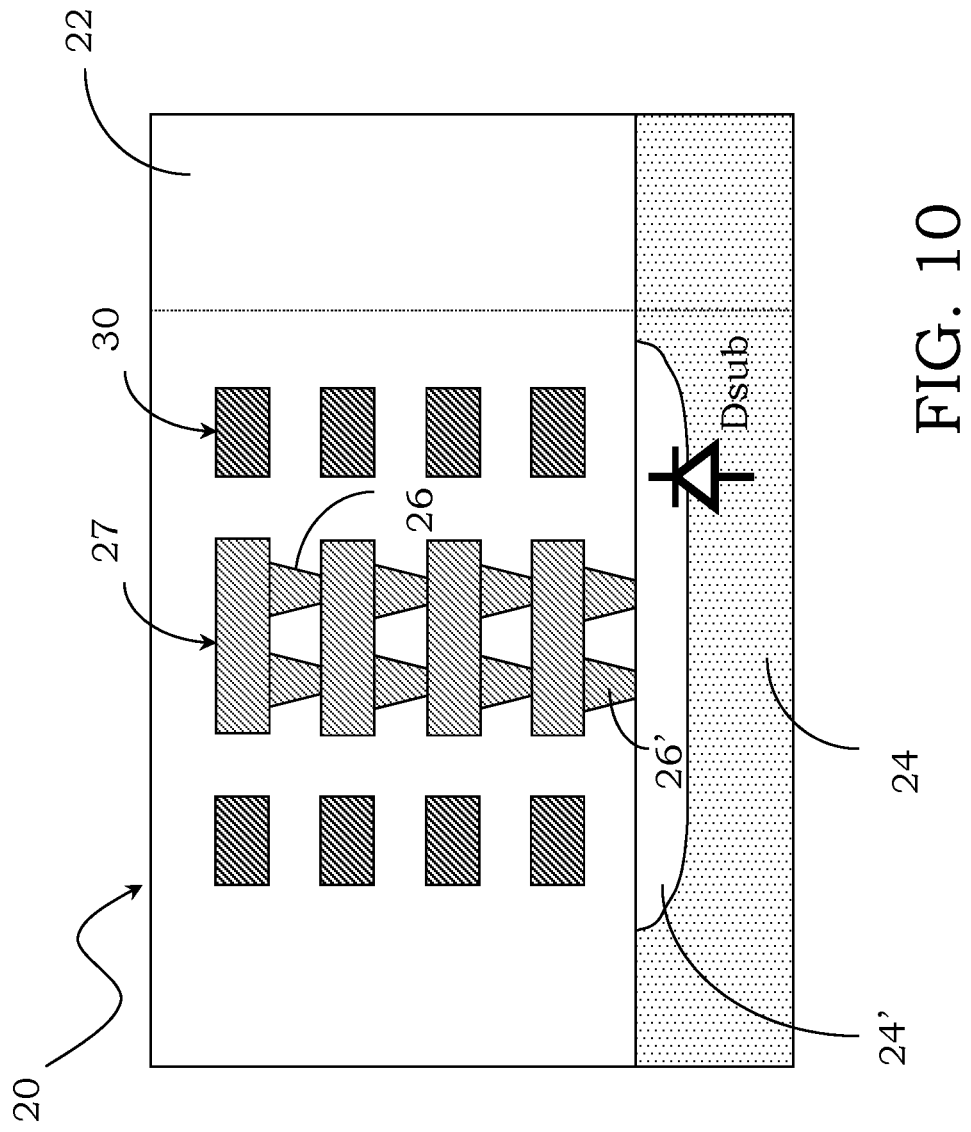

Suitably, for reducing the capacitive coupling of the antenna 30 with the substrate 24, it is possible to realize therein, in correspondence with the seal ring 25 and with the antenna 30, an inversely biased junction PN, able to reduce the capacity of junction towards the substrate 24. In particular, as schematically shown in FIG. 10, a well 24' is realized in the substrate 24 in correspondence with the seal ring 25 and with the antenna 30. More in particular, the well 24' is placed directly below the seal ring 25 and in contact with its vertical conductive connections 26' contacting the substrate 24 and extends also in correspondence with the antenna 30. This well 24' is doped in a complementary way with respect to the substrate 24 so as to form an inversely biased junction PN, indicated with Dsub in the figure. In the case, for example, of a substrate 24 of the P type, the well 24' will be suitably of the N type and obviously in the case of a substrate 24 of the N type, the well 24' will be of the P type.

Although in FIG. 10 a seal ring 25 and an antenna 30 according to the embodiment shown in FIG. 9A are represented, it is obviously possible to realize a junction Dsub formed by the well 24' and by the substrate 24 also in the case of the other embodiments, as described previously and hereafter.

As already described in relation to the prior art, when an inductive antenna realized on a more or less conductive substrate is invested by or produces a magnetic field H, the so called eddy currents are generated in the substrate itself, these currents disadvantageously opposing against the variation of the flow of the magnetic field itself, and whose effect reduces the performance of the antenna itself.

It is also known that the effect of these eddy currents is greater inside the antenna, since the force lines of the magnetic field H mostly concentrate there. The eddy currents also concentrate in a surface area of the substrate whereon the antenna is realized and their value decreases exponentially for the so called skin effect along the direction of penetration inside the same substrate.

It is also known that the effect of these eddy currents is emphasized in the seal ring realized exactly in the classic mode since it offers an electric resistance that is orders of magnitude lower than that of the substrate.

It is to be understood that the realization of the seal ring 25 by means of one or more pillar structures reduces the effect of these eddy currents, substantially thanks to the partition of the second conductive lines 23.

According to an aspect, as schematically shown in FIGS. 11A and 11B, for further reducing the eddy currents caused by a magnetic field H that invests or is produced by the antenna 30, in particular in the surface area of the substrate 24, the integrated circuit 20 is provided with suitably doped areas 31 similar to doped fingers realized in the substrate 24 so as to extend in part inside and in part outside the integrated circuit 20 itself, substantially across its peripheral portion 21 where the antenna 30 is realized. In this way, these suitably doped areas 31 form a junction PN that hinders the circulation of the eddy currents, indicated with Iec, lengthening the flowing path of these currents Iec, dot-lined in FIG. 11A.

In particular, in the case in which under the antenna 30 and in the substrate 24, for example of the P type, the well 24' is realized, for example of the N type, for hindering the eddy currents Iec, it is necessary to interrupt exactly the well 24' at least in a section or portion thereof in correspondence with and underlying the same antenna 30, this interruption being realized avoiding to create exactly the well 24' in this section or portion, creating interruptions indicated with 32 in the figure.

It is also possible that the interruption 32 has been created by using a trench under the antenna 30 and in the substrate 24, in particular the trench may be filled in with insulating material, such as oxide, realized still across the peripheral portion 21 where the antenna 30 is formed for interrupting the well 24' and hindering the circulation of the eddy currents Iec. Also other microelectronic structures present on the surface of the substrate 24 may hinder at least in part the eddy currents Iec.

Figures 12A, 12B:
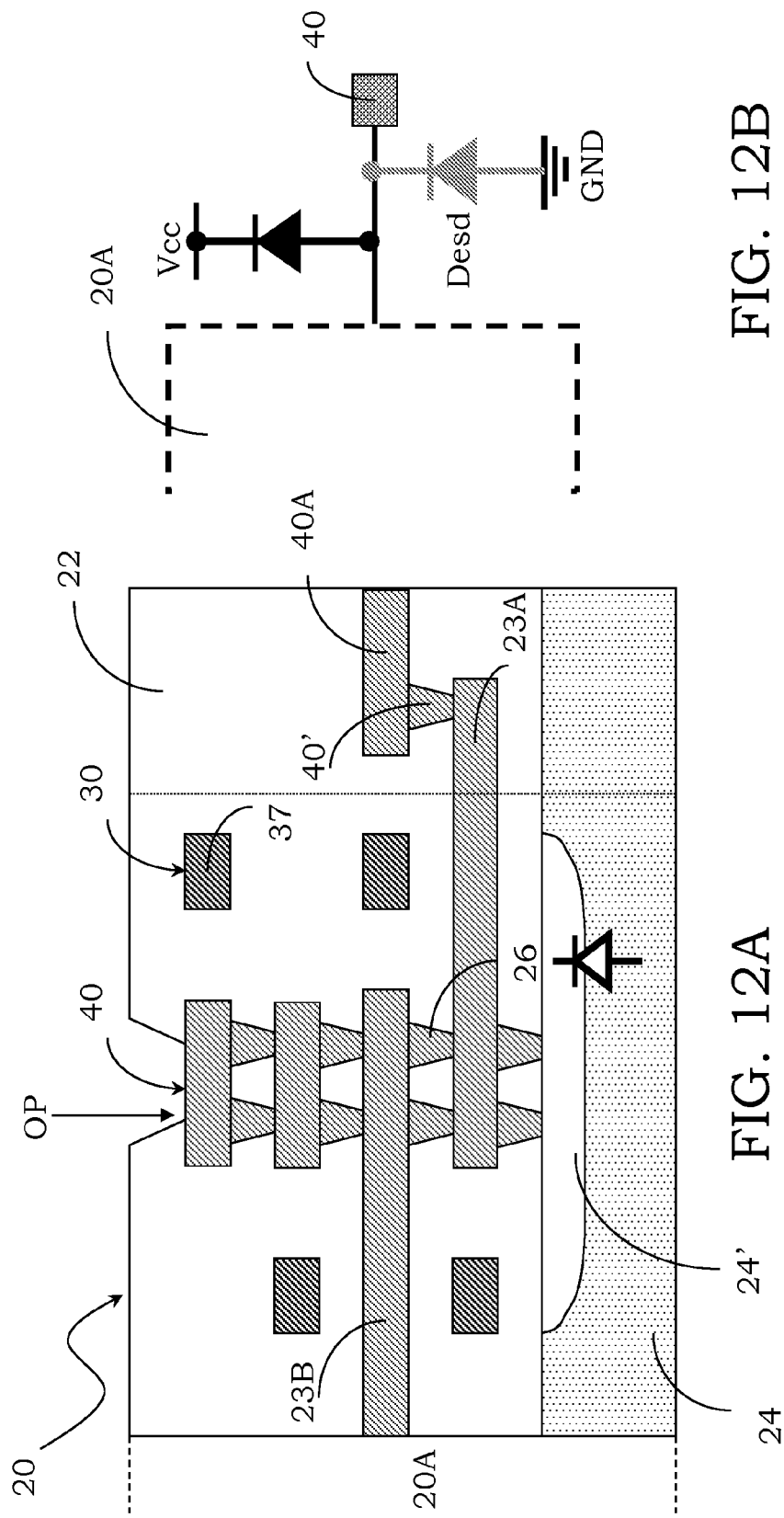

In an alternative embodiment, at least one pillar structure of the seal ring 25 may be used for realizing a contact terminal or pad 40, an opening OP being realized in correspondence with it, as schematically shown in FIG. 12A.

The pad 40 thus obtained may be used as contact terminal for the integrated circuit 20 and/or for possible structures TEG being in the scribe line 22, also realizing a common pad of the integrated circuit 20 and these structures TEG.

The pillar structure that realizes the pad 40 comprises in this case at least one conductive line 23A that extends up to the scribe line 22 and/or at least one conductive line 23B that extends up to the active area 20A of the integrated circuit 20.

It is in this way possible to realize at least one part of the pad of the integrated circuit 20 (part of the so called pad ring) close to the scribe line 22, in correspondence exactly with the seal ring 25, now suitably partitioned.

In this respect, it is suitable to underline how the pads the integrated circuits 20 are usually provided which have, in general, sizes and in particular width greater than a corresponding size of the traditional seal ring 25. More in particular, against a seal ring 25 of width normally equal for example to 10 μm, the pads usually have length equal for example to at least 50 μm. The realization of part of the pads of the integrated circuit 20 in the peripheral portion 21 where the seal ring 25 is already realized however reduces the area globally occupied by the integrated circuit 20 on the wafer, with an evident economic advantage.

Alternatively, by realizing at least one part of the pads of the structures TEG in the peripheral portion 21 where the seal ring 25 is realized thanks to metallization lines 40A that are connected to the structures TEG and, by means of suitable conductive connections 40', to the conductive line 23A of the pads 40, it is possible to actually reduce the size of the scribe line 22 and in consequence the problems linked to the sawing of the wafer during the assembling step, these problems being in part caused exactly by the presence of the pad of the structures TEG in the scribe line 22, where the saw that executes the partition or singulation of the integrated circuits or chips is to be activated.

In this case, the structures TEG are suitably connected to the pad 40 realized in the peripheral portion 21 of the integrated circuit 20 where the seal ring 25 is realized by means of measures placed near the pillar structure that forms this pad 40, so that the (lateral) mechanical effort during the action of the sawing does not damage the pad itself.

In particular, it is possible to connect the structures TEG to the pad 40 by simply interrupting the metallization line 40A with at least one conductive via that realizes a conductive connection 40' and makes the connection of the structure TEG to the pad 40 more fragile. In this way, the sawing action in the scribe line 22 damages the conductive path exactly in correspondence with the via of connection 40' to the metallization line 40A, in turn connected to the structures TEG, avoiding instead the damage of the pillar structure that realizes the pad 40.

Moreover, according to an aspect, a junction PN realized in the substrate 24 thanks to a well 24' of opposed doping with respect to the substrate 24 itself, as previously described, is used for reducing the capacitive coupling of the antenna 30 with the substrate itself. In an alternative embodiment, this junction PN is suitably divided into more parts, one of which is used for realizing a diode of protection against the electrostatic discharges or ESD (acronym from the English: "ElectroStatic Discharges") of the pad 40, as schematically shown in FIG. 12B, this protection diode ESD being indicated as Desd.

According to another aspect, it is possible to use different conductive lines 33 for realizing more than one antenna, for example obtaining a transformer 38, as schematically shown in FIGS. 13A and 13B.

In particular, in these figures, a first antenna 37A is realized by first conductive lines 33 arranged on different but adjacent planes and suitably connected to each other to realize a first coil. Similarly, a second antenna 37B is realized by first conductive lines 33 arranged on different but adjacent planes and suitably connected to each other to realize a second coil.

It is also possible to realize the first and second antennas, 37A and 37B, of the transformer 38 by using more conductive lines 33 belonging to different but adjacent planes and suitably connected to each other, as schematically indicated in FIG. 13B, the first and second antennas, 37A and 37B, of the transformer 38 comprising in this case, by way of illustration, a pair of conductive lines 33.

It is obviously possible to divide the first conductive lines 33 that realize the antenna 30 into more parts, obtaining coplanar coils that may be connected to each other in different modes. It is also possible to realize the antenna 30 by means of more conductive lines flanked on a same plane, creating conductive paths that may be connected to each other in series or in parallel, also with respect to the overhanging and underlying planes.

In this way, it is possible, for example, to increase the number of the coils comprised in the antenna 30 or to realize more different antennas. In the case of realization of resonant antennas, they will also have the possibility to be made resound at the same frequency or at different frequencies. Moreover, it is possible to provide the presence of at least one antenna inside the integrated circuit 20 and in particular of its active area 20A.

Obviously, the different antennas realized by the conductive lines 33 may have a different shape with respect to one another, the shape having not to be considered, in no way, as limitative of the invention. In a similar way, also the shape of the pillar structure 27 that forms the seal ring 25 is supplied by way of indication and is not to be considered as limitative of the invention.

FIGS. 14A, 14B, 15A, 15B, 16A, 16B, 16C, 17, 18 and 19 show different geometric shapes relative to the antenna 30 and to the seal ring 25 realized according to the invention.

Figure 14B:
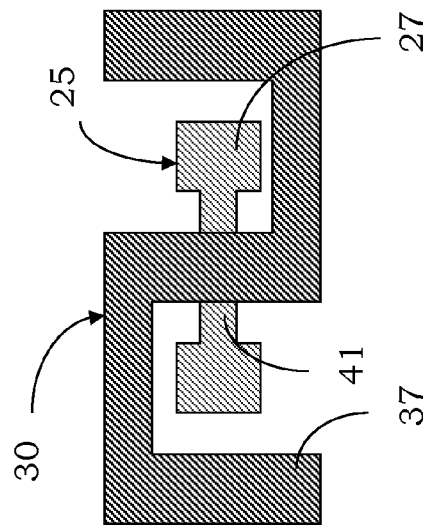
Figure 14A:
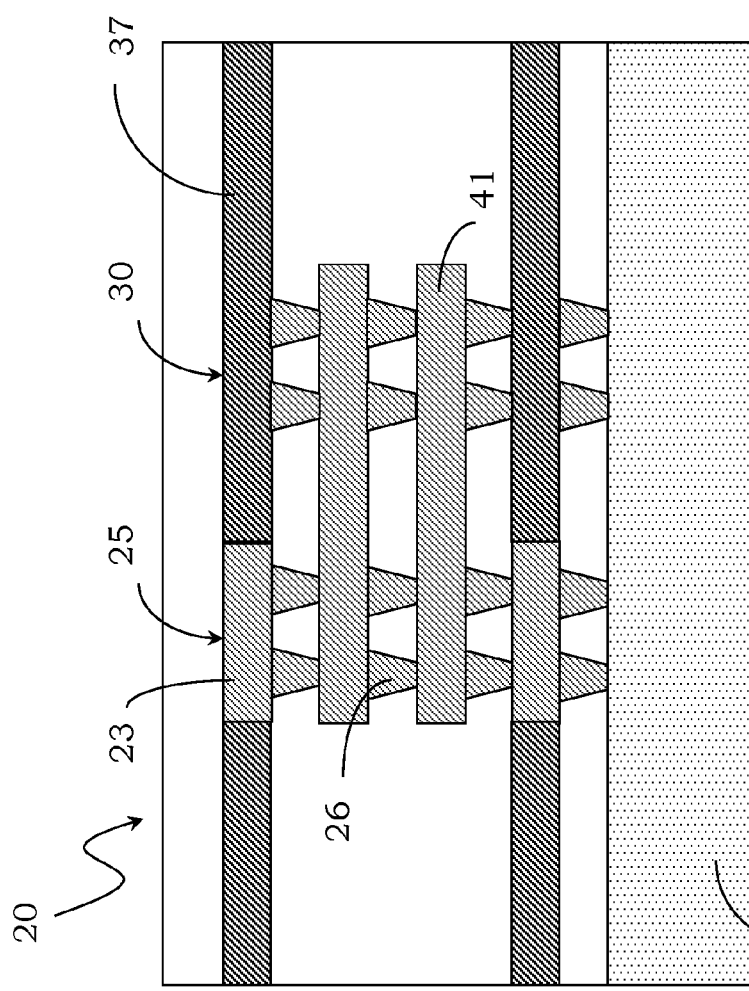

According to an aspect, two pillar structures 27 may be connected by means of at least one intermediate conductive line 41A, as shown in FIGS. 14A and 14B. This intermediate conductive line 41 is connected to the other conductive lines 23 that form the pillar structure 27 always by means of vertical conductive connections 26. In the example shown in these figures, the antenna 30 is formed by means of serpentines 37 that curl alternatively on the right and on the left of the pillar structure 27 and the seal ring 25 comprises two intermediate conductive lines 41 arranged between serpentines 37 realized in different planes. Obviously, these intermediate conductive lines 41 (and the relative vertical conductive connections 26) contribute to mechanically strengthening the structure of the seal ring 25 as a whole.

It is to be understood how, in changing the geometries of the seal ring 25 and of the antenna 30, and in particular of the conductive lines 23 and 33 composing them, particular attention should be paid not to create closed circular paths, to avoid the arising of the eddy currents, as previously explained.

According to another aspect, the seal ring 25 comprises a conductive line realized above the pillar structure 27 and having greater sizes with respect to the remaining second conductive lines 23 that realize this pillar structure 27, as schematically shown in FIGS. 15A and 15B. In particular, the upper conductive line 42, that ensures the mechanical strengthening of the pillar structure 27 as a whole, may be in this case used for realizing a pad 40, crossed by at least one part of the antenna 30, as shown in FIG. 15B. Also in this case, an opening OP should be realized in correspondence with the pillar structure 27 for letting the upper conductive line 42 surface and thus realize the pad 40.

Figure 16C:
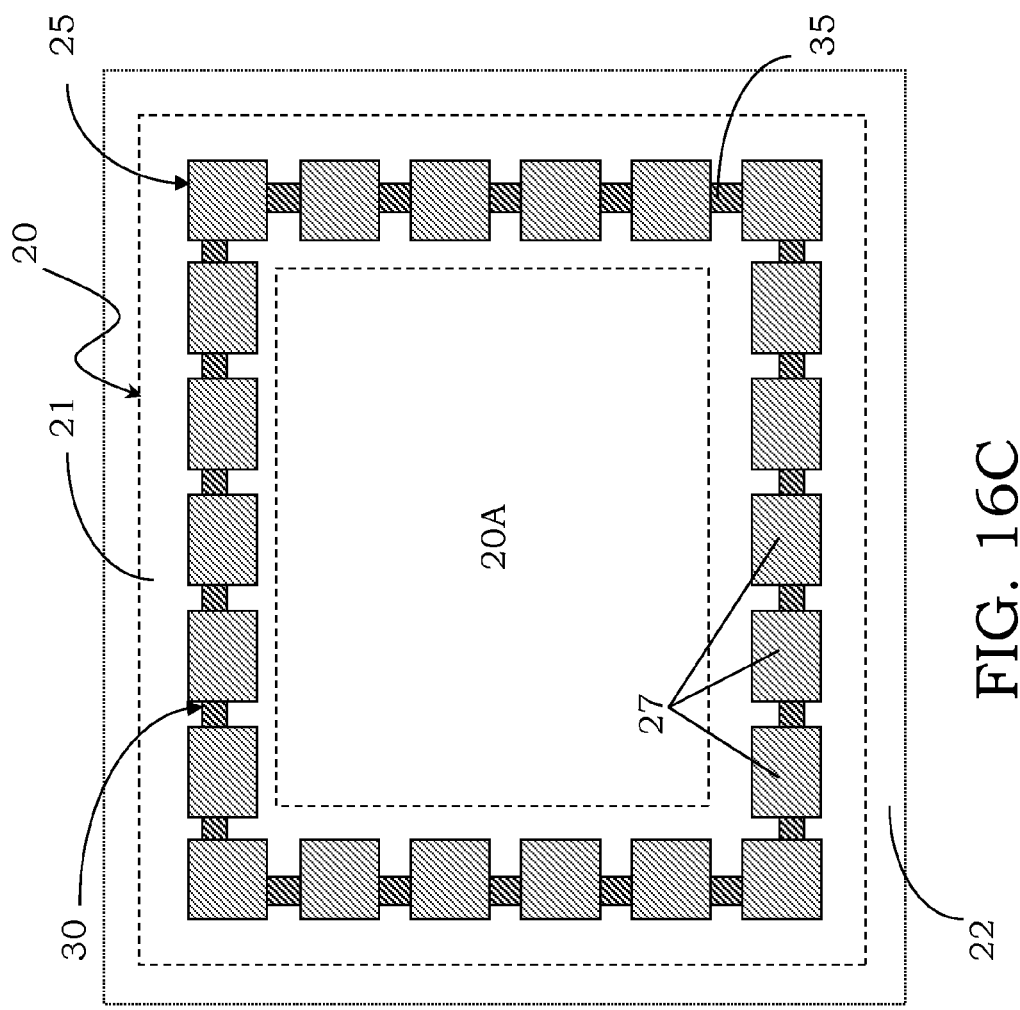

According to another aspect, the antenna 30 comprises linear elements 35, as schematically shown in FIGS. 16A, 16B and 16C, in the case in which at least one pillar structure 27 of the seal ring 25 comprises an upper conductive line 42 suitable for realizing a pad. In this case, the linear element 35 of the antenna crosses by pillar structures 27 of the seal ring 25, in particular below the upper conductive lines 42 of those structures 27 that realize the pad 40.

Figure 17:
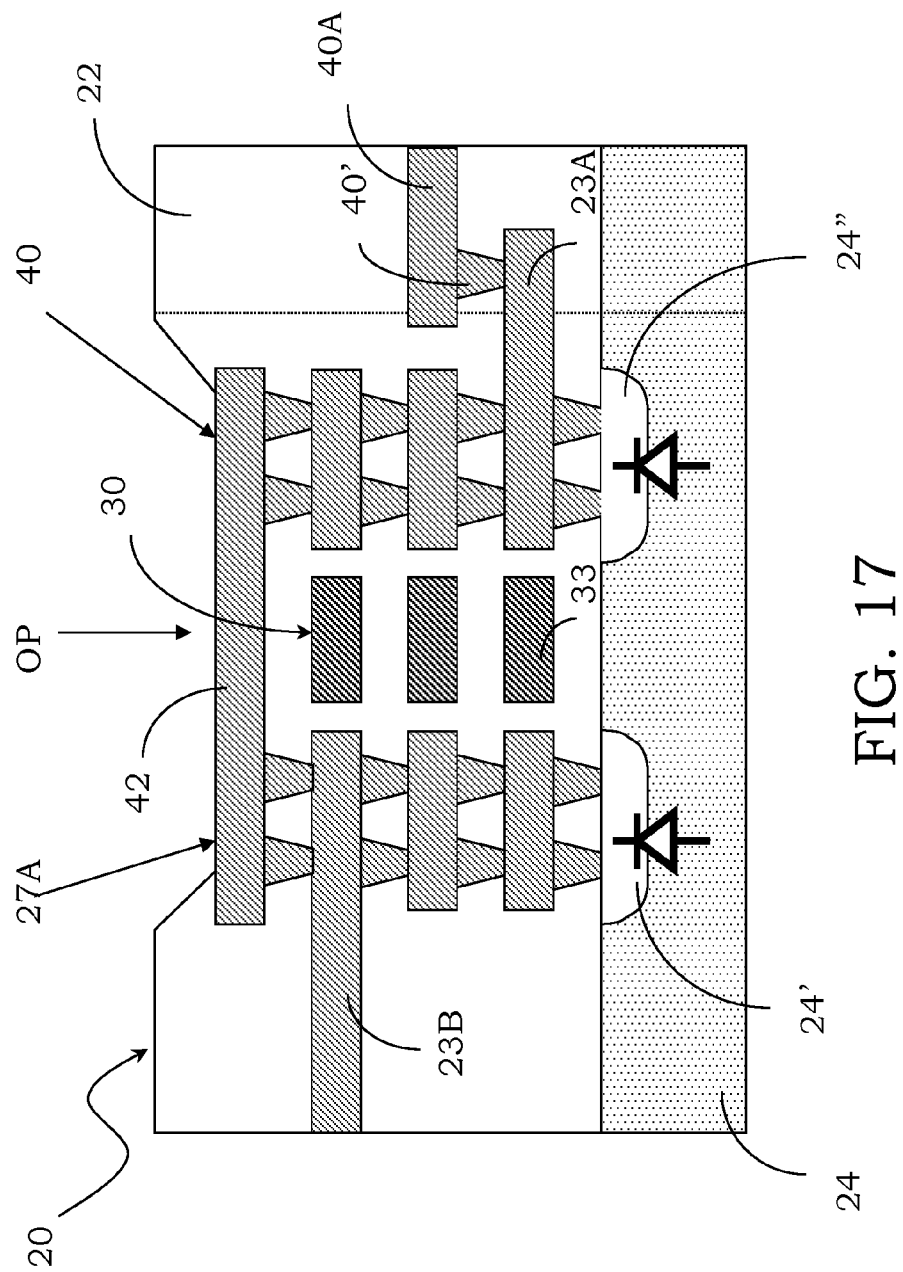

Also in this case, suitable measures, like the provision of inversely biased junctions PN, should be taken for avoiding that parasite currents are formed due to the magnetic field in the pillar structure 27 of the seal ring 25, as schematically shown in FIG. 17. In particular, suitable wells 24' and 24" are provided in the substrate 24 in correspondence with the pillar structures 27 of the seal ring 25, these pillar structures 27 being connected to each other by means of an upper conductive line 42 to realize a pad 40. Moreover, as previously seen, the pads 40 realized by the pillar structures 27 provided with an upper conductive line 42 may be used for the integrated circuit 20 and/or for possible structures TEG being in the scribe line 22.

Figure 18:
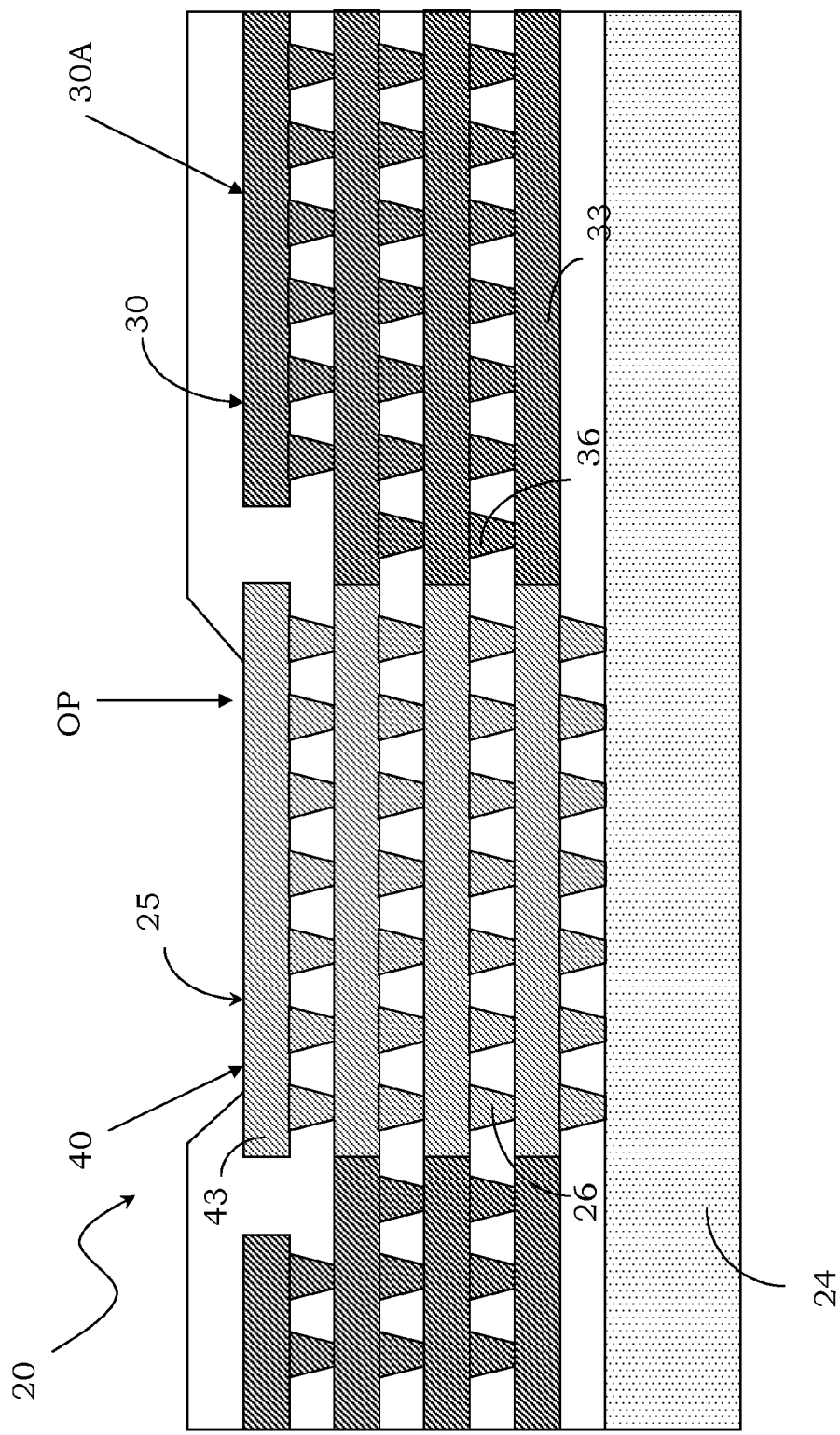

According to another embodiment, the antenna 30 is realized in a so called loop formed by a single coil 30A realized by the conductive lines 33 of all the planes interconnected to each other by conductive connections 36, in a substantially wall-like structure, as schematically shown in FIG. 18. It is to be understood how the connection between the conductive lines 33 that realize the antenna 30 strengthens its structure as a whole. In the case shown in the figure, also the conductive lines 23 that form the pillar structures 27 of the seal ring 25 are all interconnected to each other on the different planes by respective conductive connections 26. In particular, in the case shown in the figure, at least one pillar structure 27 is provided with an upper conductive line 42 emerging through an opening OP to realize a pad 40, in turn particularly strong thanks to the interconnections of the second conductive lines 23 of the pillar structure 27 that realizes it.

The single pillar structures 27 as well as the pads 40 formed thereby may comprise materials having magnetic features. In particular, the upper conductive line 42 of the pad 40 will be advantageously realized by using materials having conductive and magnetic features, such as for example nickel or cobalt or corresponding alloys, which will have high hardness for further and mechanically reinforcing the seal ring 25.

Figure 19:
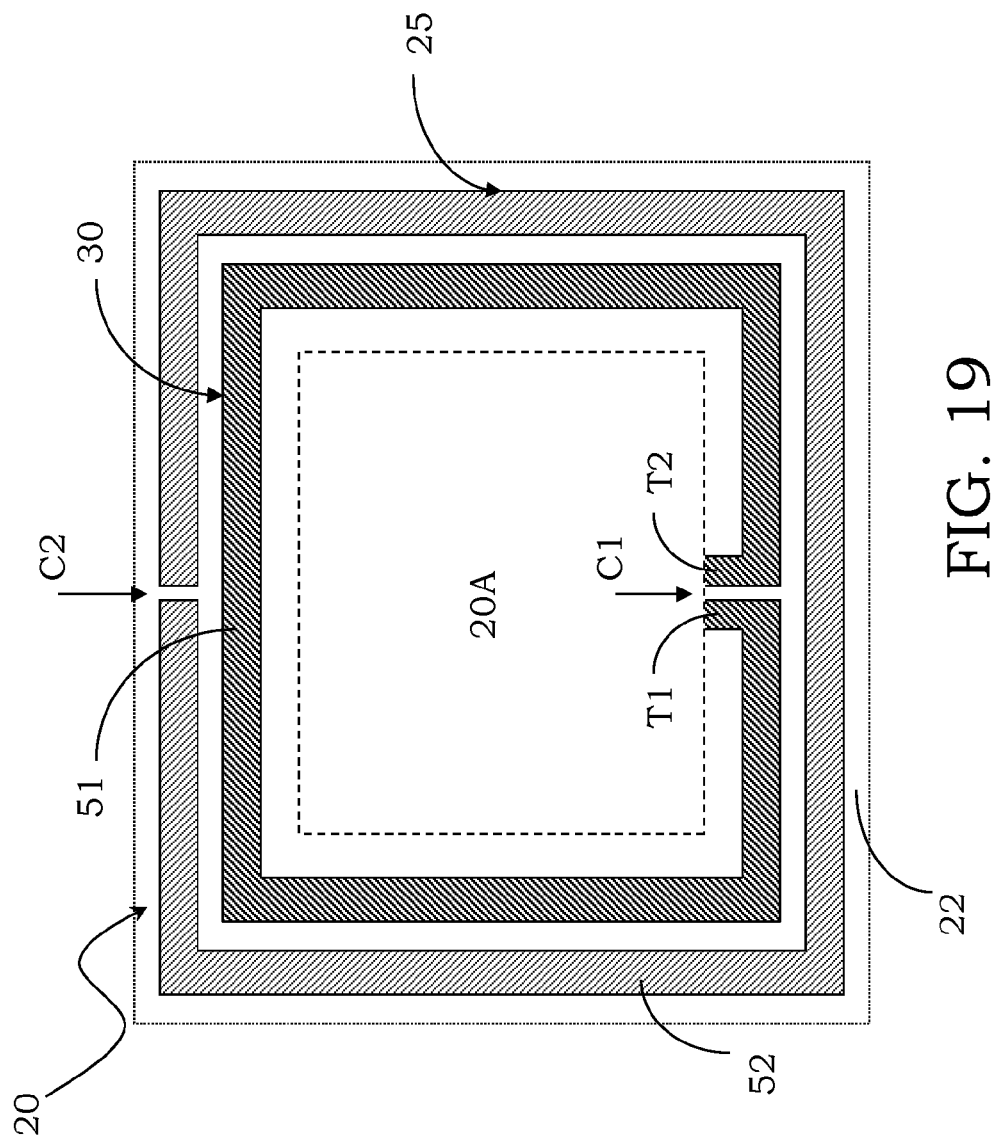
FIG. 19 schematically shows a second embodiment of the circuit.

A second embodiment is schematically shown with reference to FIG. 19.

In particular, the integrated circuit 20 comprises at least one first plurality of conductive lines 51 that surround its active area 20A in its peripheral portion 21 in correspondence with the scribe line 22 and realize the antenna 30, as well as a second plurality of conductive lines 52, still realized in its peripheral portion 21 so as to surround its active area 20A to form the seal ring 25. Also in this case, as seen for the previous embodiment, the conductive lines belonging to different planes are suitably connected by means of conductive connections, the seal ring 25 and the antenna 30 having a vertical development in the scribe line 22 starting from the substrate 24 of the integrated circuit 20 itself, as previously seen.

More in particular, the first plurality of conductive lines 51 is interrupted in correspondence with a first cutting area, indicated with C1 in the figure, each conductive line 51 arranged in a plane thus forming a coil of the antenna 30. Terminal portions of the conductive lines 51 in correspondence with the first cutting area C1 realize the terminals (feed), T1 and T2, of the antenna 30. In the example shown in FIG. 19, the first plurality of conductive lines 51 is arranged internally with respect to the second plurality of conductive lines 52, substantially near an active area 20A of the integrated circuit 20.

Suitably, also the second plurality of conductive lines 52 is interrupted in correspondence with a second cutting area, indicated with C2 in the figure.

According to an aspect, the second cutting area C2 of the second plurality of conductive lines 52 is in an opposite position with respect to the first cutting area C1 of the first plurality of conductive lines 51, and in particular of the terminals T1 and T2 of the antenna 30. In this way, it is possible to solve the problems of parasite coupling of the seal ring 25 arranged outside the antenna 30, avoiding at the same time that polluting substances could penetrate into the integrated circuit 20 at the or after the cutting or singulation of the same from the wafer in which it is realized.

According to alternative embodiments shown in FIGS. 20 and 21, the integrated circuit 20 comprises at least one further plurality of conductive lines 53 interrupted in correspondence with a further cutting area, indicated with C3 in the figure, to form a further seal ring 25'. Also the conductive lines 53 belonging to different planes are suitably connected by means of conductive connections, the further seal ring 25' having a vertical development in the scribe line 22 starting from the substrate 24 of the integrated circuit 20 itself.

In particular, as shown in FIG. 20, the further seal ring 25' may be placed inside the first plurality of conductive lines 51 that form the antenna 30, the cutting area C3 of the further plurality of conductive lines 53 being positioned in correspondence with the first cutting area C1 of the first plurality of conductive lines 51 for allowing the passage of the terminals T1 and T2 of the antenna 30.

Alternatively, as shown in FIG. 21, the further seal ring 25' may be positioned between the antenna 30 and the seal ring 25. The seal ring 25 is in particular indicated as external and the further seal ring 25' as internal.

In this case, according to an aspect, the further cutting area C3 of the further plurality of conductive lines 53 that form the internal seal ring 25' is placed so as not to be aligned to the second cutting area C2 of the second plurality of conductive lines 52 that form the external seal ring 25.

It is to be understood the fact that, even if suitably interrupted in the cutting areas C1 and C3, the internal and external seal ring, 25 and 25', however maintain a good mechanical resistance, the nonaligned positioning of the interruptions in correspondence with these cutting areas hindering moreover the infiltration of polluting substances.

Furthermore, with a suitable sizing of the conductive lines that form them, it is possible to realize an overall seal ring and antenna structure with space that may be compared to that of the seal rings realized according to the prior art.

Figure 22B:
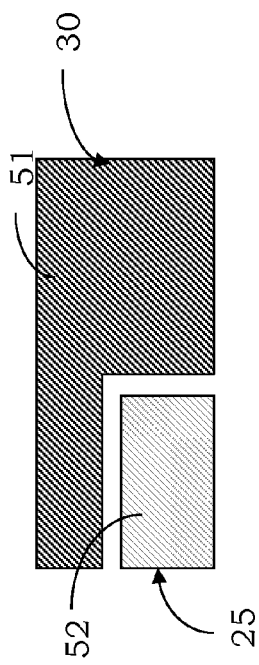
FIGS. 22A, 22B, 22C, 22D, 23A, 23B, 23C, 24A, 24B, 24C and 24D schematically show further implementations of the second embodiments.
Figure 22C:
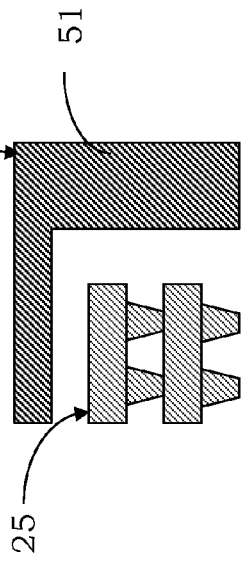
Figure 22D:
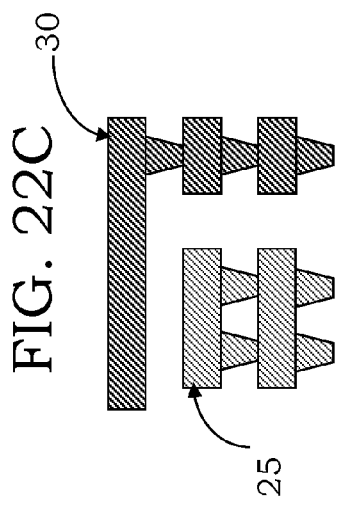
Figure 22A:
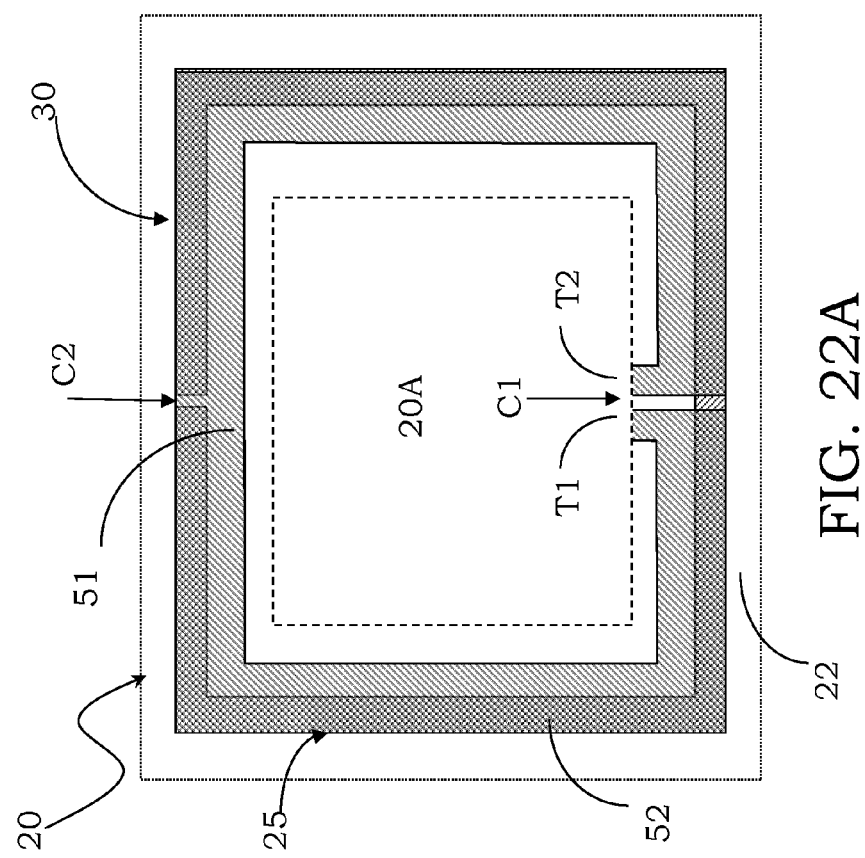
Figures 23A, 23B, 23C:
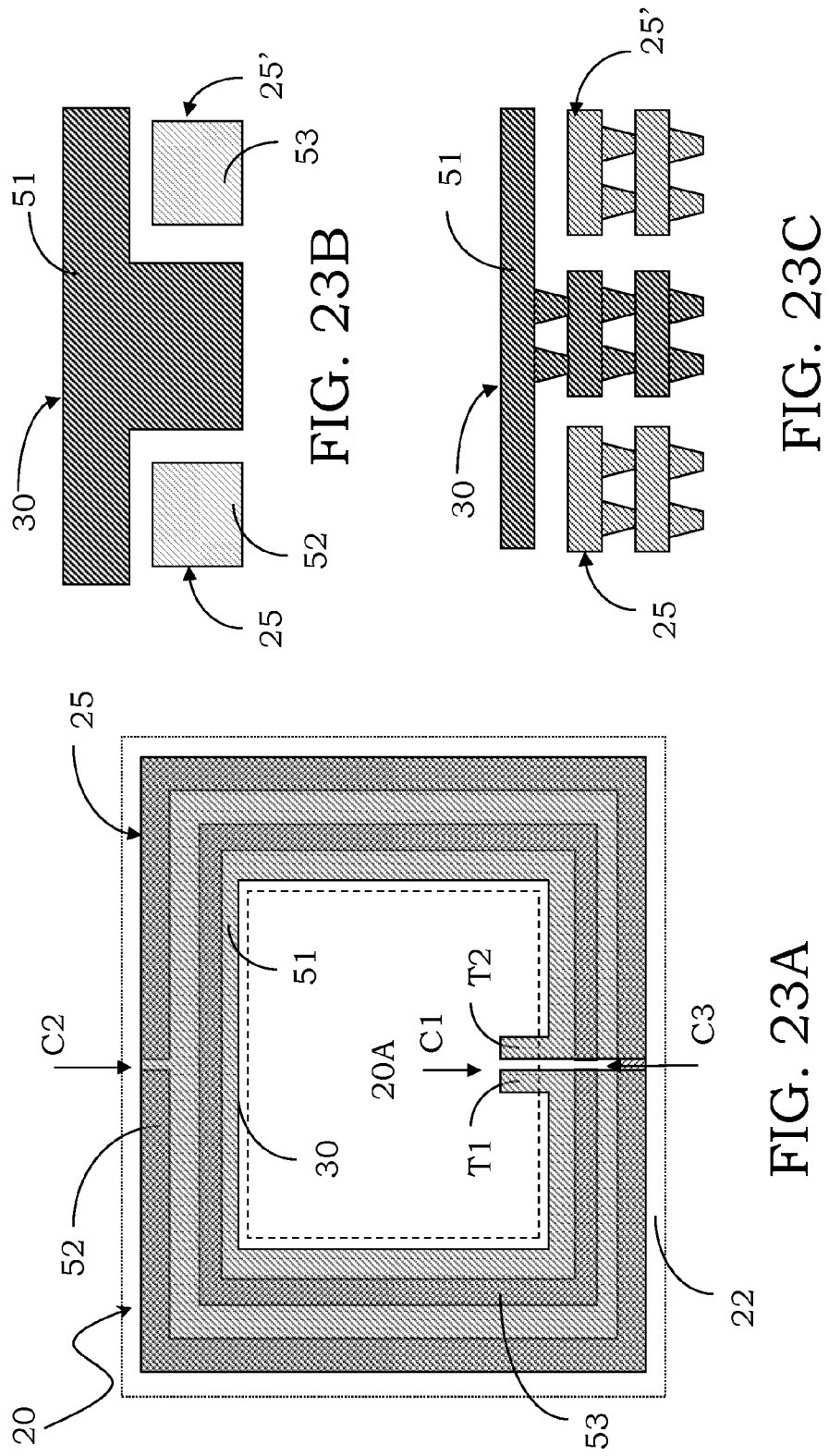
Figure 24B:
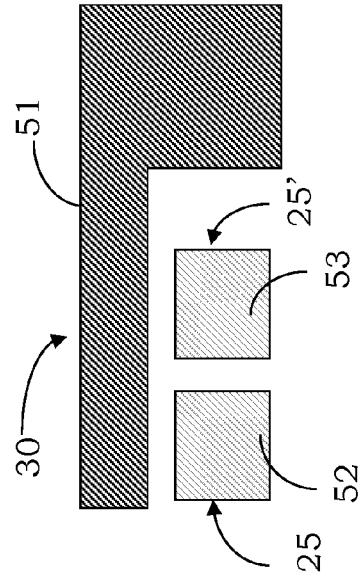
Figure 24D:
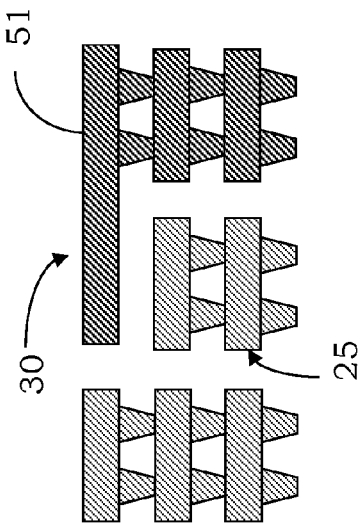
Figure 24A:
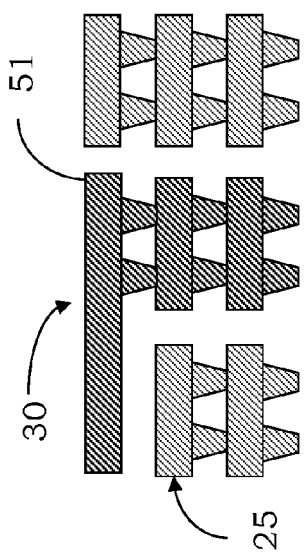
Figure 24C:
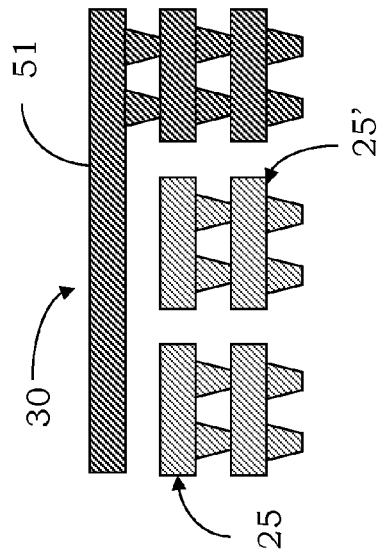

According to an alternative embodiment, the first plurality of conductive lines 51 that form the antenna 30 are in this case substantially L and/or T-shaped and overhang at least in part the second plurality of conductive lines 52 that form the seal ring 25, as schematically shown in FIGS. 22A and 22B. Moreover, the seal ring 25 and/or the antenna 30 may comprise structures realized by means of suitable vertical conductive connections between the respective pluralities of conductive lines, 52 and 51, as schematically shown in FIGS. 22C and 22D. In FIG. 22A the conductive lines 51 of the first plurality are internal and the conductive lines 52 of the second plurality are external, also the opposed situation with the conductive lines 51 external and the conductive lines 52 internal being obviously possible.

According to further embodiments, the antenna 30 may be realized so as to overhang at least in part the second plurality of conductive lines 52 that form the seal ring 25 and/or the further plurality of conductive lines 53 that form the further seal ring 25', possibly comprising respective structures realized by means of suitable vertical conductive connections between the respective plurality of conductive lines 51, 52 and 53, as schematically shown in FIGS. 23A-23C and 24A-24D.

It is to be understood how these alternative embodiments allow to reduce the space of the antenna 30 and consequently the silicon area used and that the structures described may be realized by using a standard process flow for the integration of circuits on wafer.

Besides the advantages already understood in terms of area occupation, the alternative embodiments just described allow to reduce the series resistance Rs of the antenna 30 with a consequent increase of its quality factor Q.

According to an aspect, an accurate identification of the overlapping areas between the antenna 30 and seal ring 25 and/or 25' allows to determine with a high accuracy degree the parasite capacities of these elements towards the substrate 24 whereon the integrated circuit 20, that comprises them, is realized.

Figure 25:
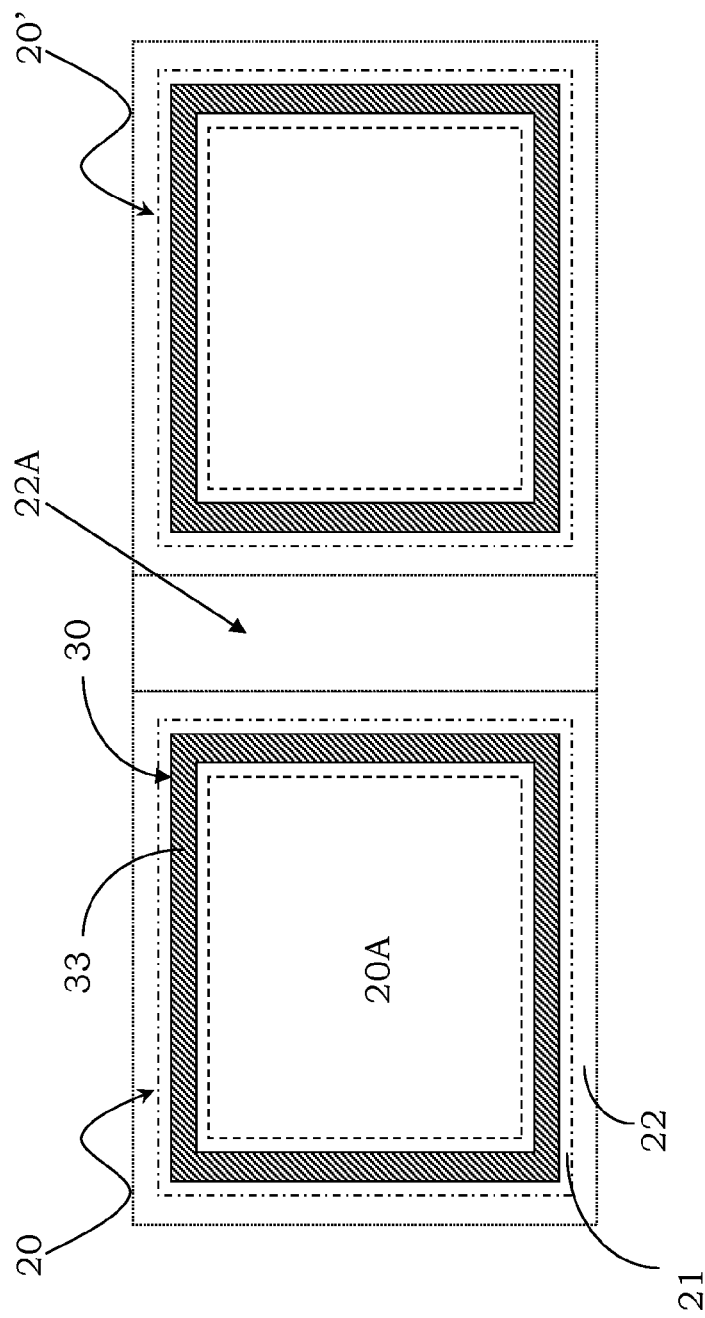
FIG. 25 schematically shows a third embodiment of the circuit.

In a third embodiment, shown schematically in FIG. 25, in the peripheral portion 21 of the integrated circuit 20 adjacent to the scribe line 22 at least one conductive line 33 is realized, that forms the antenna 30. According to this embodiment, a trench structure 60 is suitably realized in a central portion 22A of the scribe line 22 that separates a first and a second integrated circuit 20 and 20', as schematically shown in FIG. 26A. In this case, as it will be better clarified hereafter in the description, the integrated circuit 20 does not comprise any seal ring.

In fact, the trench structure 60 is realized so as to penetrate at least into the depth of the substrate 24, creating a housing area of the cutting tools for the singulation of the integrated circuits 20, this singulation interesting only the substrate 24 and thus not requesting the presence of a seal ring to protect the integrated circuit 20. Moreover, the singulation operation does not risk in this way to damage the antenna 30.

This trench structure 60 may be obtained by simply avoiding to deposit material at least in the central portion 22A of the scribe line 22. Alternatively, when during the process of manufacturing of the integrated circuit 20 oxides, dielectrics or insulating materials are deposited in the scribe line 22, it is possible to realize the trench structure 60 by means of a suitable masking and etching process for removing the greater part of the material present in the scribe line 22.

Figure 26B:
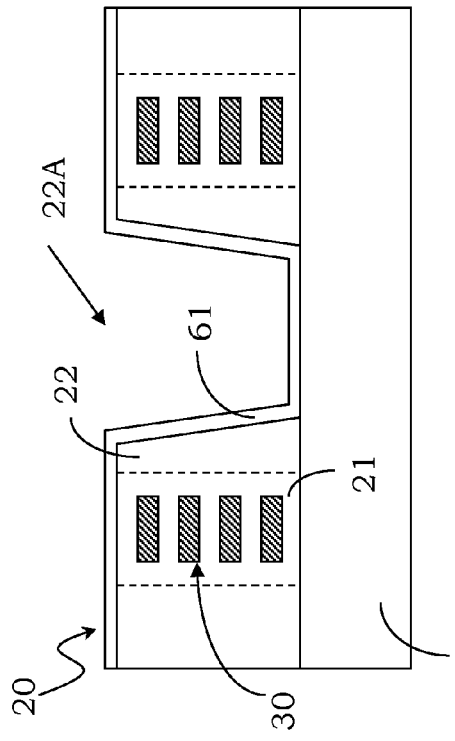

More in particular, the trench structure 60 may be covered by a protective layer 61, for example a passivation layer, that protects the integrated circuit 20 hindering the infiltration of polluting substances, as schematically shown in FIG. 26B. It is to be noted that the normal manufacturing flows of integrated circuits comprise the deposition of an upper passivation layer, that could be deposited also on the side and bottom walls of the trench structure 60, without requesting the addition of dedicated process steps.

Figure 26D:
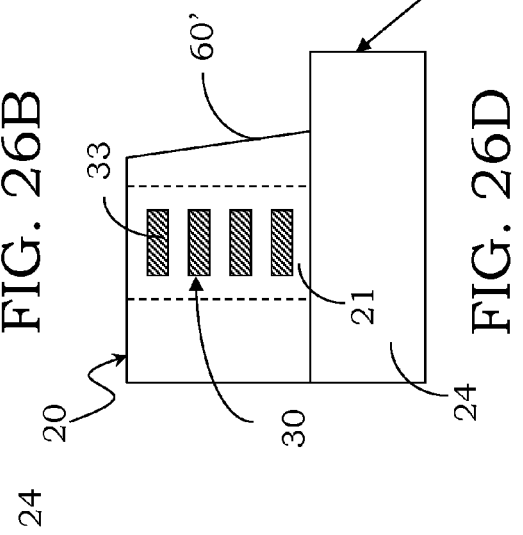
Figure 26A:
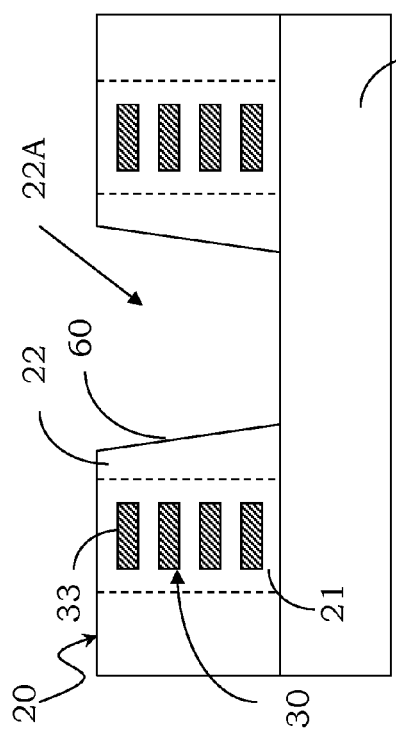
Figure 26C:
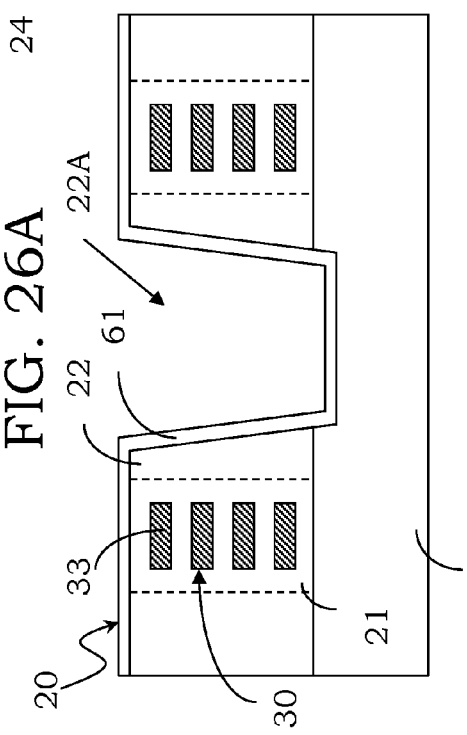

Furthermore, the trench structure 60 may be realized so as to penetrate at least partially into the substrate 24, further reducing the stresses caused by the singulation operation of the integrated circuits, this trench structure 60 being possibly provided with the protective layer 61, as schematically shown in FIG. 26C.

At the end of the singulation operation, each integrated circuit 20 comprises in its peripheral portion 21 next to a cutting area CT part of the trench structures 60 here indicated with 60', next to the integrated antenna 30 in this peripheral portion 21, as schematically shown in FIG. 26D, where by way of simplicity the protective layer 61 is not indicated.

The antenna 30 may be realized also by means of a plurality of conductive lines 33 arranged on parallel and distinct planes starting from the substrate 24 and suitably connected to each other as previously seen.

According to an aspect of the invention, the conductive paths realized by the conductive lines 33 of the antenna 30 may be also out of alignment with respect to one another for reducing their capacitive coupling, as schematically shown in FIG. 27A.

Moreover, the conductive lines 33 that form the antenna 30 may have different geometric shapes according to the needs.

More in particular, as non-limitative examples of the invention, conductive lines 33 will be used with a substantially S-like and possibly tapered profile, as schematically shown in FIG. 27B, with a substantially L-like profile, as schematically shown in FIG. 27C, possibly with contact points PC between at least one pair of conductive lines 33, as schematically shown in FIG. 27D, in this case avoiding to use vias for the connection of the conductive lines 33 that form the antenna 30 and belong to different planes.

It is to be noted that, in the case of conductive lines 33 with a substantially L-like profile, the side portion of these lines, arranged perpendicularly to the substrate 24, may be realized during the etching process used for creating the vias present in the integrated circuit 20, in this case used for substantially creating a trench then filled in with the material of the conductive lines 33.

According to an alternative embodiment, the conductive lines 33 may have alternated L-like profiles.

It is to be understood how the different geometric shapes used for the conductive lines 33 are able moreover to strengthen the peripheral portion 21 of the integrated circuit 20 and hinder the pollution by external substances, also succeeding in reducing the area occupation of the antenna 30 as a whole.

Figure 28:
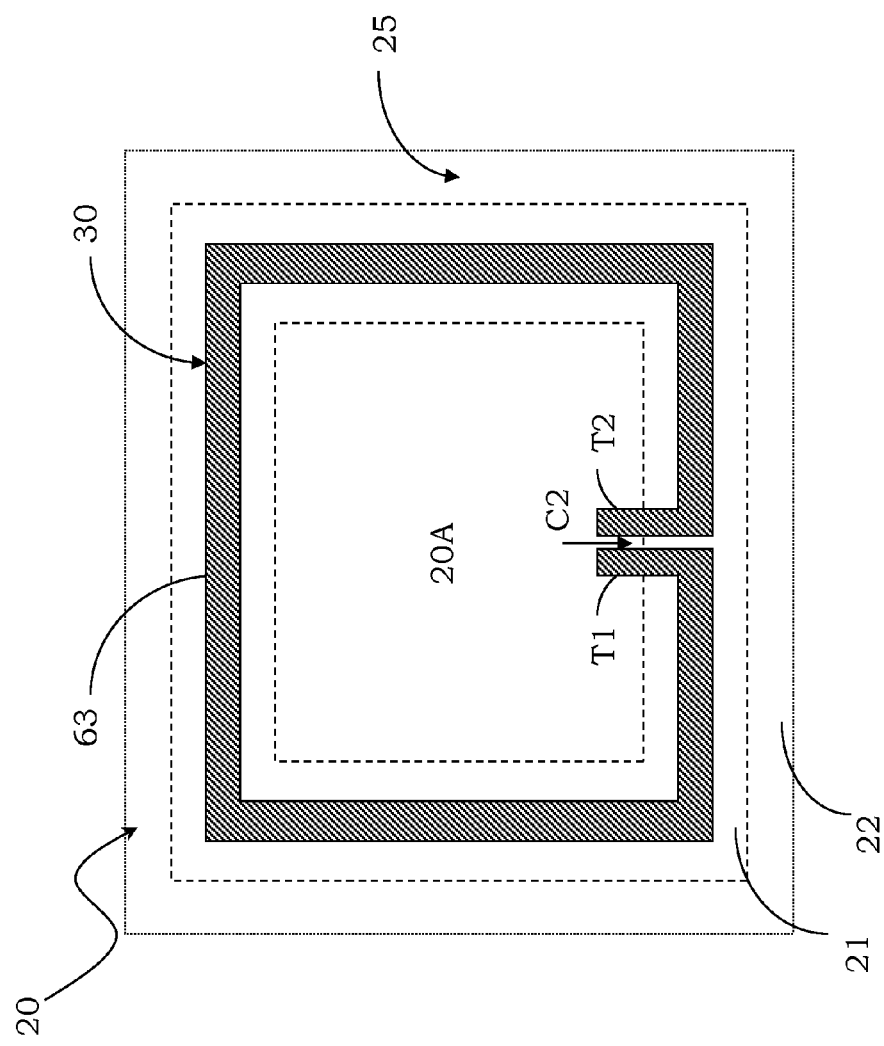
FIG. 28 schematically shows a fourth embodiment of the circuit.

In a fourth embodiment, shown schematically in FIG. 28, in the peripheral portion 21 of the integrated circuit 20 adjacent to the scribe line 22 at least one antenna 30 comprising a single coil is realized. In particular, as schematically shown in FIG. 29A, in the peripheral portion 21 a trench structure 65 suitably coated by at least one layer 63 of conductive material to form the coil of the antenna 30 is realized.

The remaining part of the trench structure 65 may be left empty or filled in with a nonconductive filling material 64, such as for example an insulating material, in particular an oxide, or passivating the surface in a similar way with respect to the protective layer 61 of FIG. 26B.

The coil formed in this way has thus a substantially V-like profile (or U-like). According to an aspect of the invention, above the filling material 64 a further conductive material 63' may be present to form another coil of the antenna 30, as schematically shown in FIG. 29B.

According to another aspect, the antenna 30 is formed inside the trench structure 65 by means of a plurality of layers 63 of conductive material, suitably and substantially V-like shaped (or U-like), arranged at different levels with respect to the substrate 24 and separated by a conductive material, the trench structure 65 being possibly completely filled in with the nonconductive filling material 64, as schematically shown in FIG. 29C. The layers 63 may be suitably connected to each other in a similar way with respect to what has been previously seen.

It is to be noted how, also in this case, the antenna 30 may have also the function of seal ring.

According to an embodiment, schematically shown in FIGS. 30A and 30B, between the conductive paths of the antenna 30 support structures 66 are provided suitable for mechanically strengthening the antenna 30 as a whole.

These support structures 66 may be realized by means of vias filled in with an insulating material, or by means of vias comprising an external insulating layer and filled in at least in part with a conductive material, for example the same conductive material that realizes the antenna 30, the external insulating layer being such as to avoid that different paths of the antenna 30 are in short circuit.

According to an aspect, the insulating material may also have magnetic features, or contain magnetic particles dispersed therein so as to increase the quality factor of the antenna 30.

In the case in which the antenna 30 comprises different levels of a conductive material, conductive connections 36 are also provided, for example conductive vias, that connect these different levels, as schematically shown in FIG. 30B.

Alternatively, it is possible to realize the support structures 66 by means of trenches realized along the conductive paths of the antenna 30, these trenches having characteristics similar to the nonconductive vias. Also in this case, moreover, conductive connections 36 may be provided between different levels of conductive material that realize the antenna 30.

In an embodiment, under the area where the antenna 30 is realized, the TSV (Through Silicon Vias) could be provided, filled in with an insulating material (instead of a conductive material) such as for example an oxide or dielectric. Alternatively it is also possible to create at least one trench filled in with an insulating material or dielectric.

This measure allows reducing the parasitic effects between the antenna 30 and the substrate 24, increasing in consequence the quality factor Q of the antenna 30 itself.

Naturally, the insulating trench may extend also in part of the area near the antenna 30.

According to a further aspect, it is possible to create at least one structure having magnetic features around the antenna 30.

In particular, in this case the integrated circuit 20 comprises at least one trench comprising in turn at least one material having magnetic features realizing a magnetic trench 70. More in particular, as schematically shown in FIG. 31A, the magnetic trench 70 comprises a lateral coating portion 67 realized in a magnetic material and filled in with a filling material 67A, for example an insulator. The magnetic trench 70 is in this case however an insulating trench (laterally coated with a magnetic material).

According to alternative embodiments, it is possible:
to create at least two magnetic trenches 70 being only laterally with respect to the antenna 30, a further insulating trench 68 being realized below the antenna 30 and below these magnetic trenches 70, as shown in FIG. 31A, or
to realize the two magnetic trenches 70 with a magnetic material 69 that extends also in the further insulating trench 68 below the antenna 30, as schematically shown in FIG. 31B.

In an alternative embodiment not shown, the trench 68 filled in with an insulating material may be replaced by TSV filled in with an insulating material.

The presence of at least one magnetic trench 70 between the integrated circuit 20 and the antenna 30 allows reducing the influence of the magnetic field on the circuits comprised in the integrated circuit 20 itself. Further, it is suitable to empty at least in part the scribe line 22 for avoiding damages for the antenna 30 during the cutting operations.

It is to be understood the fact that, in case of realization of at least one magnetic trench 70 between the scribe line 22 and the antenna 30, it is advantageously possible to use a magnetic material having suitable mechanical characteristics, for example a hard material such as nickel or its alloys, for protecting the antenna 30 during the operations of singulation of the integrated circuit 20 from the wafer wherein it is realized. The magnetic trench 70 advantageously executes in this way also the strengthening function normally carried out by the seal ring and the scribe line 22 may also be not emptied. In this case in fact, even if no seal ring is realized, the magnetic trench 70 allows to strengthen the structure of the integrated circuit 20 as a whole and to allow its singulation also in case of a scribe line 22 filled in with a material.

It is also possible to create composite structures formed by a combination of insulating trenches and of magnetic trenches 70A, in particular around the antenna 30 and inside or around the insulating trench 68 being realized in the substrate 24, as schematically shown in FIGS. 31C and 31D.

In particular, further magnetic trenches 70A may be realized below magnetic trenches 70 formed by the magnetic material 69 with a substantially bow-like structure and inside the further insulating trench 68, as schematically shown in FIG. 31C.

Alternatively, the magnetic material 69 may realize the magnetic trenches 70 laterally with respect to the antenna 30 and coat laterally also the further insulating trenches 68 realized in the substrate 24, thus obtaining a further magnetic and insulating trench 70A.

It is to be understood that, if the magnetic material used for realizing at least laterally the trenches 70 and/or 70A also has conductive characteristics, these trenches will be interrupted in at least one section so as to avoid the creation of closed paths where the eddy currents may flow.

It is also possible to replace at least in part the magnetic trenches 70A by means of deep vias laterally coated with a magnetic material and possibly filled in with a filling material. In this case it is possible, by using a magnetic material having conductive characteristics, to use these deep magnetic vias for connecting at least two conductive paths placed in different planes to each other.

The same thing may be done also by suitably dividing into parts a magnetic trench, still realized with a magnetic material having conductive characteristics.

According to an alternative embodiment, magnetic TSVs may also be created under the antenna 30.

It is thus possible to optimize the performances of the antenna 30 and to mechanically strengthen the peripheral portion 21 of the integrated circuit 20, by creating composite structures suitably combining the elements comprised in a group or sub-group of structures like: at least one insulating trench, at least one insulating TSV, at least one magnetic trench, at least one insulating via, at least one magnetic via, at least one magnetic TSV.

In conclusion, advantageously according to embodiments, an integrated circuit 20 is obtained provided with an antenna 30 being integrated therein.

This integrated circuit 20 will then communicate with other devices or systems through electromagnetic waves for exchanging information and possibly it will also be supplied, at least in part, by the energy of these electromagnetic waves. Similarly, the integrated circuit 20 would be able to supply other devices or systems thanks to the energy of the electromagnetic waves exchanged through the integrated antenna 30.

For the testing of this integrated circuit 20 on a wafer a probe card could be used suitably modified so as to comprise a traditional probe head, as well as at least one suitable test antenna. More in particular, it is possible to realize this test antenna through a printed circuit or PCB realized on at least one flexible substrate, fixed or not to the probe head but however connected to the probe card and thus to the tester ATE. It is possible for example to use a substrate in Kapton, material that may sustain high temperatures and make it thus possible the testing of the integrated circuit 20 in temperature.

It is to be noted that, thanks to the presence of the antenna 30 integrated on the circuit 20 and of the test antenna the probe card is provided with, it is possible to create at least one wireless communication channel, in particular between these two antennas.

Figure 32:
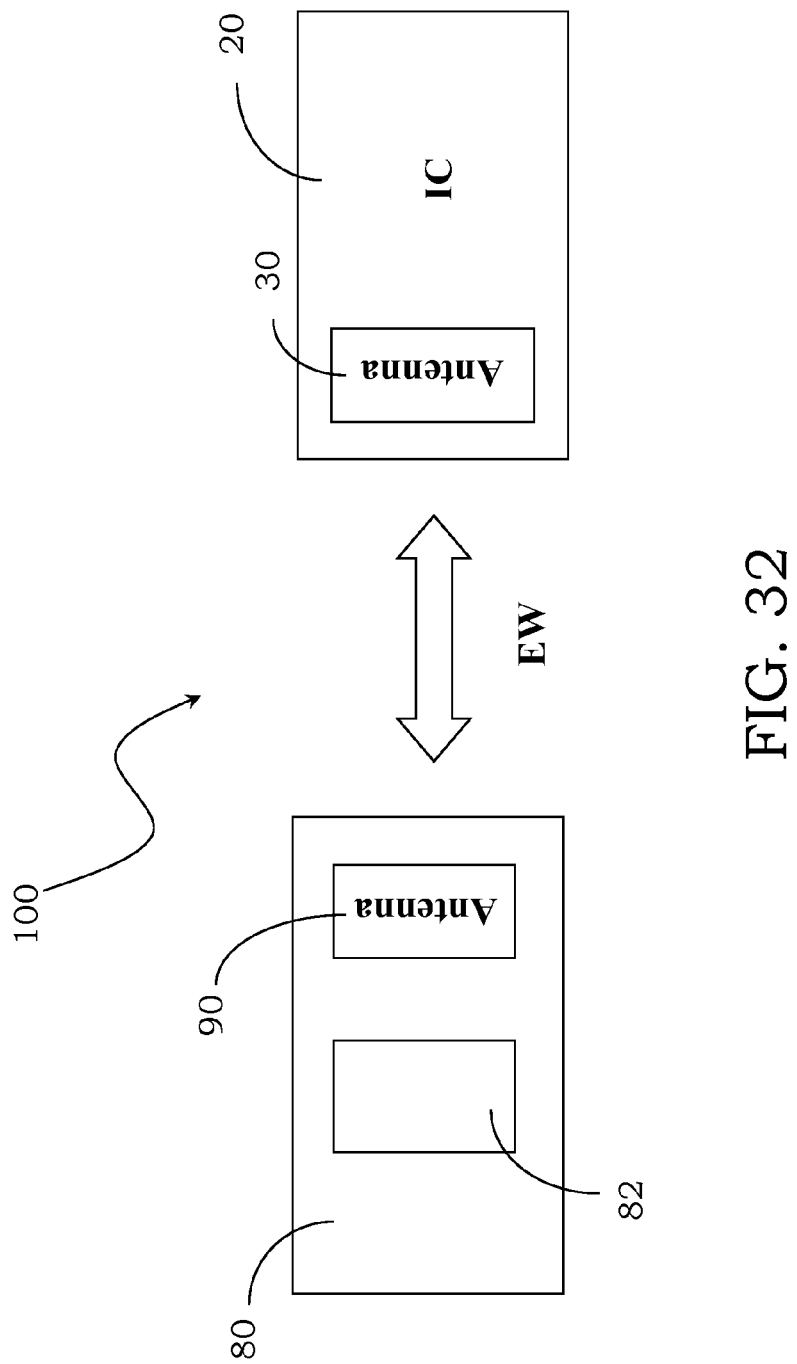
FIG. 32 schematically shows a testing system with wireless connection to the circuit.

More in particular, as schematically shown in FIG. 32, a testing system, globally indicated with 100, comprises the integrated circuit 20 provided with its antenna 30 and in wireless communication, in particular by means of electromagnetic waves EW, with a probe card 80, comprising at least one probe head 82 and provided in turn with a test antenna 90.

Figure 33:
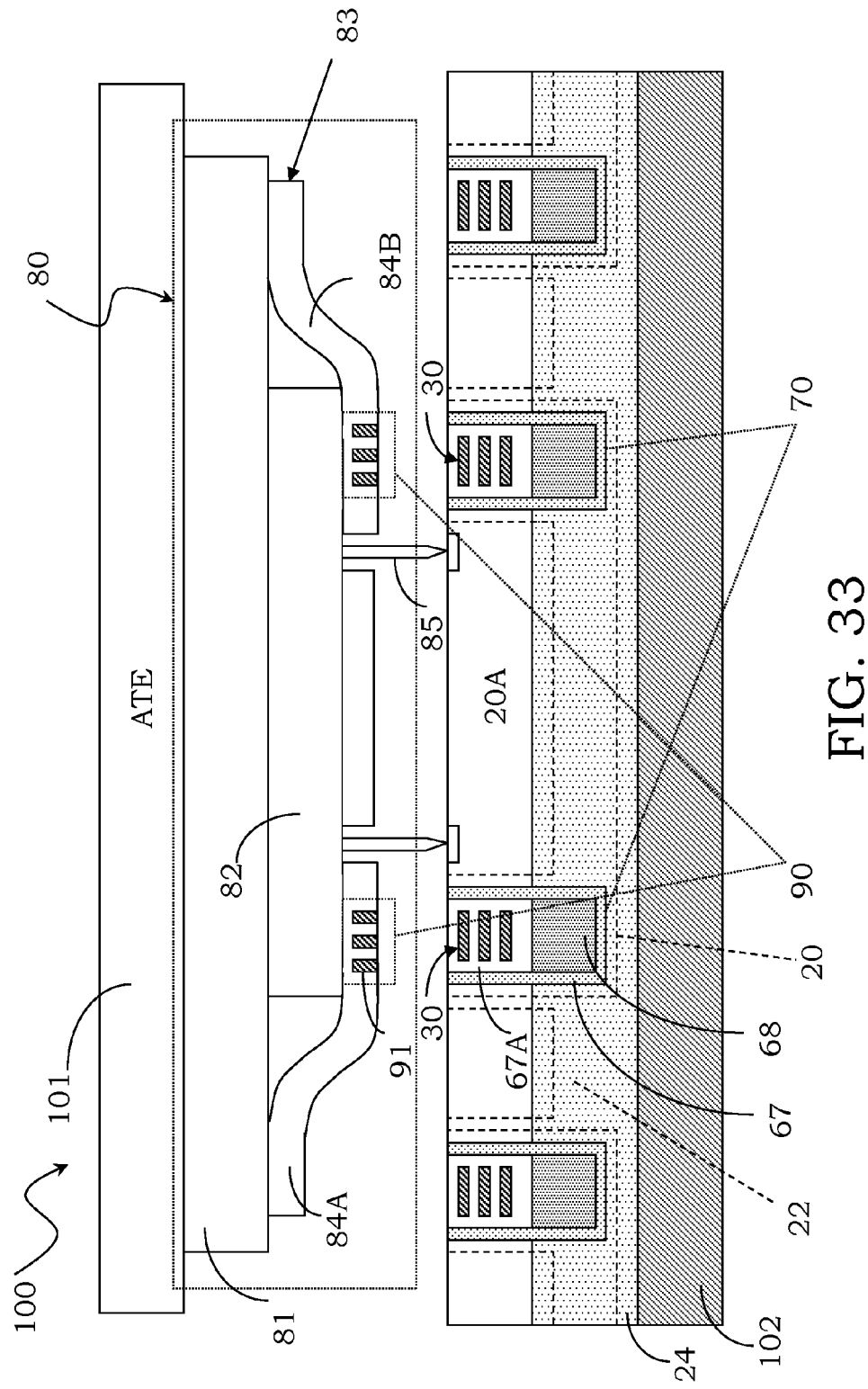
FIGS. 33, 34, 35A and 35B schematically show embodiments of the testing system of FIG. 32.

More in detail, FIG. 33 shows such a testing system 100 comprising a printed circuit 81 to which the probe head 82 is connected and in turn connected to a tester ATE 101 of the system 100.

Suitably, the probe card 80 comprises at least one substrate 83 of a flexible material, for example of a material suitable for the realization of printed circuits, associated with the probe head 82. More in particular, the flexible substrate 83 comprises at least one first and one second flexible extension, 84A and 84B, positioned between the probe head 82 and the printed circuit 81 and connected for example by means of electric extensions to the printed circuit 81 itself. If a flexible substrate is fixed to the probe head 82 there may be present also a sole flexible extension, for example the first flexible extension 84A, for electrically connecting the test antenna 90 to the printed circuit 81. If a flexible substrate is not fixed to the probe head 82 at least two flexible extensions 84A and 84B should be present for electrically connecting the test antenna 90 to the printed circuit 81, and the antenna 90 is floating between the probe head 82 and the wafer, thus approaching the wafer itself and in particular the antenna 30 of the integrated circuit 20. In consequence the antenna 90 may possibly supply energy to the integrated circuit 20, allowing its operation besides its communication.

Alternatively, a further rigid PCB (not shown in the figure), provided with suitable connectors, could connect the flexible substrate 83 to the printed circuit 81 of the probe card 80 (and thus to the tester ATE 101) for allowing to disassemble the probe card 80 in its various parts and having the possibility to repair it.

According to an aspect, in the flexible substrate 83 at least one test antenna 90 is realized, substantially positioned in correspondence with the antenna 30 of the integrated circuit 20, in this way the two antennas face each other and may realize the desired wireless connection. In particular, it is to be noted how the realization of the probe card 80 provided with a test antenna 90 and having sizes substantially corresponding to those of a traditional probe card is made possible by the use of an integrated circuit 20 provided with an antenna 30 with a substantially vertical development. In this way the probe card 80 may be used in a testing system 100 compatible with the technologies already used in the field of testing of integrated circuits on wafer.

The probe card 80 also comprises at least one probe 85 that extends from the probe head 82 and crosses the flexible substrate 83 for electrically contacting a corresponding pad of the integrated circuit 20. It is to be noted how this probe 85 creates a physical or cabled communication channel, indeed, while a wireless communication channel is realized thanks to the antennas 30 and 90.

The integrated circuit 20 is realized in a wafer, in particular in a substrate 24 of this wafer, that during the test is usually arranged on a mechanical support 102 of the testing system 100, in particular the prober chuck.

More in particular, in the example shown in FIG. 33 by way of indication, the integrated circuit 20 comprises at least one magnetic trench 70 that includes a lateral coating portion 67 realized in a magnetic material and is filled in with an insulator 68 and with a filling material 67A, also for example an insulator, wherein the antenna 30 is realized. Advantageously, the magnetic material may create a preferred path for allowing the force lines of the field between the antennas 30 and 90 to close themselves.

Suitably, in a further embodiment, the test antenna 90 is formed by means of a plurality of conductive lines 91 realized in the flexible substrate 83, in a similar way with respect to the antenna 30 of the integrated circuit 20.

In a general way, this test antenna 90 realized in the flexible substrate 83 of the probe card 80 may be provided outside the probes 85 and/or inside them.

It is to be noted that, if the probes 85 are placed in an inner area of the antenna 30 of the integrated circuit 20, they may also have magnetic features, and in particular:

the probes 85 may be covered by magnetic materials; or
the probes 85 may be realized with materials that have both electric features and magnetic features;

In fact, in this case the magnetic field is greater in the inner area of the antenna 30 and next to the antenna 30 itself, that may be substantially a solenoid.

In this case, the probes 85 will perform both an electric function of connection of the tester ATE 101 with the integrated circuit 20 and a magnetic function, improving the coupling between the test antenna 90 and the antenna 30 of the integrated circuit 20.

Figure 34:
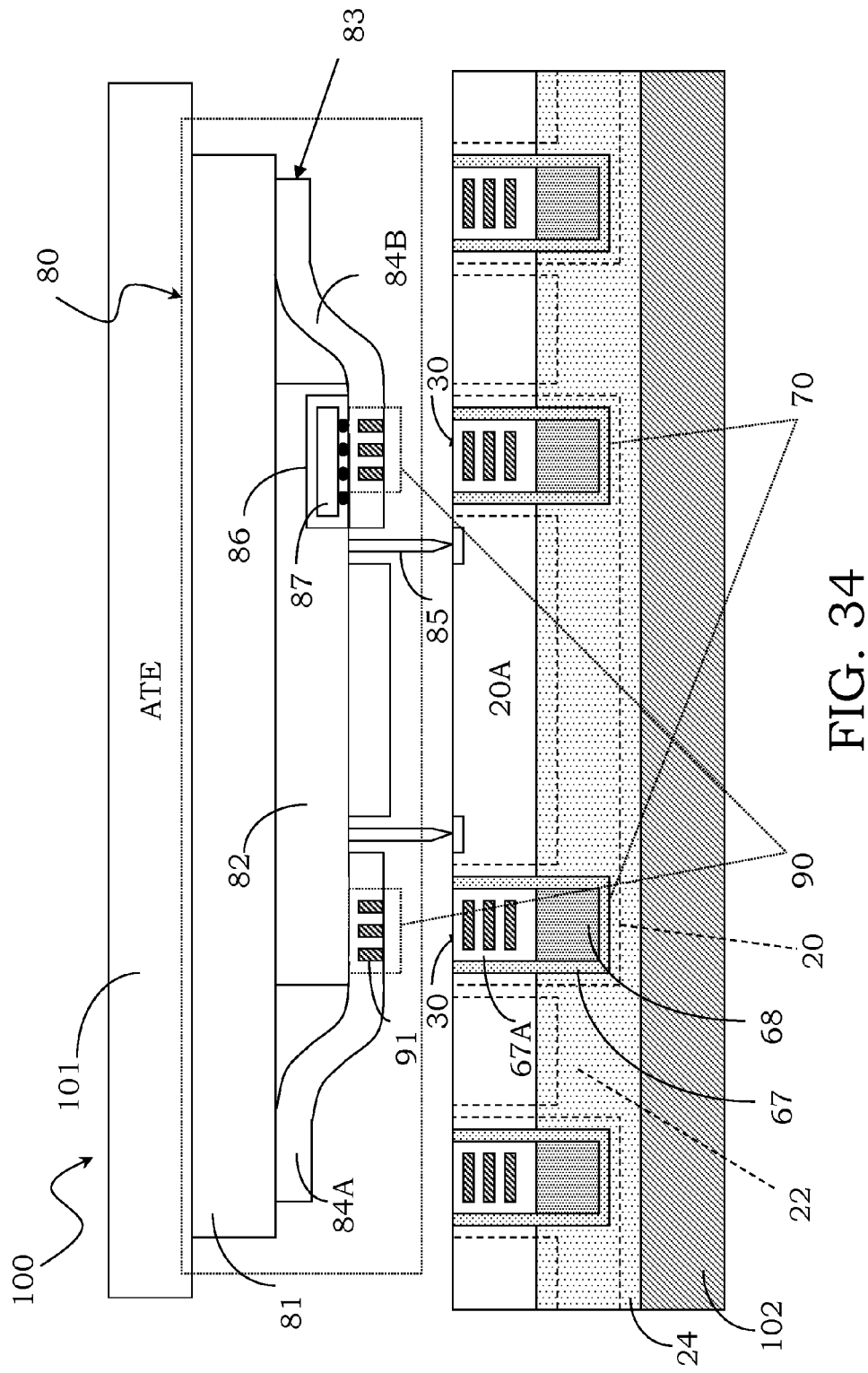

According to another aspect, for improving the performances of the testing system 100, increasing for example the transmission frequency, it is possible to realize an active probe card 80 obtained by inserting an integrated test circuit 87 in a suitable seat, in particular a cavity 86 realized in the probe head 82, where the integrated test circuit 87 itself, that will be connected to the flexible substrate 83, is comprised as schematically shown in FIG. 34. It is to be understood again that this figure is not in scale, in particular the sizes of the integrated test circuit 87 and of the integrated circuit 20 are obviously out of scale.

More in particular, the integrated test circuit 87 comprises suitable circuits of transmission and reception and possibly coding and decoding of the signals exchanged between the probe card 80 and the integrated circuit 20.

Also in this case, it is understood how the integrated test circuit 87 could be placed outside an array of probes 85, or inside the same, and possibly also outside the probe head 82.

Figure 35A:
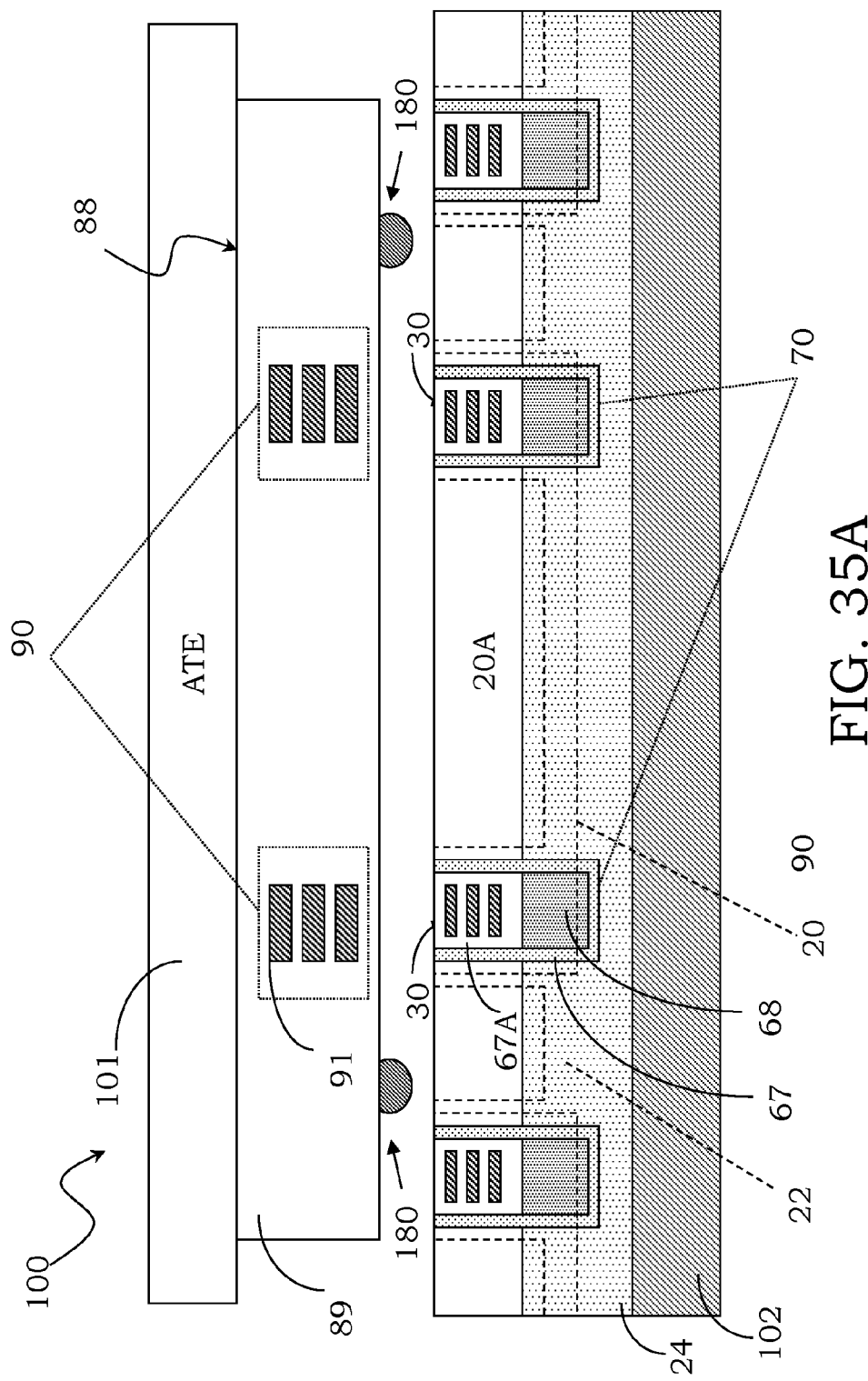

According to another aspect, in the case of integrated circuits 20 of the low power type, wherein it is possible to avoid the use of the probes 85 for the supply of these circuits, the testing system 100 comprises an antenna card 88 directly associated with the tester ATE 101, as schematically shown in FIG. 35A. This antenna card 88 particularly comprises a substrate 89 wherein the test antenna 90 is realized, in particular by means of a plurality of conductive lines 91, this antenna 90 being realized so as to substantially face in correspondence with the antenna 30 of the integrated circuit 20, so as to realize the desired wireless connection. The substrate 89 of the antenna card 88 will be in turn of a material suitable for the manufacturing of printed circuits, the antenna card 88 being thus in the form of a board PCB.

Figure 35B:
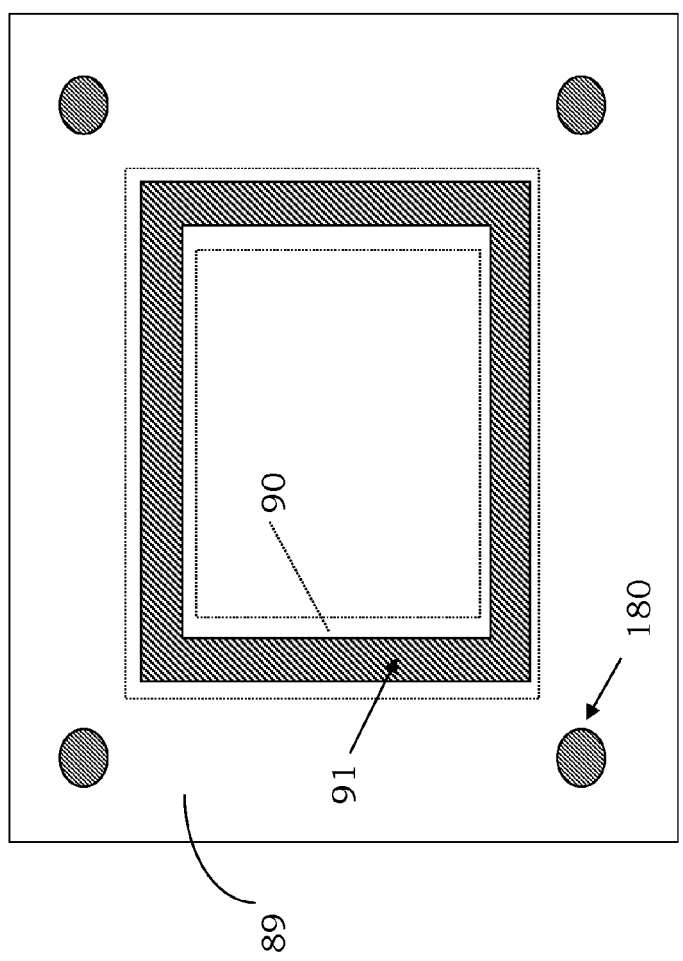

Advantageously for positioning the antenna 90 on the integrated circuits 20 of the wafer, on the lower surface of the substrate 89 there may be present three-dimensional elements 180 that may be assimilated to three-dimensional. Fiducials that may be recognized by video cameras of the prober as if they were of the probes. These three-dimensional elements 180 may be for example bumps that may be placed for example outside the antenna 90, as shown in FIG. 35B.

It is understood how in this case the integrated circuits 20 being on the wafer will be supplied through electromagnetic waves, since they are of the low power type.

Advantageously the antenna 90 may be used for the testing of a plurality of integrated circuits 20 of the wafer, and possibly and advantageously the substrate 89 may comprise also magnetic materials for improving the coupling between the antennas 30 of the integrated circuits 20 and the antenna 90.

In an alternative embodiment, not shown, it is possible to provide the use test board arranged between the antenna card 88 and the tester ATE 101, this test board having the possibility to contain an integrated test circuit 87.

Figure 36:
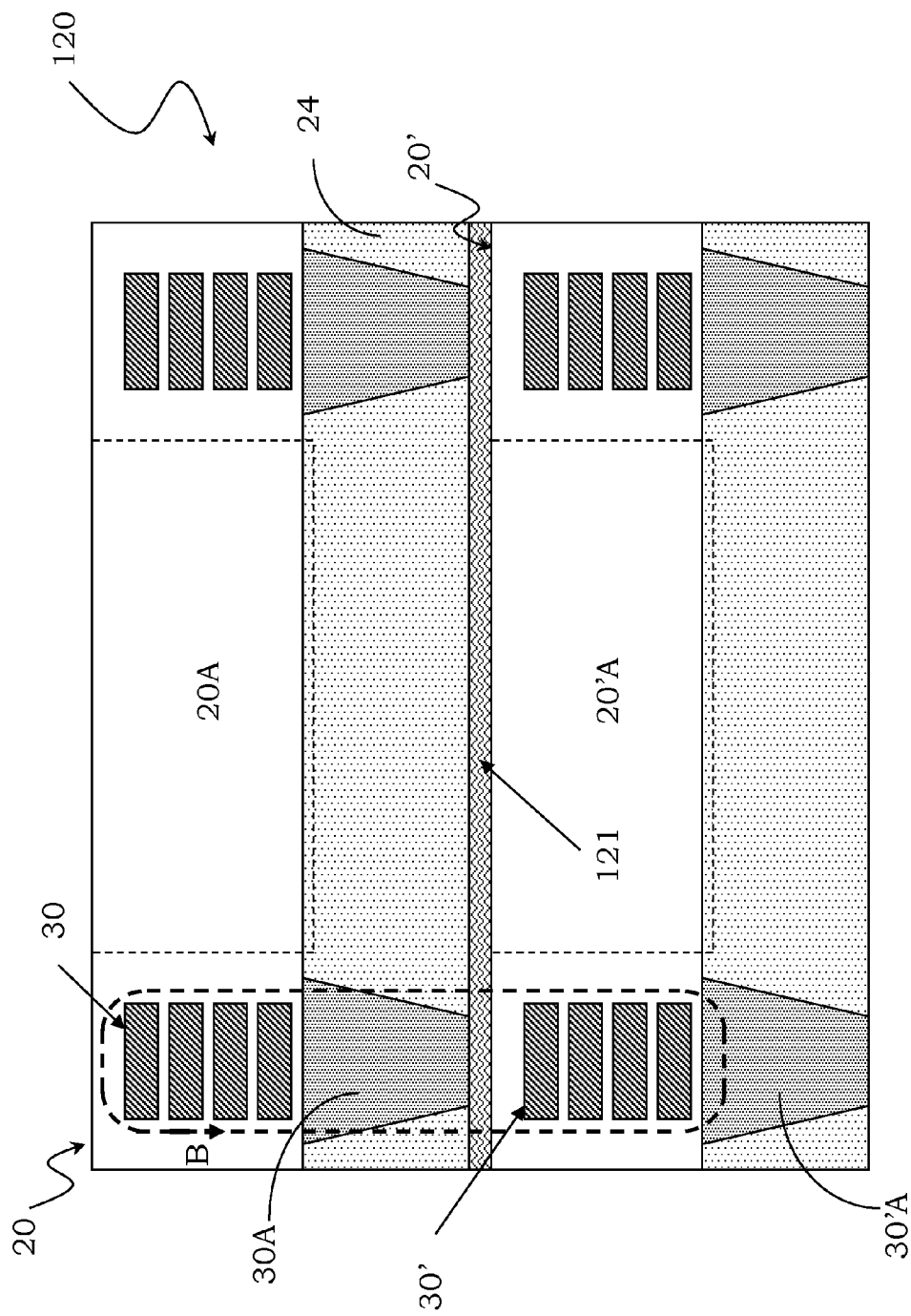
FIG. 36 schematically shows a stacked structure comprising at least one circuit.

According to an aspect, during the assembly, it is possible to realize a stacked structure 120 comprising at least two integrated circuits, 20 and 20', as schematically shown in FIG. 36. In particular, the integrated circuits, 20 and 20' are overlapped one onto the other so as to place the respective antennas 30 and 30' in substantial alignment with each other, for example according to the development direction of the antennas themselves. The integrated circuits 20 and 20' are suitably separated by a layer 121, for example an adhesive insulating material. In an alternative embodiment not shown, the integrated circuits 20 and 20' will be separated by a space or gap.

It is to be understood that in the stacked structure 120 in this way a wireless communication channel is created having high performances, whose magnetic flow is indicated with B in the figure. According to an aspect of the invention, each integrated circuit, for example the integrated circuit 20, comprises a suitable structure 30A realized in the substrate 24 for improving the wireless communication.

As previously said, around the antenna 30, there may be present composite structures by suitably combining the elements comprised in a group or sub-group of structures like: at least one insulating trench, at least one magnetic trench, at least one insulating via, at least one magnetic via, at least one magnetic TSV, at least one insulating TSV. These composite structures may at least in part form the structure 30A.

Figure 37:
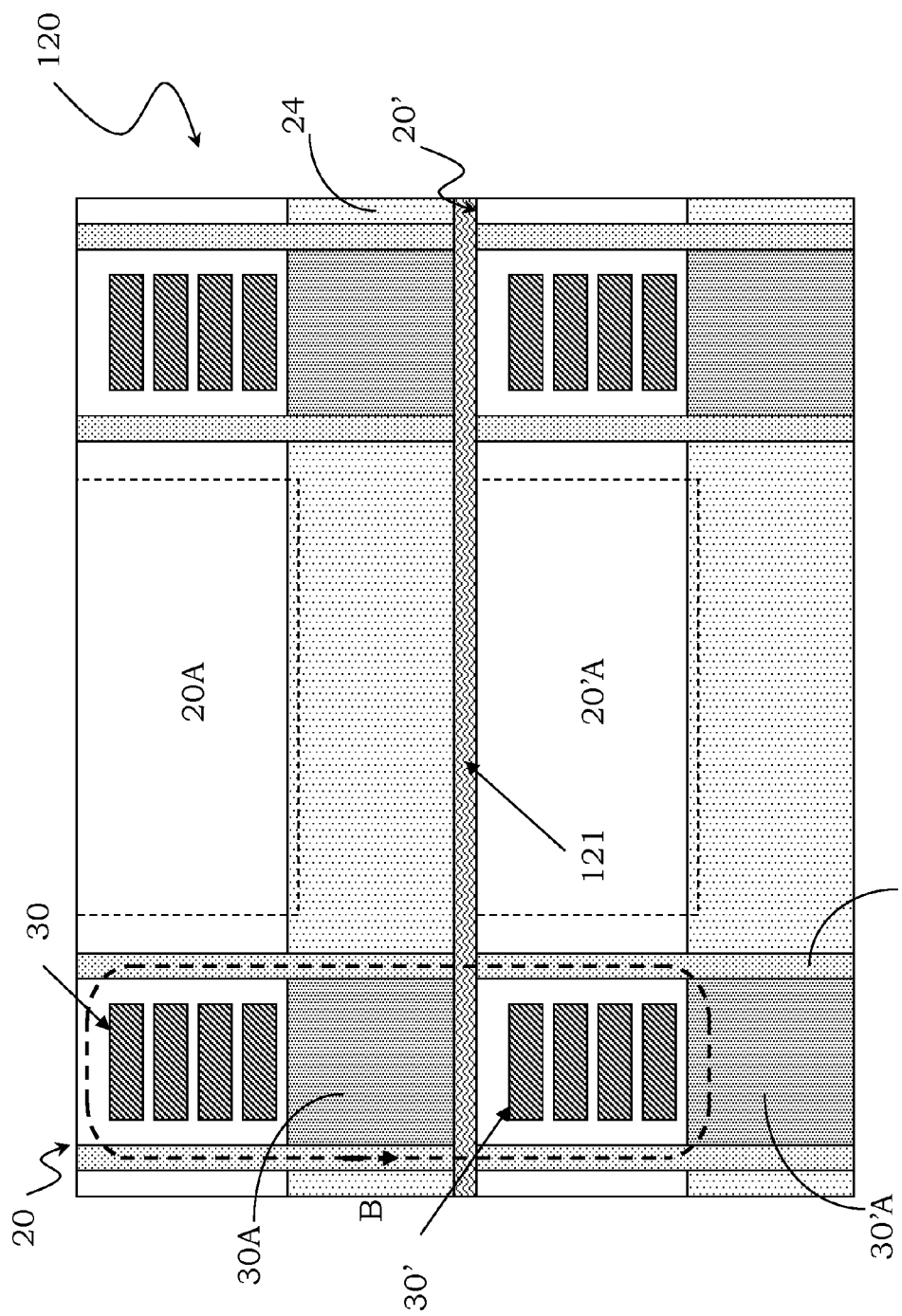
FIGS. 37-38 schematically show embodiments of the stacked structure of FIG. 36.

Alternatively, as schematically shown in FIG. 37 the structure 30A may be formed by a part of a magnetic trench 70 comprising a lateral coating portion 67 realized in a magnetic material. The magnetic material 67 improves the coupling between the antennas 30 and 30'. In a known way, the lower part of the magnetic trench 70 may be eliminated through the back-grinding of the wafer.

Figure 38:
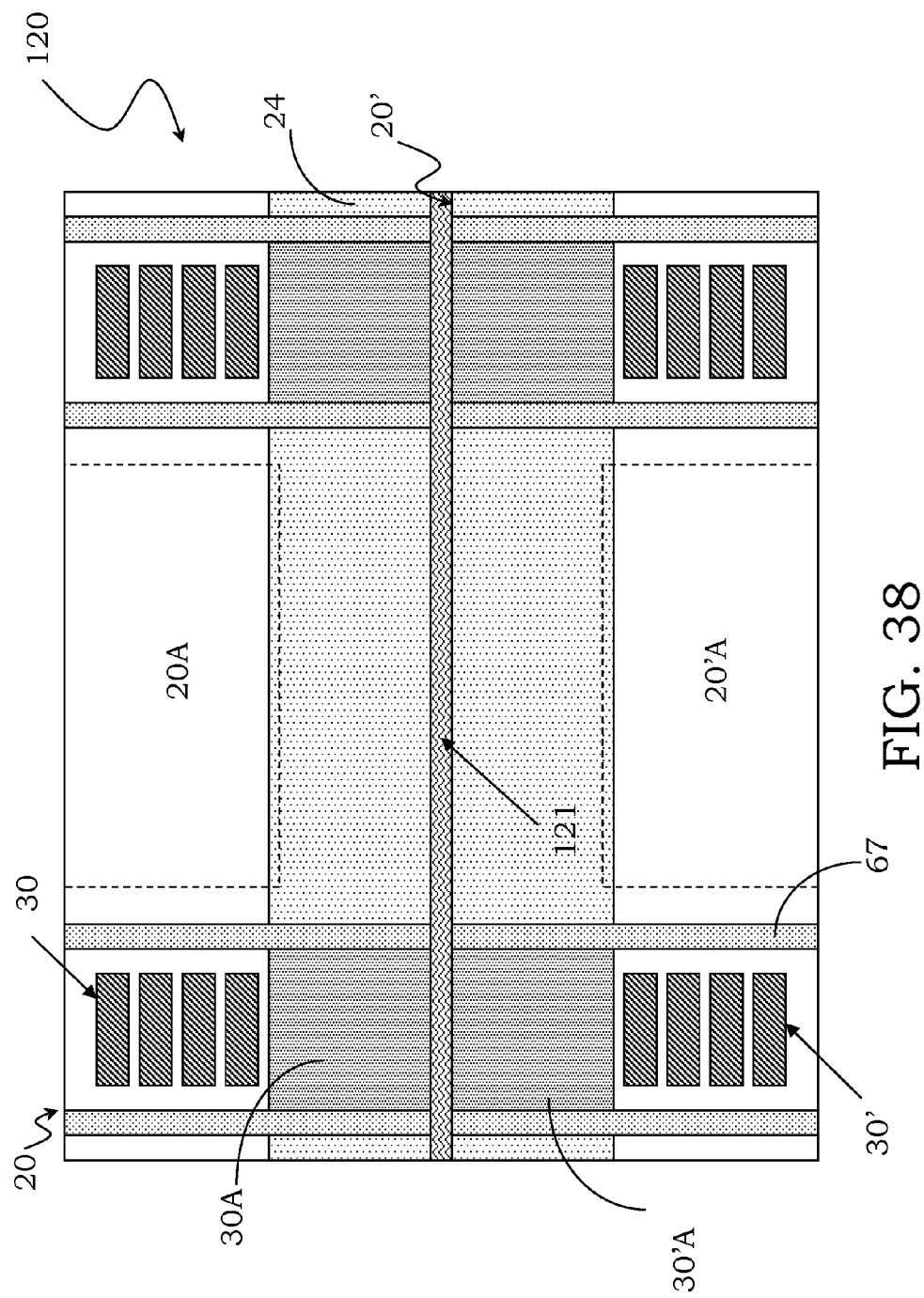

The integrated circuits 20 and 20' will also have the possibility to be placed in such a way that their sub-layers are in connection with the layer 121, as schematically shown in FIG. 38 thus obtaining a back to back configuration. Also face to back, back to back and face to face configurations are however possible. The integrated circuits 20 and 20' may be connected to each other also through traditional TSV.

Figure 39:
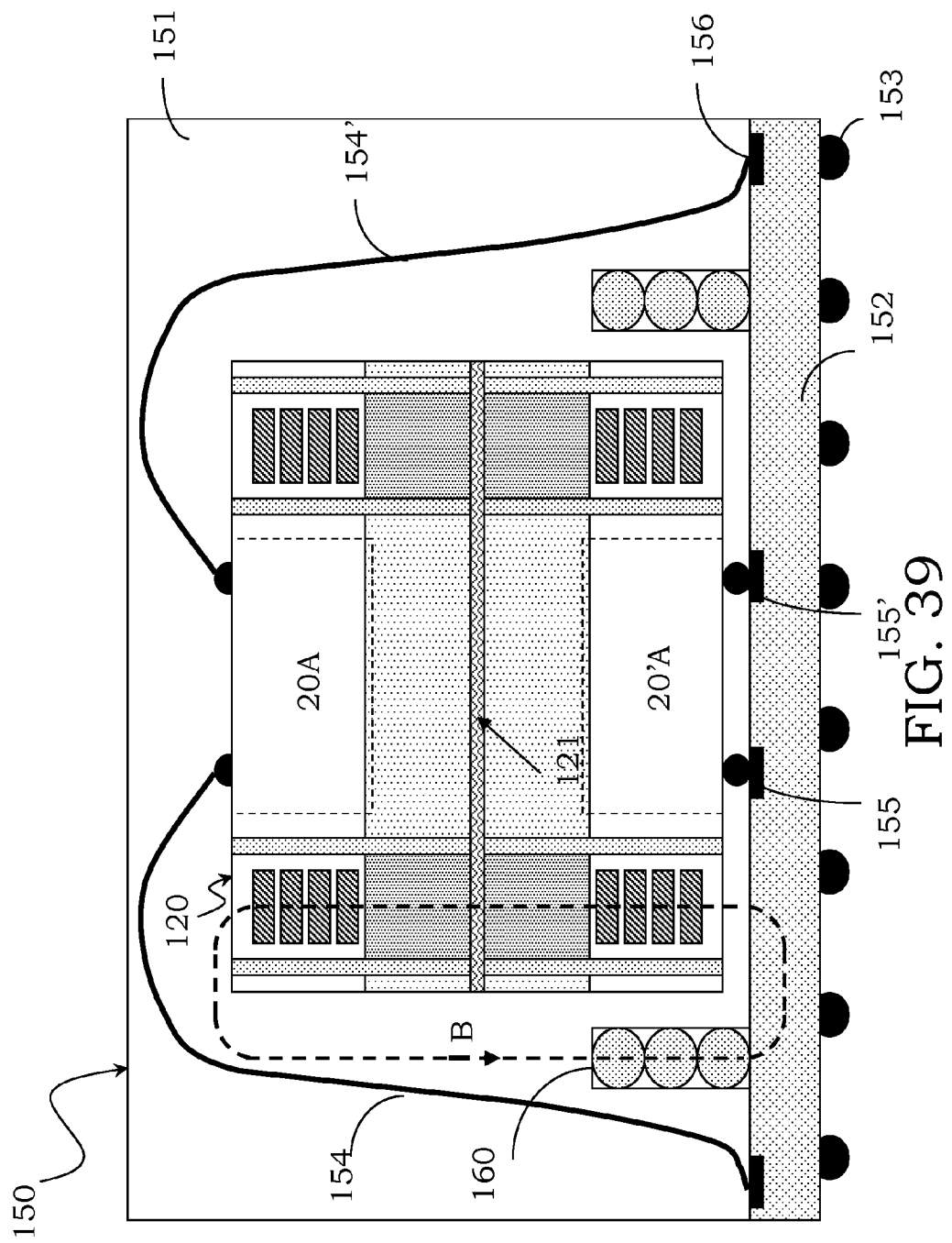
FIGS. 39 and 40 schematically show a package comprising the stacked structure of FIG. 38.

It is also possible, during the encapsulation step, to insert the stacked structure 120 in a package 150, as schematically shown in FIG. 39. In particular, the package 150 comprises at least one encapsulation material 151 of the stacked structure 120 and a package substrate 152, the package 150 being suitable to house at least one integrated circuit 20 provided with an antenna 30, as above described. The package 150 is also provided with external connection elements, for example bumps 153.

In the example shown in the figure, on the package substrate 152 the stacked structure 120 is leaned comprising the integrated circuits 20 and 20', by way of indication, the considerations made being also valid in the case in which the package 150 comprises a sole integrated circuit 20.

More in particular, the stacked structure 120 comprises in correspondence with the integrated circuits 20 and 20' suitable external connection elements, for example wirebonds 154 and 154' and bumps 155 and 155', positioned on the faces of these integrated circuits 20 and 20' opposed to those in connection with the layer 121, in the figure connected for example to the sub-layers of the integrated circuits 20 and 20'.

Suitably, these wirebonds 154 and 154' and bumps 155 and 155' are connected to the package substrate 152, in correspondence with contact pads 156 realized in this package substrate 152.

According to an aspect, the package 150 may possibly also house an antenna 160, in particular a discrete antenna housed on the package substrate 152, preferably of the magnetic dipole type.

This antenna 160 will have the possibility also to supply the power needed for the operation of at least one stacked structure 120 or of an integrated circuit 20 being in the package 150.

According to an alternative embodiment not shown, the package substrate 152 is insulated from the integrated circuit 20, that results in this way galvanically insulated, the same having the possibility to be supplied through electromagnetic waves thanks to the presence therein of the antenna 30.

It is also possible, in a further embodiment not shown, to provide to connect to each other discrete antennas present in at least two packages.

It is obviously possible to realize the stacked structure 120 thanks to the structures previously described, or a combination thereof or through their hybrid forms also together with the prior art.

Figure 40:
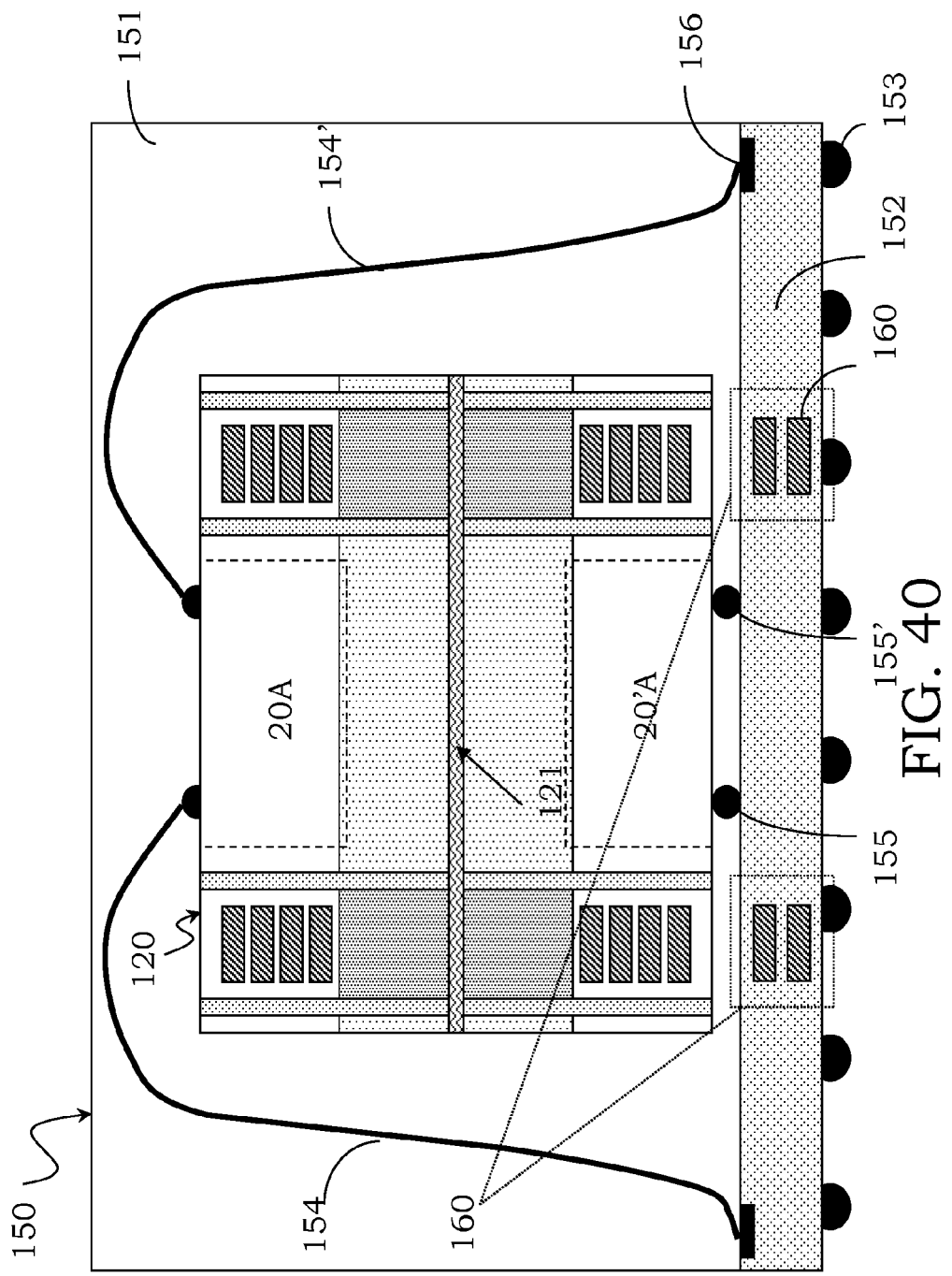

The antenna 160 may be used for the final application or for the testing at the package or FT level, and this antenna may be incorporated in the substrate 152 of the package 150, as schematically shown in FIG. 40. Also in this case, the antenna 160 will be discrete, preferably of the magnetic dipole type.

Figure 41:
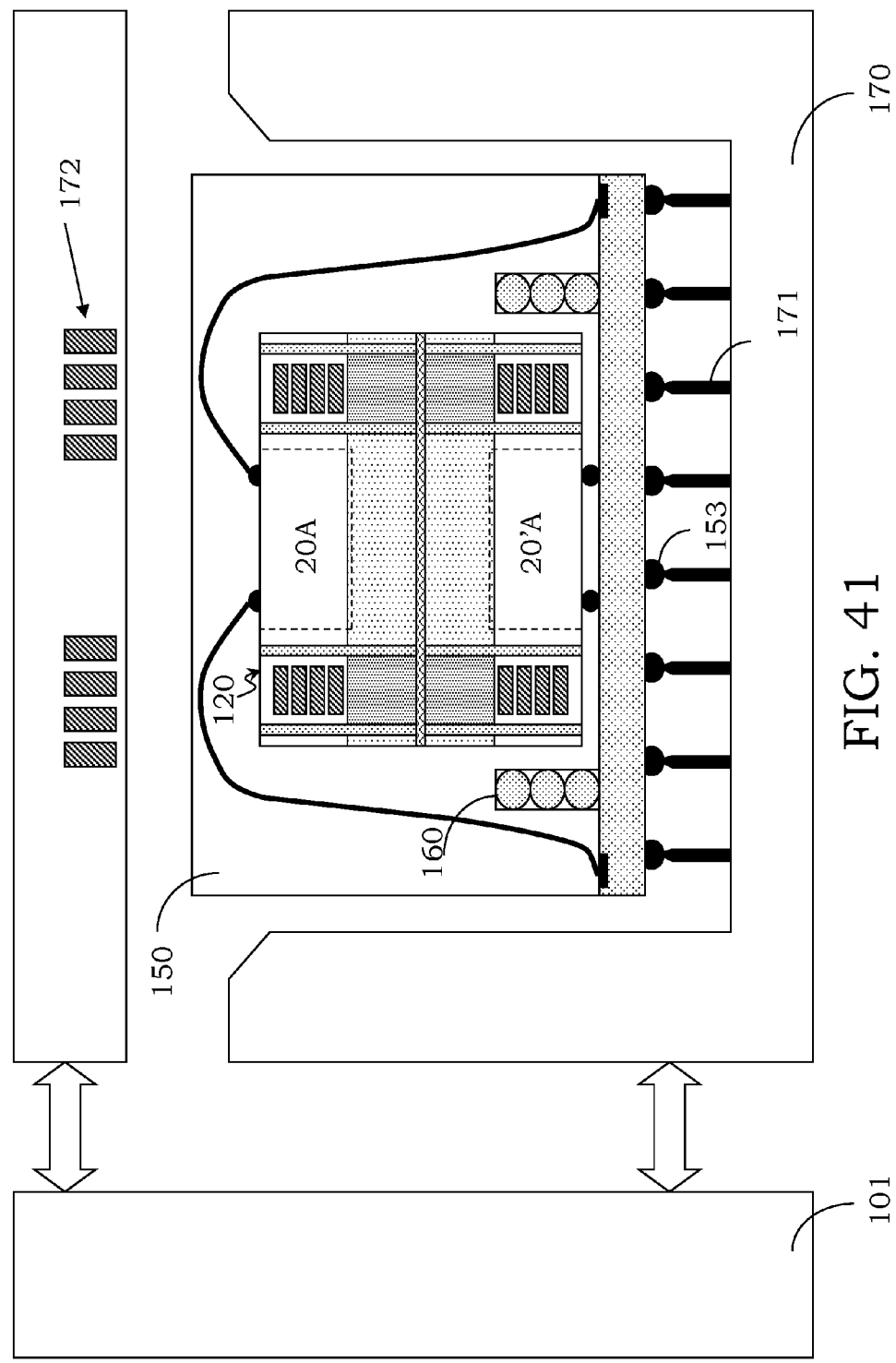
FIGS. 41 and 42 schematically show the package of FIGS. 39 and 40 in a testing step at the package level.

In particular, as schematically shown in FIG. 41, for executing this testing FT, the package 150 is placed in an interface 170 called socket inside a suitable apparatus called handler, not completely shown, in turn connected to the tester ATE 101 of the testing system 100. The package 150 is connected, at the level of its bumps 153, to suitable contact terminals 171 of the interface 170.

Furthermore, according to an aspect, an external antenna 172 is provided and connected to the tester ATE 101 for communicating in a wireless way with at least one integrated circuit 20 present in the package 150.

Figure 42:
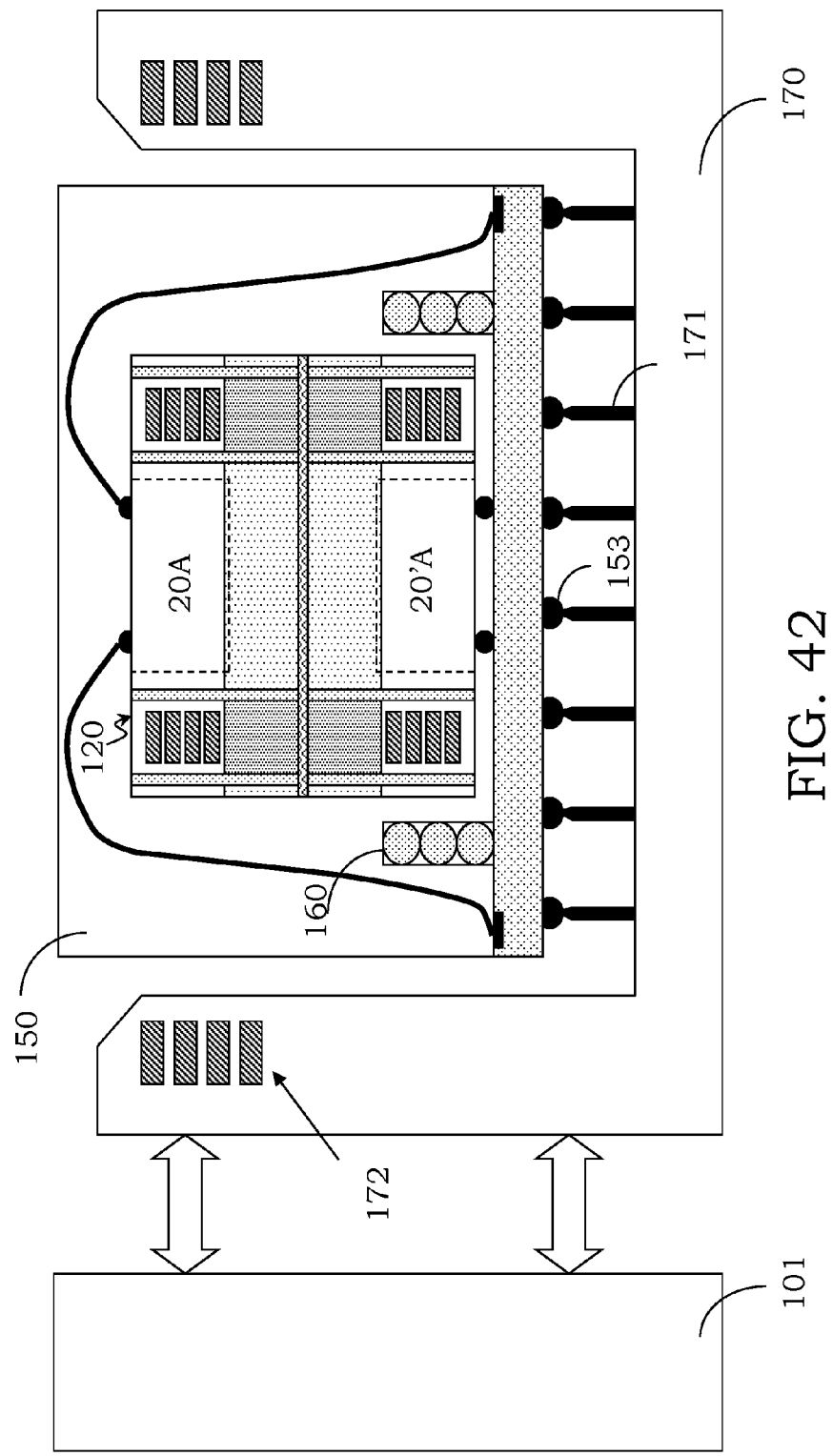

According to an alternative embodiment, schematically shown in FIG. 42, this external antenna 172 may be incorporated in the interface 170.

It is obviously possible to combine the different embodiments of the integrated circuits, of the stacked structures and of the packages above described with other solutions known in the field, obtaining hybrid solutions between the embodiments and the solutions of the prior art.

According to the different embodiments, the antenna 30 being integrated on the integrated circuit 20 is preferably of the inductive type and realized outside the active area 20A of the integrated circuit 20 itself, incorporated at least in part in its peripheral structures, like the seal ring and/or possibly part of the pad ring.

According to some of the embodiments, the antenna 30 is also able to replace at least in part the seal ring.

Furthermore, the integrated circuit 20 comprises measures able to increase the efficiency of the antenna 30 and reduce the interferences with its inner circuitry, also allowing the creation of a wireless communication channel that may be used during the manufacturing process, and in particular for a testing of the wireless type, and in the final application.

Finally, the antenna 30 according to the invention, being of the vertical and lateral type, has a reduced space and it is also possible to size it so as to be able to supply power in a wireless way to the integrated circuit 20 that comprises them.

Obviously a technician of the field, aiming at meeting incidental and specific needs, will bring several modifications and alternatives to the above described structures, all within the scope of protection of the invention as defined by the following claims.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

The invention claimed is:

1. An integrated circuit, comprising:
   a substrate including a peripheral portion that surrounds an active circuit area, wherein said peripheral portion is adjacent a scribe line;
   a seal ring structure formed by a plurality of pillar structures distributed in the peripheral portion in an arrangement extending parallel to the scribe line, each pillar structure formed by a plurality of first conductive lines arranged in different planes and interconnected by vertical conductive connections; and
   a first antenna structure formed by a first antenna line arranged in said different planes, said first antenna line including a first line portion positioned between the pillar structures of the seal ring structure and the scribe line and a second line portion positioned between the pillar structures of the seal ring structure and the active circuit area.

2. The integrated circuit of claim 1, wherein said first first antenna line of the first antenna structure further comprises a third line portion electrically interconnecting the first line portion to the second line portion, said third line portion positioned between adjacent ones of the pillar structures.

3. The integrated circuit of claim 2, wherein said first, second and third line portions form a serpentine line.

4. The integrated circuit of claim 1, wherein said first line portion of the first antenna line of the first antenna structure is positioned on an opposite side each pillar structure from said second line portion.

5. The integrated circuit of claim 4, wherein said first antenna line of the first antenna structure further comprises a plurality of third line portions, each third line portion electrically interconnecting the first line portion to the second line portion, and each third line portion positioned to extend between adjacent ones of the pillar structures.

6. The integrated circuit of claim 1, wherein said vertical conductive connections include a bottom-most set of vertical conductive connections between a bottom-most one of the first conductive lines and a well formed in the substrate, wherein the well is oppositely doped relative to the substrate so as to provide an integrated diode.

7. The integrated circuit of claim 1, further comprising a plurality of spaced apart doped regions in the substrate, said doped regions extending perpendicular to the scribe line and extending from a first end located in active circuit area to a second end beyond an outer edge of the first antenna structure.

8. The integrated circuit of claim 1, wherein a top-most one of the first conductive lines has an upper surface that is exposed by an opening to form a contact pad.

9. The integrated circuit of claim 8, wherein one of said first conductive lines other than the top most one extends into the active circuit area.

10. The integrated circuit of claim 8, wherein one of said first conductive lines other than the top most one extends into the scribe line.

11. The integrated circuit of claim 1, further comprising a plurality of spaced apart trench regions in the substrate, said trench regions extending perpendicular to the scribe line and extending from a first end located in active circuit area to a second end beyond an outer edge of the first antenna structure.

12. The integrated circuit of claim 11, wherein said trench regions are filled with an insulating material.

13. The integrated circuit of claim 1, further comprising a second antenna structure formed by a second antenna line arranged in said different planes, said first and second antenna structures forming a transformer.

14. The integrated circuit of claim 13, wherein said second antenna line includes a fourth line portion positioned between the pillar structures of the seal ring structure and the scribe line and a fifth line portion positioned between the pillar structures of the seal ring structure and the active circuit area.

15. The integrated circuit of claim 14, wherein said second antenna line further comprises a sixth line portion electrically interconnecting the third line portion to the fourth line portion, said sixth line portion positioned between adjacent ones of the pillar structures.

16. The integrated circuit of claim 13, wherein said first and second antenna structures are formed in different ones of the planes.

17. The integrated circuit of claim 1, wherein the pillar structures are arranged in pairs of pillar structures, and ones of the first conductive lines of the pillar structures of each pair are electrically connected to each other by an intermediate conductive line.

18. The integrated circuit of claim 1, wherein a top-most one of the first conductive lines for each pillar structure of at least a pair of pillar structures are electrically connected to form a contact pad having a top surface exposed by an opening.

19. The integrated circuit of claim 18, wherein at least a portion of the first antenna line of the first antenna structures extends underneath the contact pad.

20. The integrated circuit of claim 1, wherein the first antenna line is interrupted in correspondence with a cutting area for realizing at least one pair of terminals of said first antenna structure.

21. The integrated circuit of claim 1, further comprising a trench structure realized in a central portion of said scribe line.

22. The integrated circuit of claim 21, wherein said trench structure penetrates in said scribe line up to at least the level of said substrate.

23. The integrated circuit of claim 21, wherein said trench structure penetrates in said scribe line and at least partially in said substrate.

24. The integrated circuit of claim 21, wherein said trench structure is covered by a protective layer.

25. The integrated circuit of claim 1, further comprising, adjacent to said first antenna structure, at least one trench comprising at least one material having magnetic features for realizing a magnetic trench.

26. The integrated circuit of claim 25, further comprising at least one pair of magnetic trenches realized on the opposite part with respect to said antenna.

27. The integrated circuit of claim 26, further comprising a further insulating trench realized in said substrate below said first antenna structure and below said magnetic trenches.

28. The integrated circuit of claim 27, further comprising insulating and/or magnetic trenches, inside or around said further insulating trench.

29. The integrated circuit of claim 1, wherein the first antenna line is formed by a plurality of coils connected in series.

30. The integrated circuit of claim 29, wherein the plurality of coils are arranged and electrically connected such that a length of the first antenna structure develops in a vertical direction perpendicular to the substrate in said planes.

* * * * *